(12) United States Patent
Song et al.

(10) Patent No.: US 11,805,699 B2
(45) Date of Patent: Oct. 31, 2023

(54) COMPOSITIONS AND METHODS FOR DOPED THERMOELECTRIC CERAMIC OXIDES

(71) Applicant: West Virginia University, Morgantown, WV (US)

(72) Inventors: Xueyan Song, Pittsburgh, WV (US); Cesar-Octavio Romo-De-La-Cruz, Morgantown, WV (US); Yun Chen, Pittsburgh, WV (US)

(73) Assignee: West Virginia University, Morgantown, WV (US)

( * ) Notice: Subject to any disclaimer, the term of this patent is extended or adjusted under 35 U.S.C. 154(b) by 295 days.

(21) Appl. No.: 17/060,537

(22) Filed: Oct. 1, 2020

(65) Prior Publication Data
US 2021/0098676 A1 Apr. 1, 2021

Related U.S. Application Data

(60) Provisional application No. 62/908,696, filed on Oct. 1, 2019.

(51) Int. Cl.
| | |
|---|---|
| *H10N 10/855* | (2023.01) |
| *C01G 51/00* | (2006.01) |
| *H10N 10/01* | (2023.01) |

(52) U.S. Cl.
CPC .......... *H10N 10/855* (2023.02); *C01G 51/70* (2013.01); *H10N 10/01* (2023.02);
(Continued)

(58) Field of Classification Search
CPC ...... H10N 10/855; H10N 10/01; C01G 51/70; C01G 51/66; C01G 51/68; C01P 2002/52; C01P 2002/72; C01P 2002/77; C01P 2004/03; C01P 2004/04; C01P 2006/32; C01P 2006/40; C04B 2235/604; C04B 2235/6585; C04B 2235/76; C04B 2235/761; C04B 2235/77; C04B 2235/80;
(Continued)

(56) References Cited

U.S. PATENT DOCUMENTS

| | | | |
|---|---|---|---|
| 2002/0157699 A1* | 10/2002 | Ichinose | C01G 51/66 136/236.1 |
| 2023/0157174 A1* | 5/2023 | Funahashi | C04B 37/026 136/224 |

* cited by examiner

*Primary Examiner* — Andrew J. Oyer
(74) *Attorney, Agent, or Firm* — Richard T. Timmer

(57) ABSTRACT

Disclosed herein are doped thermoelectric ceramic oxide compositions comprising a calcium cobaltite ceramic. The doped thermoelectric ceramic oxide compositions can have a formula $Ca_{3-x}M^2_xCo_4O_9M^1_y$, where $M^1$ represents a first metal dopant, $M^2$ represents a second metal dopant, x is a number having a value of from about 0.00 to about 3.00, and y is a number having a value of from about 0.01 to about 0.50. The doped thermoelectric ceramic oxide compositions have an increased energy conversion efficiency as compared to an undoped or conventional thermoelectric ceramic oxide materials. Also disclosed are methods for making the doped thermoelectric ceramic oxide compositions. Products and devices are disclosed comprising the thermoelectric ceramic oxide compositions, e.g., solid-state conversion devices that can utilize heat to generate electricity. This abstract is intended as a scanning tool for purposes of searching in the particular art and is not intended to be limiting of the present disclosure.

20 Claims, 21 Drawing Sheets

(52) U.S. Cl.
CPC ...... *C01P 2002/52* (2013.01); *C01P 2002/72* (2013.01); *C01P 2002/77* (2013.01); *C01P 2004/03* (2013.01); *C01P 2004/04* (2013.01); *C01P 2006/32* (2013.01); *C01P 2006/40* (2013.01)

(58) Field of Classification Search
CPC ............ C04B 2235/81; C04B 2235/85; C04B 2235/9607; C04B 35/624; C04B 35/62675; C04B 2235/443; C04B 35/01; C04B 2235/3208; C04B 2235/3224; C04B 2235/3275; C04B 2235/3298
See application file for complete search history.

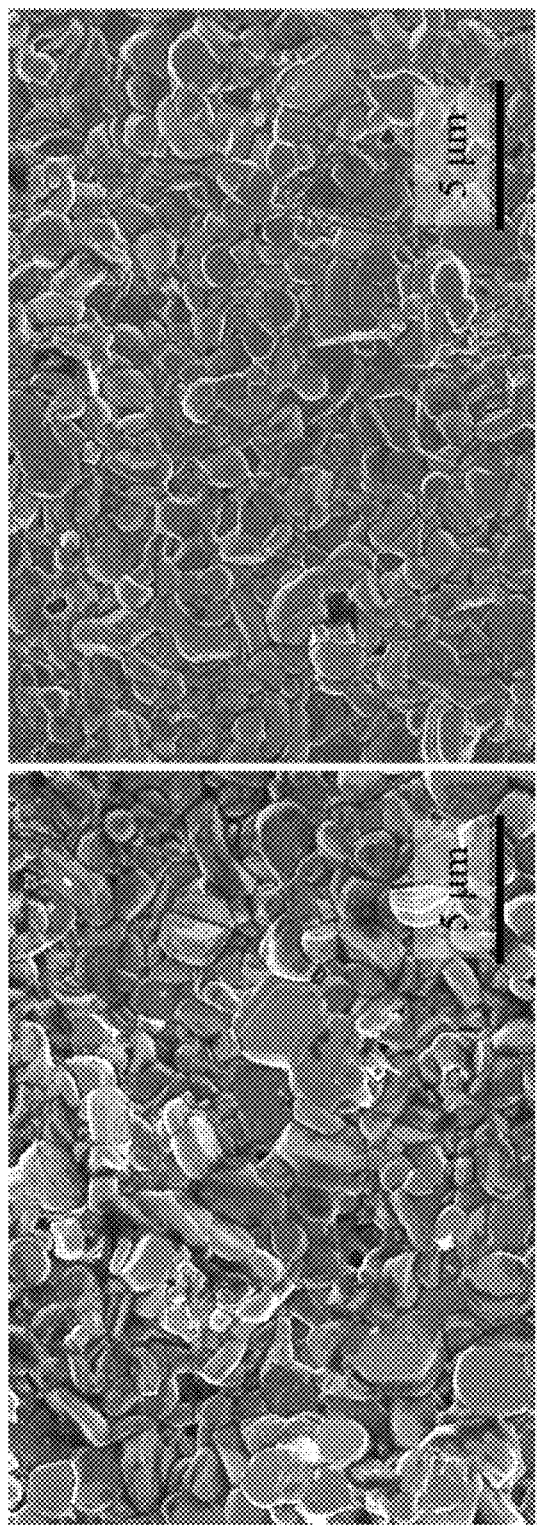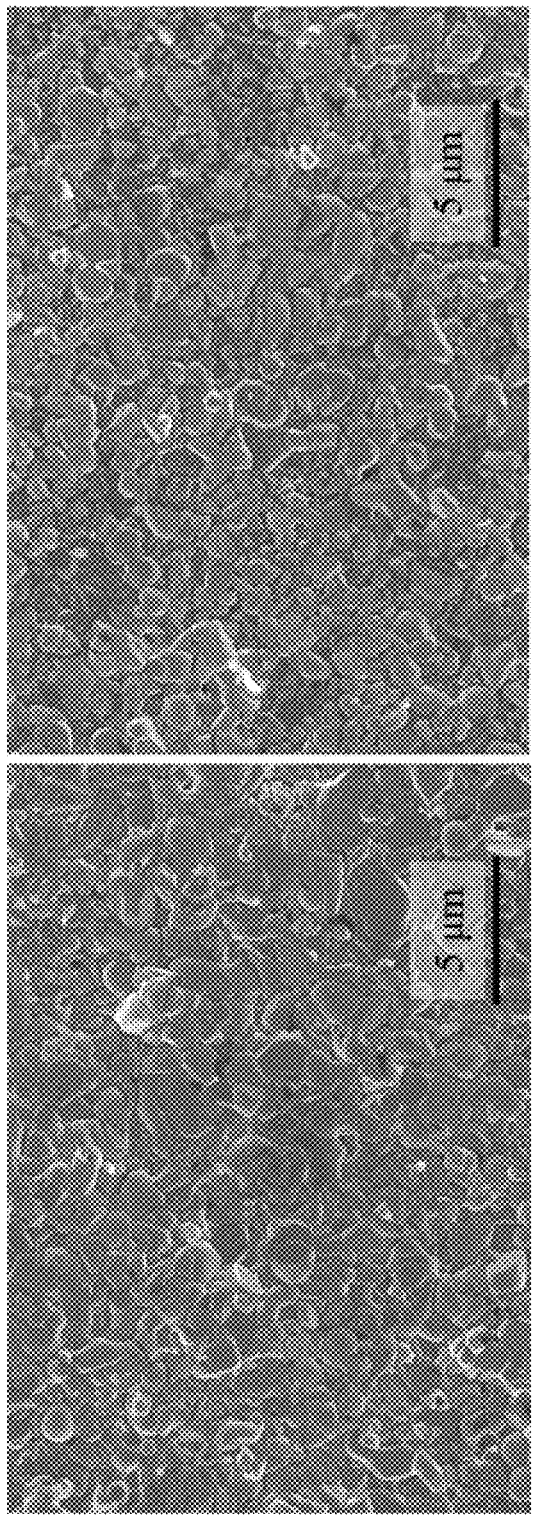
FIG. 9B
FIG. 9D
FIG. 9A
FIG. 9C

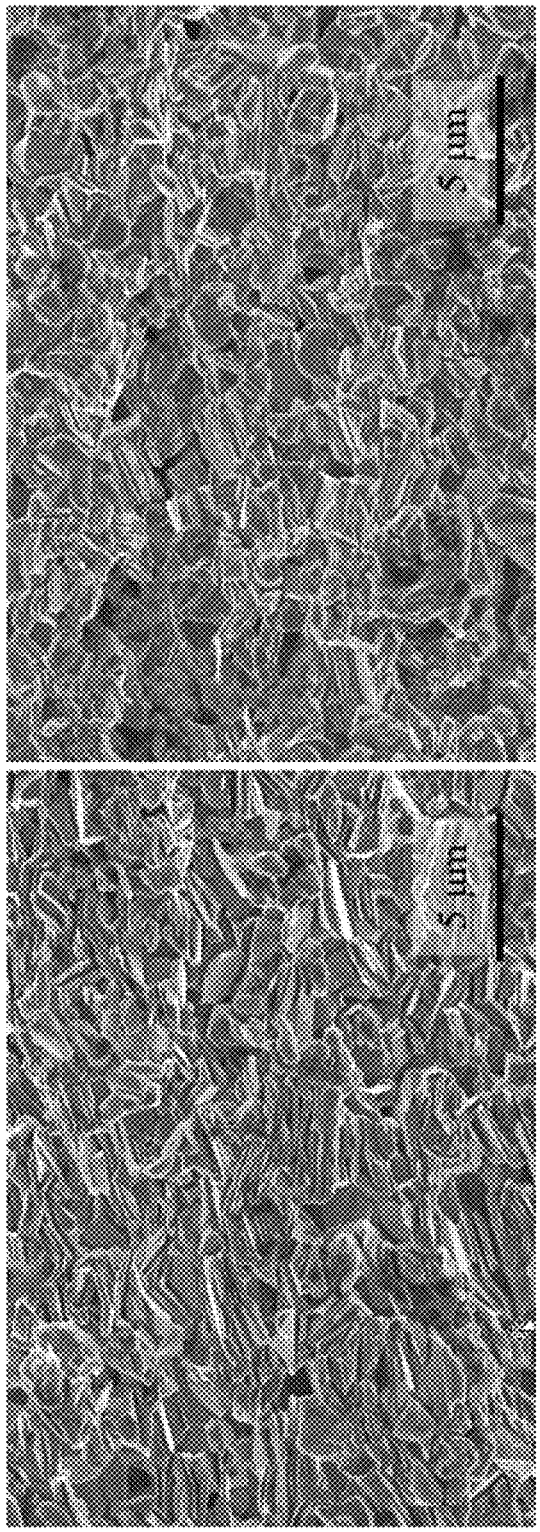
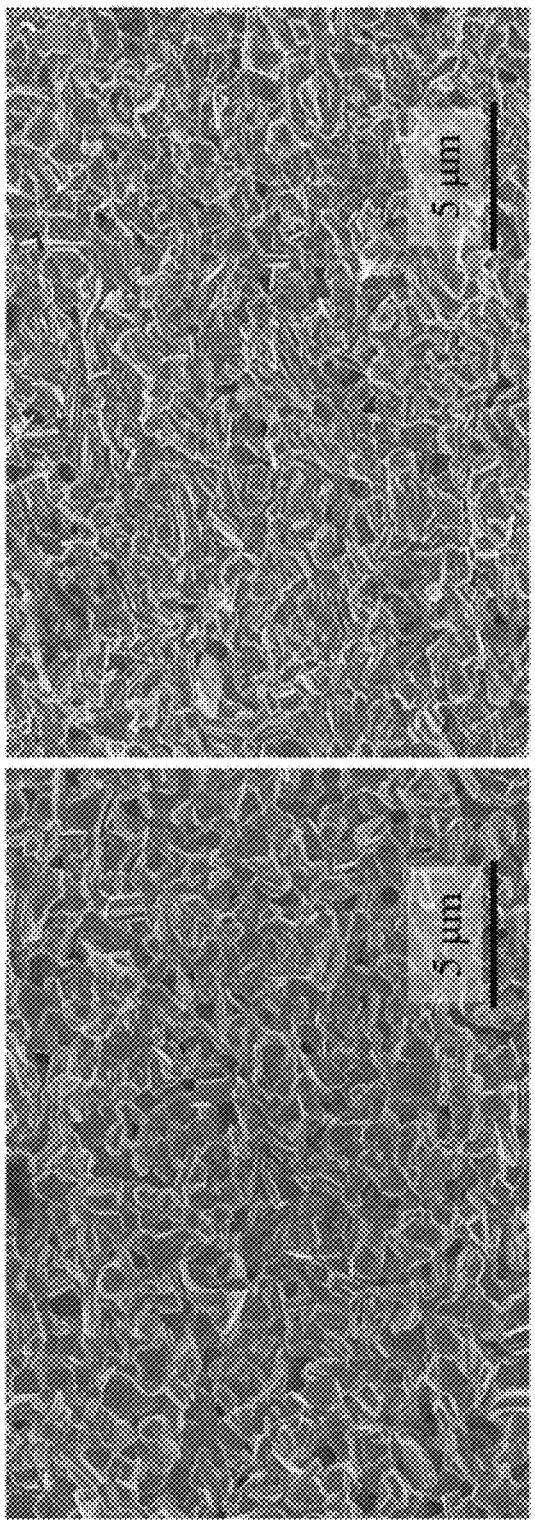
FIG. 9E  FIG. 9F  FIG. 9G  FIG. 9H

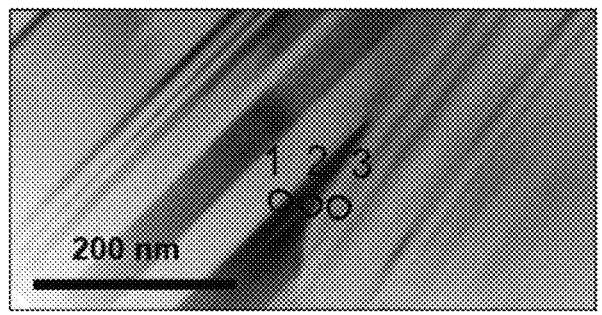
FIG. 10A
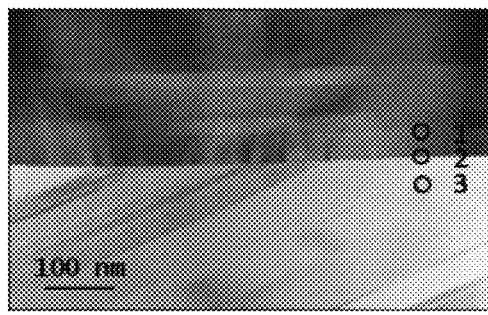
FIG. 10D
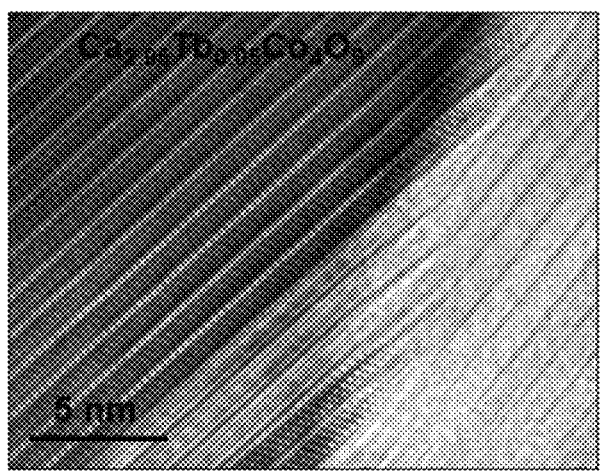
FIG. 10B
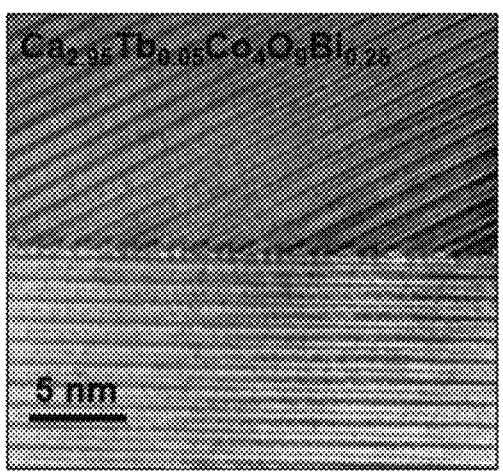
FIG. 10E
| At% | 1 | 2-GB | 3 |
|---|---|---|---|
| Ca | 13.39 | 12.54 | 12.56 |
| Co | 15.23 | 16.60 | 15.73 |
| O  | 71.06 | 70.58 | 71.32 |
| Tb | 0.32 | 0.28 | 0.38 |
FIG. 10C
| At% | 1 | 2-GB | 3 |
|---|---|---|---|
| Ca | 13.13 | 13.42 | 14.34 |
| Co | 16.05 | 16.17 | 16.24 |
| O  | 68.99 | 68.34 | 67.52 |
| Tb | 0.33 | 0.25 | 0.30 |
| Bi | 1.50 | 1.82 | 1.60 |
FIG. 10F

COMPOSITIONS AND METHODS FOR DOPED THERMOELECTRIC CERAMIC OXIDES

CROSS-REFERENCE TO RELATED APPLICATIONS

This application claims the benefit of U.S. Provisional Application No. 62/908,696, filed on Oct. 1, 2019, which is incorporated herein by reference in its entirety.

STATEMENT REGARDING FEDERALLY SPONSORED RESEARCH

This disclosure was made with U.S. Government support under grant numbers NSF-1254594 and NSF-1916581, awarded by the National Science Foundation (NSF). The U.S. government has certain rights in the disclosure.

SUMMARY

In accordance with the purpose(s) of the disclosure, as embodied and broadly described herein, the disclosure, in one aspect, relates to doped thermoelectric ceramic oxide compositions comprising a calcium cobaltite ceramic. The disclosed doped thermoelectric ceramic oxide compositions have an increased energy conversion efficiency as compared to an undoped or conventional thermoelectric ceramic oxide materials. Also disclosed herein are methods for making the doped thermoelectric ceramic oxide compositions. Further disclosed herein are products and devices comprising the thermoelectric ceramic oxide compositions, e.g., solid-state conversion devices that can utilize heat to generate electricity.

Disclosed are doped thermoelectric ceramic oxide having the following formula: $Ca_{3-x}M^2_xCo_4O_9M^1_y$; wherein x is a number having a value from about 0.00 to about 3; wherein y is a number having a value from about 0.01 to about 0.50; wherein $M^1$ is a first metal dopant comprises a metal selected from group 1 metals, group 2 metals, transtition metals, post-transitional metals, group 14 metals, group 15 metals, group 16 metals, and rare earth elements; and wherein $M^2$ is a second metal dopant comprising at least one rare earth element.

Also disclosed herein are methods of making a doped thermoelectric ceramic oxide comprising: doping a ceramic oxide formulation with a first metal dopant, $M^1$, in a sol-gel process resulting in a gel; heating the gel to form an ash; grinding the ash into an ash-based powder; compressing the ash-based powder into a pellet; and sintering the pellet to form the doped thermoelectric ceramic oxide.

Also disclosed herein are solid-states conversion device comprising a disclosed thermoelectric ceramic oxide composition.

Also disclosed herein are solid-state conversions device comprising a disclosed thermoelectric ceramic oxide composition made by a disclosed method of making same.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE FIGURES

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 2A-2F shows representative data illustrating temperature dependence of: (FIG. 2A) electrical resistivity (p-T), (FIG. 2B) Seebeck coefficient (S-T), and (FIG. 2C) electrical power factor ($S^2$/p-T); and (FIG. 2D) total thermal conductivity (K-T), (FIG. 2E) electronic contribution ($K^e$) and lattice contribution ($K_l$), and (FIG. 2F) thermoelectric figure of merit (ZT) for $Ca_{3-x}Tb_xCo_4O_9Bi_y$.

FIG. 3A shows XRD powder diffraction patterns for the undoped $Ca_3Co_{409.6}$ and the doped $Ca_{2.95}Tb_{0.05}Co_4O_9Bi_y$ (y=0.10, 0.15, 0.20, 0.25, and 0.30) samples. In all samples, monoclinic $Ca_3Co_4O_9$ was observed. Nonetheless, a minor amount of $Co_3O_4$ and $Ca_3Co_2O_6$ was observed as indicated by the marked peaks * and +, respectively. FIG. 3B shows (003) diffraction peak showing the shift to a lower Bragg's angle. Line corresponds to position of peak in the undoped $Ca_3Co_4O_9$.

(FIG. 4A) $Ca_3Co_4O_{9+\delta}$, (FIG. 4B) $Ca_{2.95}Tb_{0.05}Co_4O_{9+\delta}$, (FIG. 4C) $Ca_{2.95}Tb_{0.05}Co_4O_{9+\delta}Bi_{0.10}$, (FIG. 4D) $Ca_{2.95}Tb_{0.05}Co_4O_{9+\delta}Bi_{0.15}$, (FIG. 4E) $Ca_{2.95}Tb_{0.05}Co_4O_{9+\delta}Bi_{0.20}$, (FIG. 4F) $Ca_{2.95}Tb_{0.05}Co_4O_{9+\delta}Bi_{0.25}$, and (FIG. 4G) $Ca_{2.95}Tb_{0.05}Co_4O_{9+\delta}Bi_{0.30}$.

FIGS. 5A, 5D, and 5G show Z contrast from the samples with unary single dopant Tb; FIGS. 5B, 5E, and 5H show Z contrast from the samples with unary single dopant Bi; and FIGS. 5C, 5F, and 5I show Z contrast from the samples with dual dopants. FIGS. 5A, 5B, and 5C show the nanostructure of the lattice and grain boundary for $Ca_{2.95}Tb_{0.05}Co_4O_{9+\delta}$, $Ca_3Co_4O_{9+\delta}Bi_{0.25}$, and $Ca_{2.95}Tb_{0.05}Co_4O_{9+\delta}Bi_{0.25}$, respectively. In FIG. 5D, the arrows show the position of Tb in the rock salt layer CaO inside the lattice. In FIGS. 5E and 5F, black arrows show the position of Bi in the rock salt layer CaO inside the lattice, whereas the' white arrows show the position of Bi in the rock salt layer CoO in both the lattice and the grain boundary. FIG. 5G shows a grain boundary free of secondary phase with dopant inclusion. In FIGS. 5H and 5I, black arrows show the position of dopants in the rock salt layer CaO in both the lattice and the grain boundary, whereas the white arrows show the position of the dopants in the rock salt layer CoO in both the lattice and the grain boundary.

FIG. 6A is $Ca_3Co_4O_{9+\delta}$; FIG. 6B is $Ca_{2.95}Tb_{0.05}Co_4O_{9+\delta}$; and FIG. 6C is $Ca_{2.95}Tb_{0.05}Co_4O_{9+\delta}Bi_{0.25}$.

(FIG. 7A) p-T, (FIG. 7B)S-T, (FIG. 7C) $S^2$/p-T, (FIG. 7D) K-T, and (FIG. 7E) ZT.

(FIG. 8A) electrical resistivity (p-T), (FIG. 8B) Seebeck coefficient (S-T), and (FIG. 8C) electrical power factor ($S^2$/p-T); and (FIG. 8D) total thermal conductivity (K-T), (FIG. 8E) electronic contribution ($K_e$) and lattice contribution ($K_l$), and (FIG. 8F) thermoelectric figure of merit (ZT).

FIGS. 9A-9H shows SEM images of $Ca_{3-x}Tb_xCo_4O_{9+\delta}$ (x=0, 0.05, 0.30, and 0.50) samples after the sintering stage. SEM images of plan-view surfaces are as follows: (FIG. 9A) $Ca_3Co_4O_{9+\delta}$; (FIG. 9B) $Ca_{2.95}Tb_{0.05}Co_4O_{9+\delta}$; (FIG. 9C) $Ca_{2.71}Tb_{0.3}Co_4O_{9+\delta}$; and (FIG. 9D) $Ca_{2.5}Tb_{0.5}Co_4O_{9+\delta}$. Cross-sectional SEM images from the fractured surface are as follows: (FIG. 9E) $Ca_3Co_4O_{9+\delta}$; (FIG. 9F) $Ca_{2.95}Tb_{0.05}Co_4O_{9+\delta}$; (FIG. 9G) $Ca_{2.71}Tb_{0.3}Co_4O_{9+\delta}$; and (FIG. 9H) $Ca_{2.5}Tb_{0.5}Co_4O_{9+\delta}$.

FIGS. 10A-10F shows TEM images showing the nanostructure of the $Ca_{2.95}Tb_{0.05}Co_4O_9Bi_y$ samples. FIGS. 10A and 10B show the grain boundary from the crystals with different c-axis orientations for $Ca_{2.95}Tb_{0.05}Co_4O_{9+\delta}$. The black circles on the TEM in FIG. 10A images indicate the electron beam sample areas for the EDS data acquisition indicated on FIG. 10B. Show the grain boundary between neighboring crystals with different c-axis orientations for $Ca_{2.85}Tb_{0.05}Co_4O_{9+\delta}Bi_{0.25}$. The circles on the TEM FIG. 10D images indicate the electron beam sample areas for the EDS data acquisition indicated on FIG. 10E. FIGS. 10C and 10F show EDS data obtained on the grain boundaries and grain interior as shown in FIGS. 10B and 10F, respectively.

FIG. 12A shows the simulated STEM image of the nanostructure of the $Ca_{2.95}Tb_{0.05}Co_4O_9Bi_{0.25}$. FIG. 12B shows the representation of the associated 3D crystal structure used in the simulation.

Figure 1:
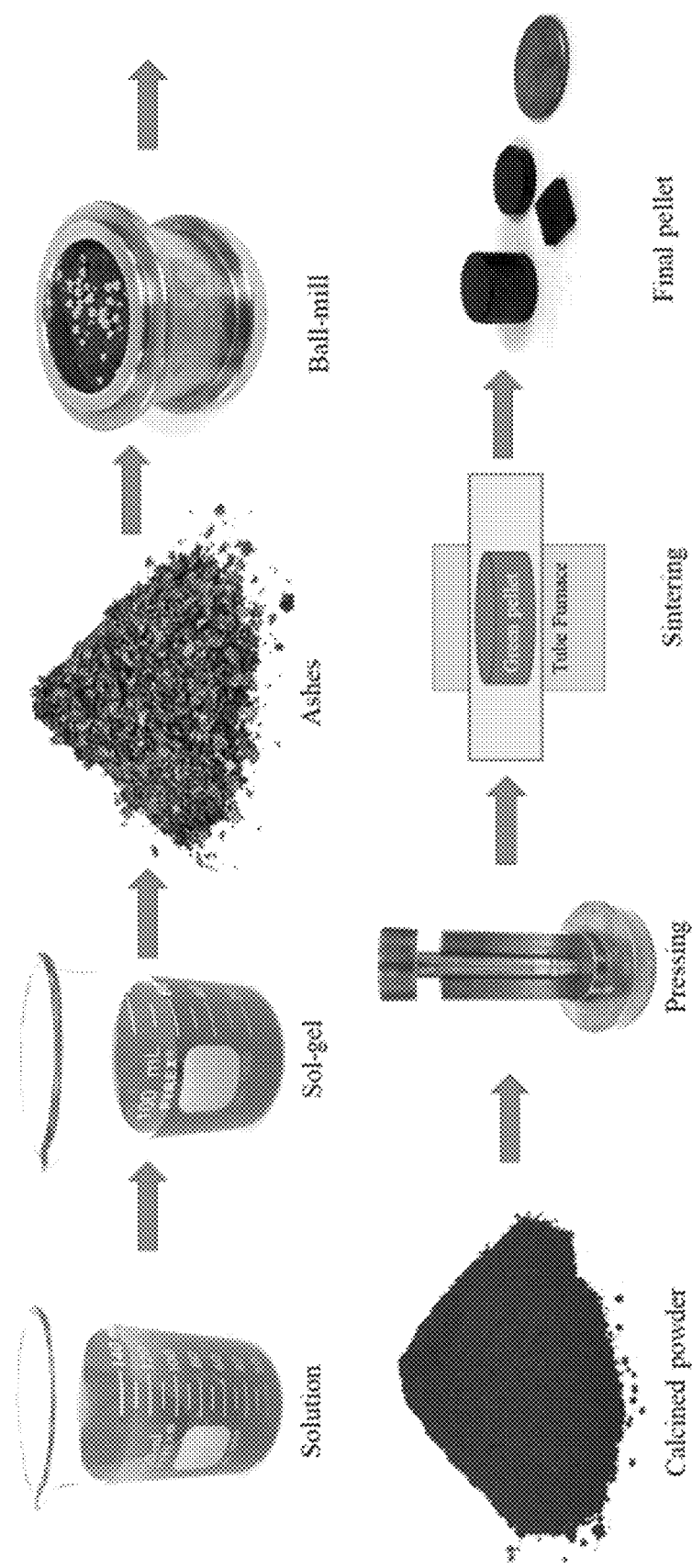
FIG. 1 shows a representative schematic illustrating an exemplary procedure for fabrication of polycrystalline ceramics pellets with the precursor powders made from the conventional chemical sol-gel route.
Figure 2A:
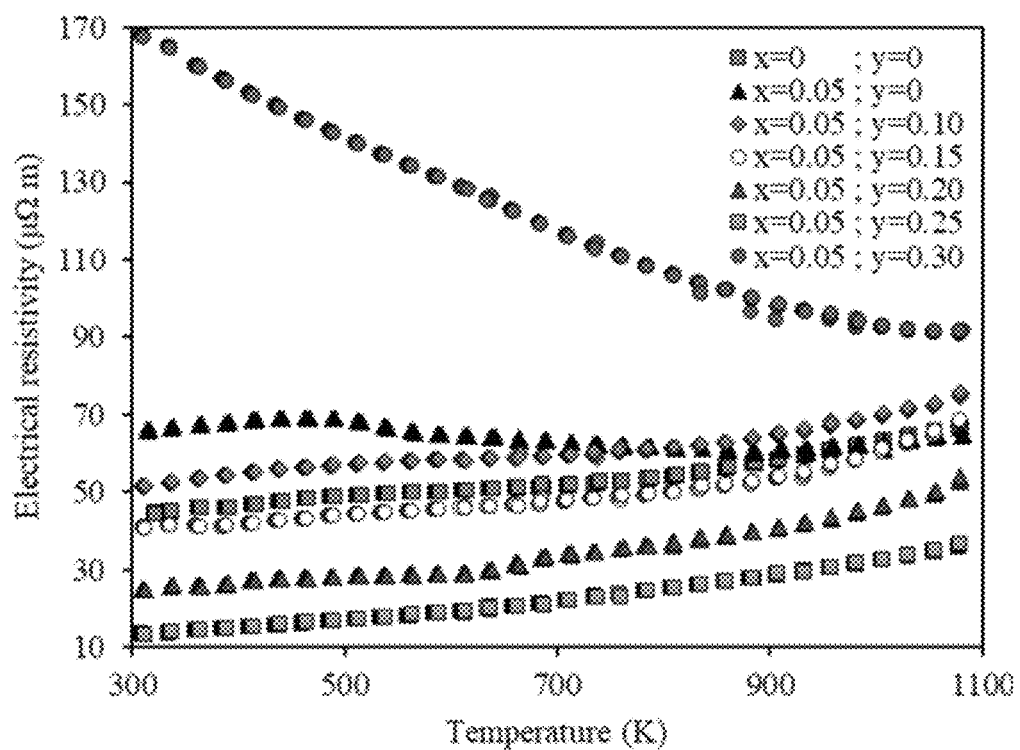
Figure 2B:
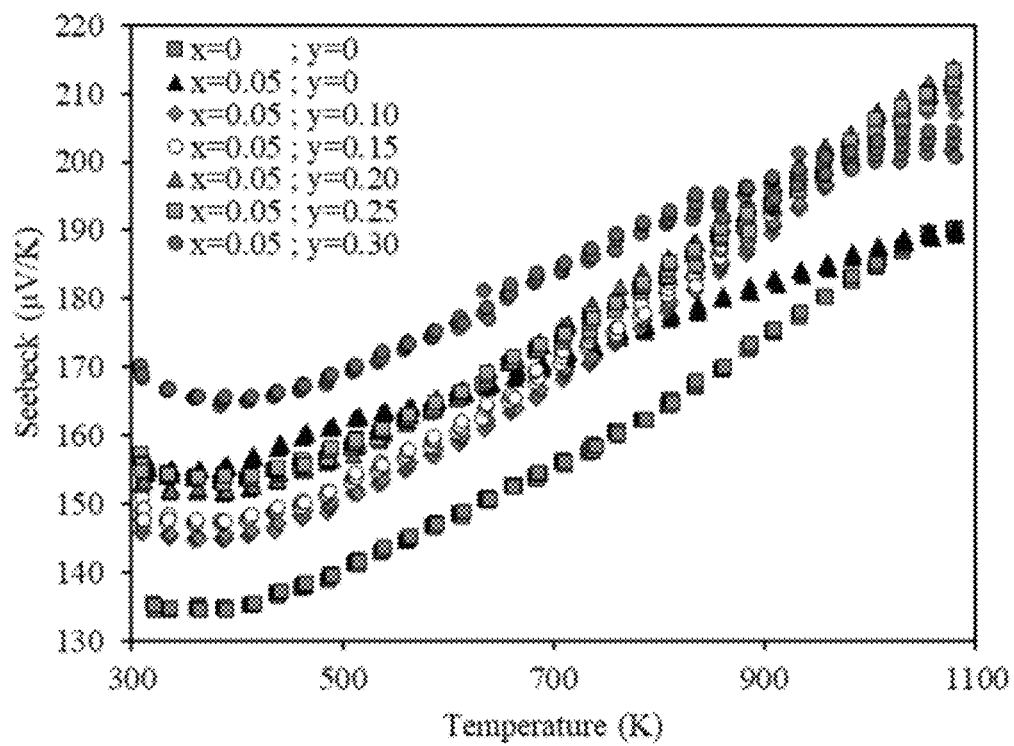
Figure 2C:
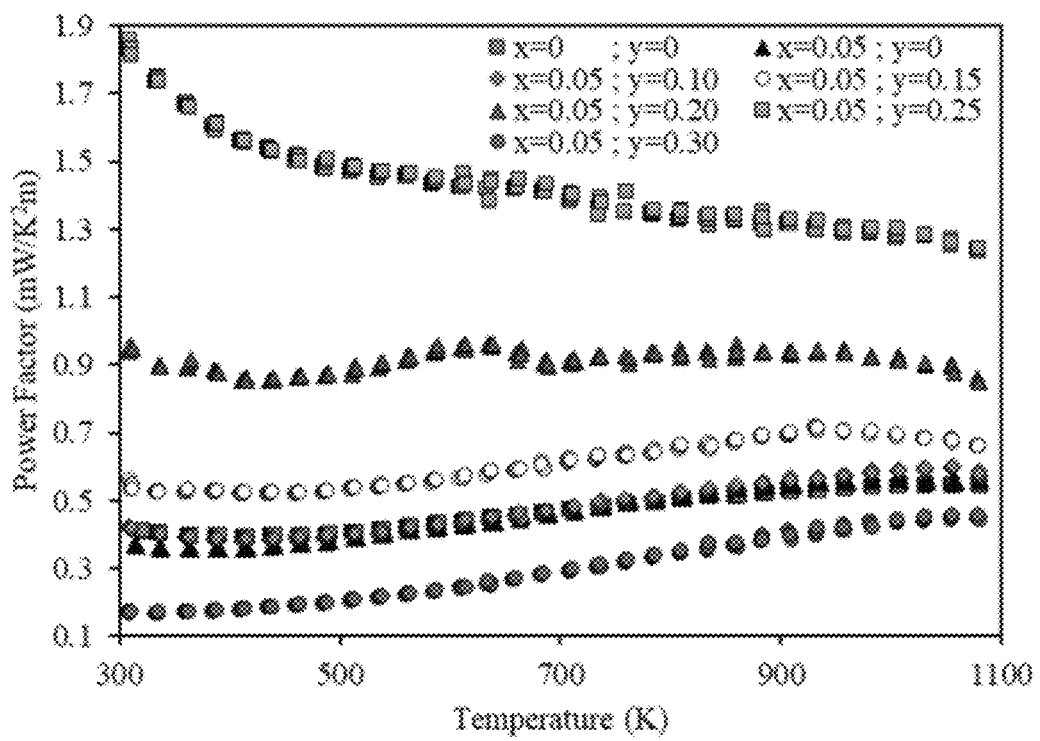
Figure 2D:
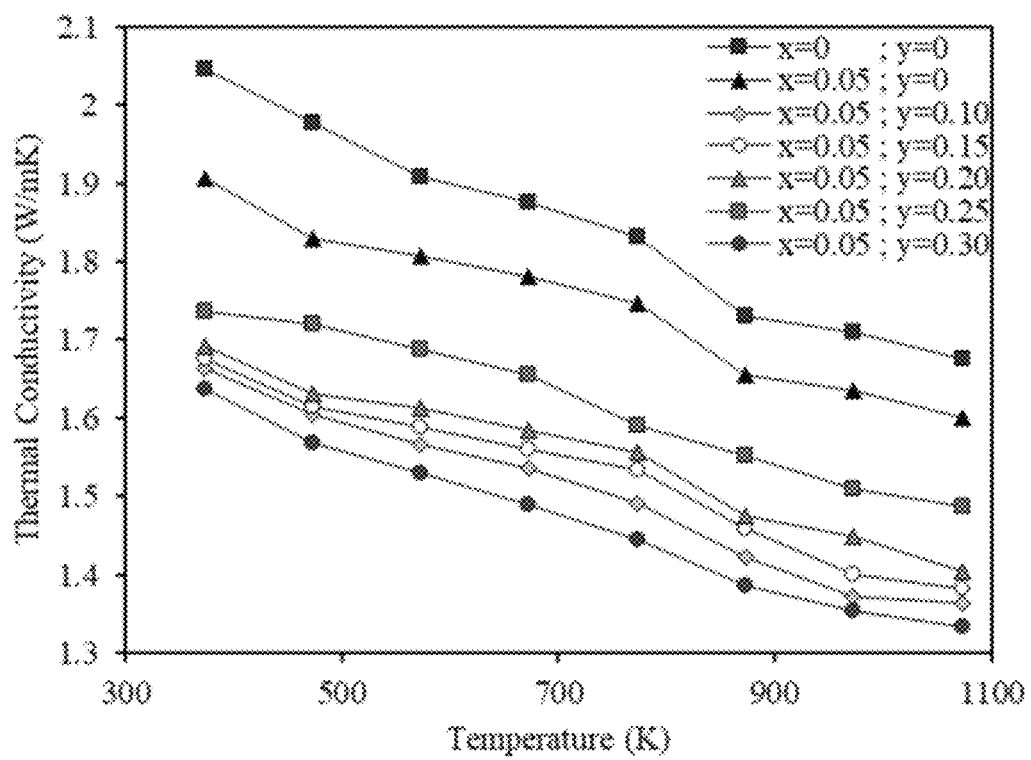
Figure 2E:
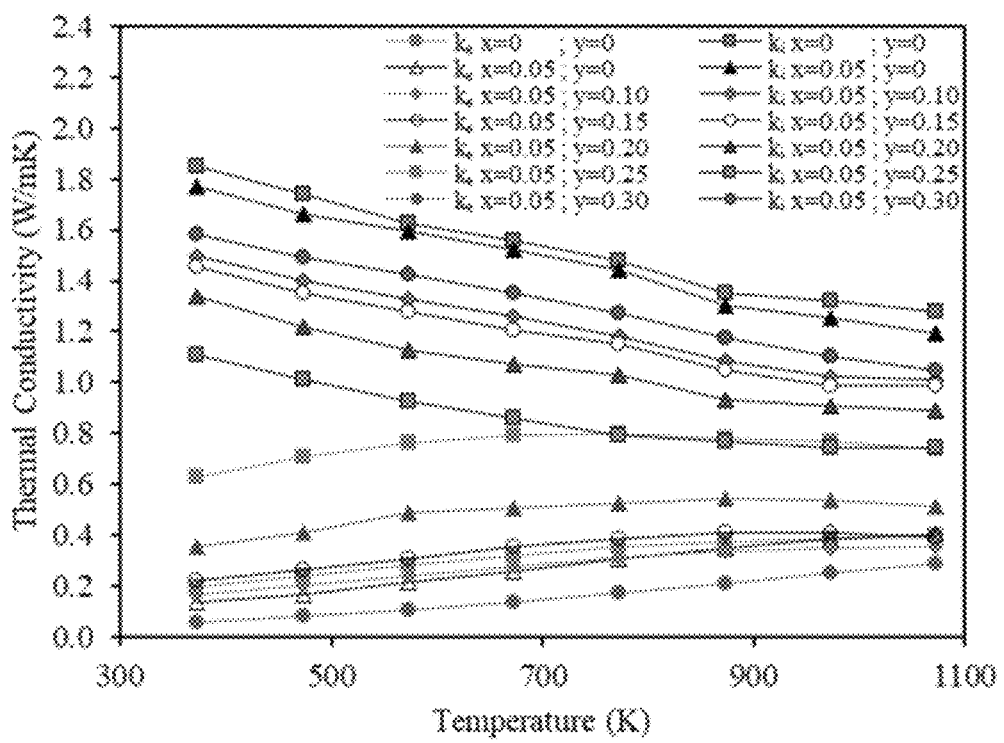
Figure 2F:
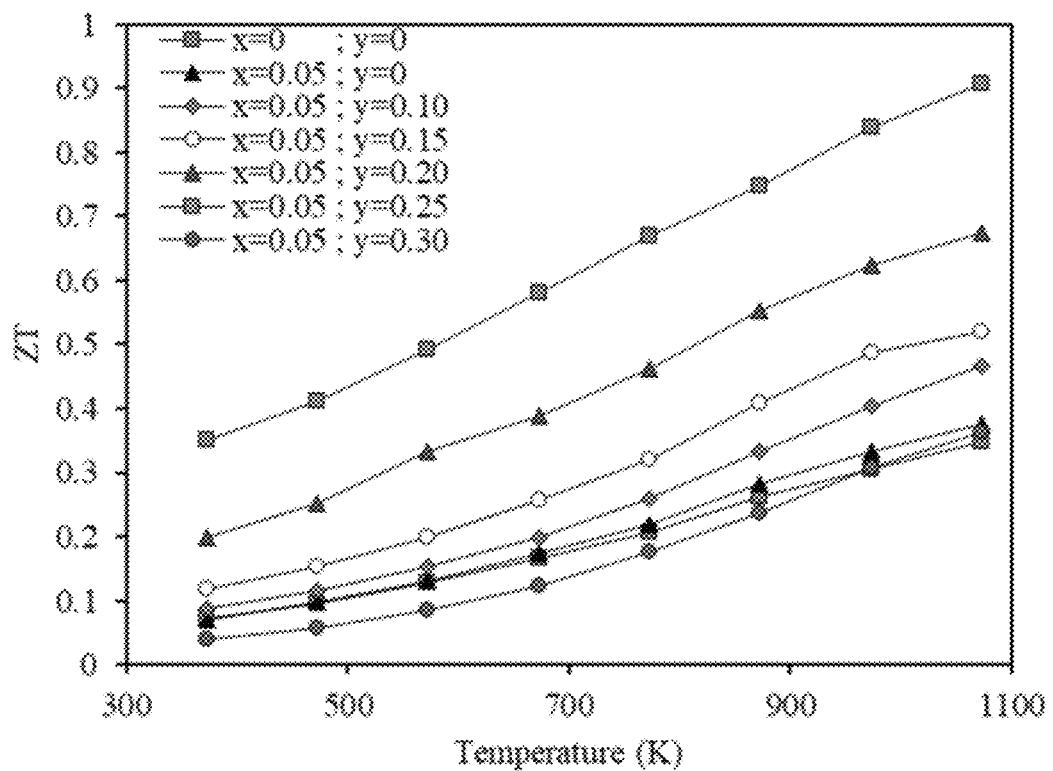

Additional advantages of the present disclosure will be set forth in part in the description which follows, and in part will be obvious from the description, or can be learned by practice of the disclosure. The advantages of the present disclosure will be realized and attained by means of the elements and combinations particularly pointed out in the appended claims. It is to be understood that both the foregoing general description and the following detailed description are exemplary and explanatory only and are not restrictive of the disclosure, as claimed.

DETAILED DESCRIPTION

Many modifications and other embodiments disclosed herein will come to mind to one skilled in the art to which the disclosed compositions and methods pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of the appended claims. The skilled artisan will recognize many variants and adaptations of the aspects described herein. These variants and adaptations are intended to be included in the teachings of this disclosure and to be encompassed by the claims herein.

Although specific terms are employed herein, they are used in a generic and descriptive sense only and not for purposes of limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

Prior to describing the various aspects of the present disclosure, the following definitions are provided and should be used unless otherwise indicated. Additional terms may be defined elsewhere in the present disclosure.

A. DEFINITIONS

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by", "comprising," "comprises", "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of.

As used in the specification and the appended claims, the singular forms "a," "an" and "the" include plural referents unless the context clearly dictates otherwise.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results, or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

As used herein, the term "effective amount" refers to an amount that is sufficient to achieve the desired modification of a physical property of the composition or material As used herein, the terms "optional" or "optionally" means that the subsequently described event or circumstance can or cannot occur, and that the description includes instances where said event or circumstance occurs and instances where it does not.

It is understood herein throughout that reference to a metal, e.g., Ba, is inclusive of any oxidation state consistent with the context or given formula.

Unless otherwise specified, temperatures referred to herein are based on atmospheric pressure (i.e. one atmosphere).

B. INTRODUCTION

Power plants, turbine engines, and automobiles, among other industrial applications, waste approximately 70% of the prime energy as heat, which is usually unproductively released into the environment. A potential way to address this issue and thereby to improve the sustainability of our electricity base, is through waste heat recovery using thermoelectric (TE) power generators, (Ref. 84, 85) or devices that possess the ability to directly transform temperature gradients into electrical power. Generally speaking, TE devices have no moving parts, are silent, and provide a relatively maintenance-free operation. TE devices could enable a wide range of applications from solid state cooling to high temperature power generations and have potential to dramatically improve the total efficiency of energy utilization, and to suppress the consumption of fossil fuels. (Refs. 86, 87, 88).

Thermoelectric (TE) technology could be more efficient if the high-performance thermoelectric materials were made of non-toxic and earth-abundant elements. (Refs. 1, 2, 3) The energy conversion efficiency of TE materials is characterized by the dimensionless figure-of-merit, (Ref. 4) ZT. ZT is defined as:

$$ZT = S^2 \sigma T / K$$

where S is the Seebeck coefficient, a is the electrical conductivity, $S^2\sigma$ is the electrical power factor, K is the thermal conductivity, and T is the absolute temperature. The high-performance ZT materials need to possess high electrical conductivity, high Seebeck coefficient, and low thermal conductivity. The efficiency reaches about 10% when ZT=1, that is generally accepted as a criterion for practical applications. However, the realization of high ZT is very complicated because all those three parameters are functions of carrier density and interrelated.

The compelling need for TE devices is largely hindered by the low energy conversion efficiency of TE materials. Generally, TE technology has been too inefficient to be cost effective in most applications. (Refs. 2, 3). The better-developed TE materials (Refs. 5, 6, 7, 8) have high ZT values. (Ref. 1). Those materials include conventional p-type TE materials available commercially such as bismuth antimony telluride ($Bi_{0.5}Sb_{1.5}Te_3$) and silicon germanium ($Si_{80}Ge_{20}$) which hold ZT values of about 1. Even though the performance of those materials is fascinating, they are usually heavy, toxic, and low in abundance as natural resources, and their thermal or chemical stability are generally inferior. (Refs. 9, 10) Moreover, particularly for those of SiGe (Ref. 9) and $Yb_{14}MnSb_{11}$ (Ref. 10) that have superior stability, they only function in the strict oxygen-free environment at high temperatures.

In comparison, ceramic oxide materials offer significant advantages due to their lower cost, lighter weight, non-toxicity. In addition, ceramic oxide materials are more suitable for high temperature applications because of their structural and chemical stability in air. However, oxide ceramics are traditionally regarded as poor TE materials because their carrier concentrations and mobility are two or three orders of magnitude lower than that conventional TE materials, and lead to low electrical conductivities.

More recent interest in oxides has emerged since the discovery of large thermopower in $Na_xCo_2O_4$ in 1997, (Ref. 11) and in $Ca_3Co_4O_{9+\delta}$ in 2000. (Ref. 12). For $Ca_3Co_4O_{9+\delta}$, the electrically conductive $CoO_2$ sheets have a strongly correlated electron system that serve as electronic transport layers, while an electrically insulating rock-salt-type $Ca_2CoO_3$ misfit layers serve as phonon scattering centers for reducing thermal conductivity. In the year 2003, an extrapolated ZT of 0.87 at 973 K (Ref. 13) in air was reported for $Ca_3Co_4O_{9-\delta}$ single crystal, making this low cost, lightweight, and non-toxic $Ca_3Co_4O_{9-\delta}$ one of the best candidates for p-type TE oxide since then. (Refs. 14, 15, 16, 17, 18, 19, 20). However, the $Ca_3Co_4O_{9+\delta}$ single crystal exhibits strong anisotropic electrical behavior because of the two-dimensional layered structure. Electrical conductivity (Ref. 21) measured in the direction perpendicular and parallel to the a-b plane of the unit cell shows that the former is lower than the latter by a factor of 500-1000. Thus, two dimensional characteristics and grain boundaries becomes serious problems for production of polycrystalline devices with high performance. The ZT of bulk polycrystalline ceramics with various dopants synthesized using different method reported to be only 30~60% of that of the single crystals. (Refs. 22, 23)

As described in the present disclosure, it has been found that a thermoelectric ceramic oxide composition comprising a doped calcium cobaltite ceramic can provide dramatically increased thermoelectric conversion efficiency as compared to the undoped ceramic. For example, in some aspects, using a systematic doping comprising a non-stoichiometric addition of Bismuth (Bi) in $Ca_3Co_4O_9$ ceramics, can result in ceramic materials can achieve a ZT that surpasses that of undoped pristine $Ca_3Co_4O_{9+\delta}$ ceramics. Further, by using a dual-doping technique with simultaneous non-stoichiometric addition of Bismuth (Bi) and stoichiometric substitution of Terbium (Tb) for Calcium (Ca) in $Ca_3Co_4O_{9+\delta}$ ceramics, the resulting ceramic materials can achieve a ZT that surpasses that of undoped pristine $Ca_3Co_4O_{9+\delta}$ ceramics as well as that of the single crystal. In certain aspects, it has been found that the dual-doped polycrystalline cobaltite oxide with designed novel non-stoichiometry $Ca_{2.95}Tb_{0.05}Co_4O_9Bi_y$ reached the peak ZT of 0.9, which is ~260% increase to that of the undoped pristine $Ca_3Co_4O_{9+\delta}$ ceramics and outperforming single crystal. Such performance enhancement is achieved by concurrent intragranular doping and intergranular dopants grain boundary segregation that lead to large increase (~460% at low temperature; ~230% at high temperature) of electrical power factor. The present disclosure sheds light about the new direction for engineering the grain boundaries to dramatically improve the performance of various TE materials.

C. THERMOELECTRIC CERAMIC OXIDE COMPOSITIONS

In an aspect, the present disclosure relates to thermoelectric ceramic oxide compositions comprising a doped calcium cobaltite ceramic $Ca_3Co_4O_{9+\delta}$. The disclosed doped thermoelectric ceramic oxide composition can have dramatically increased thermoelectric conversion efficiency as compared to the undoped calcium cobaltite ceramic. The disclosed doped calcium cobaltite ceramic results in the presence of the dopant in both intergranular and intragranular structures.

In various aspects, the present disclosure pertains to thermoelectric ceramic oxide compositions comprising a doped thermoelectric ceramic oxide having the following formula: $Ca_{3-x}M^2_xCo_4O_9M^1_y$; wherein x is a number having a value from about 0.00 to about 3; wherein y is a number having a value from about 0.01 to about 0.50; wherein $M^1$ is a first metal dopant comprises a metal selected from group 1 metals, group 2 metals, transtition metals, post-transitional metals, group 14 metals, group 15 metals, group 16 metals, and rare earth elements; and wherein $M^2$ is a second metal dopant comprising at least one rare earth element.

In various aspects, the disclosed thermoelectric ceramic oxide compositions comprise a grain boundary wherein at least a portion of the first metal dopant and/or the second metal dopant are at or proximal to the grain boundary. Without wishing to be bound by a particular theory, it is believed that segregation of at least a portion of the first metal dopant and/or the second metal dopant to or proximal to the grain boundary improves the the performance of the disclosed thermoelectric ceramic oxide compositions, e.g., Seeback coefficient, compared to conventional prior art thermoelectric ceramic oxide compositions. Preparation of thermoelectric ceramic oxide compositions wherein at least one dopant, e.g., at least a portion of the first metal dopant and/or the second metal dopant, are at or proximal to the grain boundary should be generally applicable to a variety of thermoelectric materials, including, but not limited to, the present disclosed thermoelectric ceramic oxide compositions.

In various further aspects, the disclosed thermoelectric ceramic oxide compositions can be optimized and tuned via the manipulation of type and amount of dopants present at the grain boundary. That is, manipulation and optimization of the composition and density of intra-grain doping and inter-grain (interfacial) precipitation at the grain boundary provides the ability to finely tune structure-property optimization for thermoelectric materials generally, as well as other materials.

In certain aspects, a dopant system for the thermoelectric ceramic oxide comprises a first dopant. In some aspects, the dopant system comprises a non-stoichiometric addition of a first dopant. In certain aspects, the first metal dopant may be selected from group 14, group 15, or group 16 metals, or a rare earth element. In certain aspects, the first metal dopant is a metal selected from Potassium (K), Bismuth (Bi), Cerium (Ce), Niobium (Nb), Ytterbium (Yb), Lutetium (Lu), or Barium (Ba). In certain aspects, the first metal dopant is Bi.

In certain aspects, the first metal dopant is provided as a non-stoichiometric addition to the calcium cobaltite ceramic. In some aspects, the doped ceramic material has a formula $Ca_3Co_4O_{9+\delta}M^1_y$, where $M^1$ represents the first dopant, as described herein, and y is a number having a value from about 0.01 to about 0.50, or from about 0.10 to about 0.40, or from about 0.15 to about 0.30, or from about 0.20 to about 0.25. In certain aspects, y can have a value of about 0.05 or about 0.10 or about 0.15 or about 0.20 or about 0.25 or about 0.30 or about 0.35 or about 0.40, or about 0.45 or about 0.50.

In some aspects, the disclosed thermoelectric ceramic oxide comprises a dual dopant system comprising a first metal dopant and one or more second dopants. The one or more second dopants of the dual dopant system are provided as a substitution for a portion of the calcium component in the calcium cobaltite. In certain aspects, each of the one or more second dopants is a metal selected from the rare earth elements. In certain aspects, each of the one or more second dopants is a metal selected from Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Lutetium (Lu) In an aspect, the first metal dopant is Terbium. In certain aspects, the one or more second metal dopant comprises Tb.

In some aspects, the one or more second dopants are provided in an amount to provide a stoichiometric substitution for a portion of the calcium in the ceramic. In other words, where the undoped ceramic has the formula $Ca_3Co_4O_{9+\delta}$, then the disclosed doped ceramic oxide would have a formula in which the one or more second dopants would be provided in an amount "x", and the Ca in the ceramic oxide would be reduced by the same number x to (3-x). In some aspects, x is a number having a value of from about 0.0 to about 0.10, or from about 0.01 to about 0.09, or from about 0.02 to about 0.08, or from about 0.03 to about 0.07, or from about 0.04 to about 0.06. In some aspects, x can have a value of about 0.01 or about 0.02 or about 0.03 or about 0.04 or about 0.05 or about 0.06 or about 0.07 or about 0.08 or about 0.09 or about 0.10.

In an aspect, the disclosed doped thermoelectric ceramic oxide has a formula $Ca_{3-x}M^2_xCo_4O_9M^1_y$, where M' represents a first dopant, as describe herein, $M^2$ represents the one or more second dopants, as described herein, x is a number having a value of from about 0.00 to about 0.10, and y is a number having a value of from about 0.01 to about 0.50.

In an aspect, the disclosed doped thermoelectric ceramic oxide has a formula $Ca_{3-x}Tb_xCo_4O_9Bi_y$, where x is a number having a value of from about 0.00 to about 0.10, or any range or set of intermediate values encompassed by the foregoing range, and y is a number having a value of from about 0.01 to about 0.50, or any range or set of intermediate values encompassed by the foregoing range.

In certain aspects, the optimized value for y may be unique to each unique value of x.

In some aspects, the doped thermoelectric ceramic oxide comprises a first metal dopant or a second metal dopant in the intragranular structures, the intergranular structures, or both.

In some aspects, the first dopant, the second dopant, or both are present in the intragranular structures. For example, the first dopant, the second dopant, or both, can substitute for one or more Ca or Co in the $Ca_3Co_4O_9$ lattice, such as in the CaO layer or in the CoO layer.

In certain aspects, the disclosed doped thermoelectric ceramic oxide compositions have at least one grain boundary between adjacent grains. The at least one grain boundary may be discrete or continuous, or a combination thereof. In some aspects, the first metal dopant is present at one or more of the grain boundaries.

The disclosed doped thermoelectric ceramic oxide compositions are characterized by a significant increase in the electrical conductivity and Seebeck coefficient. The disclosed dual dopant system results in systematic microstructure evolution, including the increased grain anisotropy, improved crystal grain alignment and the segregation of dopants at the grain boundaries.

In various aspects, the disclosed doped thermoelectric ceramic oxide compositions have a ZT value of at least about 0.40, about 0.41, about 0.42, about 0.43, about 0.44, about 0.45, about 0.46, about 0.47, about 0.48, about 0.49, about 0.50, about 0.51, about 0.52, about 0.53, about 0.54, about 0.55, about 0.56, about 0.57, about 0.58, about 0.59, about 0.60, about 0.61, about 0.62, about 0.63, about 0.64, about 0.65, about 0.66, about 0.67, about 0.68, about 0.69, about 0.70, about 0.71, about 0.72, about 0.73, about 0.74, about 0.75, about 0.76, about 0.77, about 0.78, about 0.79, about 0.80, about 0.81, about 0.82, about 0.83, about 0.84, about 0.85, about 0.86, about 0.87, about 0.88, about 0.89, about 0.90, about 0.91, about 0.92, about 0.93, about 0.94, about 0.95, about 0.96, about 0.97, about 0.98, about 0.99, about 1.00, about 1.01, about 1.02, about 1.03, about 1.04, about 1.05, about 1.06, about 1.07, about 1.08, about 1.09, about 1.10, about 1.11, about 1.12, about 1.13, about 1.14, about 1.15, about 1.16, about 1.17, about 1.18, about 1.19, about 1.20, about 1.21, about 1.22, about 1.23, about 1.24, about 1.25, about 1.26, about 1.27, about 1.28, about 1.29, about 1.30; or any combination of the foregoing values; or a range having a lower and upper bound selected from the foregoing values.

For example, a disclosed $Ca_{3-x}M^2_xCo_4O_9M^1_y$ material would have a ZT value of at least about 0.40, about 0.41, about 0.42, about 0.43, about 0.44, about 0.45, about 0.46, about 0.47, about 0.48, about 0.49, about 0.50, about 0.51, about 0.52, about 0.53, about 0.54, about 0.55, about 0.56, about 0.57, about 0.58, about 0.59, about 0.60, about 0.61, about 0.62, about 0.63, about 0.64, about 0.65, about 0.66, about 0.67, about 0.68, about 0.69, about 0.70, about 0.71, about 0.72, about 0.73, about 0.74, about 0.75, about 0.76, about 0.77, about 0.78, about 0.79, about 0.80, about 0.81, about 0.82, about 0.83, about 0.84, about 0.85, about 0.86, about 0.87, about 0.88, about 0.89, about 0.90, about 0.91, about 0.92, about 0.93, about 0.94, about 0.95, about 0.96, about 0.97, about 0.98, about 0.99, about 1.00, about 1.01, about 1.02, about 1.03, about 1.04, about 1.05, about 1.06, about 1.07, about 1.08, about 1.09, about 1.10, about 1.11, about 1.12, about 1.13, about 1.14, about 1.15, about 1.16, about 1.17, about 1.18, about 1.19, about 1.20, about 1.21, about 1.22, about 1.23, about 1.24, about 1.25, about 1.26, about 1.27, about 1.28, about 1.29, about 1.30; or any combination of the foregoing values; or a range having a lower and upper bound selected from the foregoing values.

In various aspects, the disclosed doped thermoelectric ceramic oxide compositions have a ZT value that is greater than a undoped thermoelectric ceramic oxide composition consisting of essentially the same composition of ceramic oxide without a first or a second metal dopant by at least about 10%, about 11%, about 12%, about 13%, about 14%, about 15%, about 16%, about 17% about 18%, about 19%, about 20%, about 21%, about 22%, about 23%, about 24%, about 25%, about 26%, about 27% about 28%, about 29%, about 30%, about 31%, about 32%, about 33%, about 34%, about 35%, about 36%, about 37% about 38%, about 39%, about 40%, about 41%, about 42%, about 43%, about 44%, about 45%, about 46%, about 47% about 48%, about 49%, about 50%, about 51%, about 52%, about 53%, about 54%, about 55%, about 56%, about 57% about 58%, about 59%, about 60%, about 61%, about 62%, about 63%, about 64%, about 65%, about 66%, about 67% about 68%, about 69%, about 70%, about 71%, about 72%, about 73%, about 74%, about 75%, about 76%, about 77% about 78%, about 79%, about 80%, about 81%, about 82%, about 83%, about 84%, about 85%, about 86%, about 87% about 88%, about 89%, about 90%, about 91%, about 92%, about 93%, about 94%, about 95%, about 96%, about 97% about 98%, about 99%, about 100%, about 101%, about 102%, about 103%, about 104%, about 105%, about 106%, about 107%, about 108%, about 109%, about 110%, about 111%, about 112%, about 113%, about 114%, about 115%, about 116%, about 117% about 118%, about 119%, about 120%, about 121%, about 122%, about 123%, about 124%, about 125%, about 126%, about 127% about 128%, about 129%, about 130%, about 131%, about 132%, about 133%, about 134%, about 135%, about 136%, about 137% about 138%, about 139%, about 140%, about 141%, about 142%, about 143%, about 144%, about 145%, about 146%, about 147% about 148%, about 149%, about 150%, about 151%, about 152%, about 153%, about 154%, about 155%, about 156%, about 157% about 158%, about 159%, about 160%, about 161%, about 162%, about 163%, about 164%, about 165%, about 166%, about 167% about 168%, about 169%, about 170%, about 171%, about 172%, about 173%, about 174%, about 175%, about 176%, about 177% about 178%, about 179%, about 180%, about 181%, about 182%, about 183%, about 184%, about 185%, about 186%, about 187% about 188%, about 189%, about 190%, about 191%, about 192%, about 193%, about 194%, about 195%, about 196%, about 197% about 198%, about 199%, about 200%, about 201%, about 202%, about 203%, about 204%, about 205%, about 206%, about 207%, about 208%, about 209%, about 210%, about 211%, about 212%, about 213%, about 214%, about 215%, about 216%, about 217% about 218%, about 219%, about 220%, about 221%, about 222%, about 223%, about 224%, about 225%, about 226%, about 227% about 228%, about 229%, about 230%, about 231%, about 232%, about 233%, about 234%, about 235%, about 236%, about 237% about 238%, about 239%, about 240%, about 241%, about 242%, about 243%, about 244%, about 245%, about 246%, about 247% about 248%, about 249%, about 250%, about 251%, about 252%, about 253%, about 254%, about 255%, about 256%, about 257% about 258%, about 259%, about 260%, about 261%, about 262%, about 263%, about 264%, about 265%, about 266%, about 267% about 268%, about 269%, about 270%, about 271%, about 272%, about 273%, about 274%, about 275%, about 276%, about 277% about 278%, about 279%, about 280%, about 281%, about 282%, about 283%, about 284%, about 285%, about 286%, about 287% about 288%, about 289%, about 290%, about 291%, about 292%, about 293%, about 294%, about 295%, about 296%, about 297% about 298%, about 299%, about 300%; or any combination of the foregoing values; or a range having a lower and upper bound selected from the foregoing values.

For example, a disclosed $Ca_{3-x}M^2_xCo_4O_9M^1_y$ material would have a ZT value greater than an undoped $Ca_3Co_4O_9$ oxide ceramic material by at least about 10%, about 11%, about 12%, about 13%, about 14%, about 15%, about 16%, about 17% about 18%, about 19%, about 20%, about 21%, about 22%, about 23%, about 24%, about 25%, about 26%, about 27% about 28%, about 29%, about 30%, about 31%, about 32%, about 33%, about 34%, about 35%, about 36%, about 37% about 38%, about 39%, about 40%, about 41%, about 42%, about 43%, about 44%, about 45%, about 46%, about 47% about 48%, about 49%, about 50%, about 51%, about 52%, about 53%, about 54%, about 55%, about 56%, about 57% about 58%, about 59%, about 60%, about 61%, about 62%, about 63%, about 64%, about 65%, about 66%, about 67% about 68%, about 69%, about 70%, about 71%, about 72%, about 73%, about 74%, about 75%, about 76%, about 77% about 78%, about 79%, about 80%, about 81%, about 82%, about 83%, about 84%, about 85%, about 86%, about 87% about 88%, about 89%, about 90%, about 91%, about 92%, about 93%, about 94%, about 95%, about 96%, about 97% about 98%, about 99%, about 100%, about 101%, about 102%, about 103%, about 104%, about 105%, about 106%, about 107%, about 108%, about 109%, about 110%, about 111%, about 112%, about 113%, about 114%, about 115%, about 116%, about 117% about 118%, about 119%, about 120%, about 121%, about 122%, about 123%, about 124%, about 125%, about 126%, about 127% about 128%, about 129%, about 130%, about 131%, about 132%, about 133%, about 134%, about 135%, about 136%, about 137% about 138%, about 139%, about 140%, about 141%, about 142%, about 143%, about 144%, about 145%, about 146%, about 147% about 148%, about 149%, about 150%, about 151%, about 152%, about 153%, about 154%, about 155%, about 156%, about 157% about 158%, about 159%, about 160%, about 161%, about 162%, about 163%, about 164%, about 165%, about 166%, about 167% about 168%, about 169%, about 170%, about 171%, about 172%, about 173%, about 174%, about 175%, about 176%, about 177% about 178%, about 179%, about 180%, about 181%, about 182%, about 183%, about 184%, about 185%, about 186%, about 187% about 188%, about 189%, about 190%, about 191%, about 192%, about 193%, about 194%, about 195%, about 196%, about 197% about 198%, about 199%, about 200%, about 201%, about 202%, about 203%, about 204%, about 205%, about 206%, about 207%, about 208%, about 209%, about 210%, about 211%, about 212%, about 213%, about 214%, about 215%, about 216%, about 217% about 218%, about 219%, about 220%, about 221%, about 222%, about 223%, about 224%, about 225%, about 226%, about 227% about 228%, about 229%, about 230%, about 231%, about 232%, about 233%, about 234%, about 235%, about 236%, about 237% about 238%, about 239%, about 240%, about 241%, about 242%, about 243%, about 244%, about 245%, about 246%, about 247% about 248%, about 249%, about 250%, about 251%, about 252%, about 253%, about 254%, about 255%, about 256%, about 257% about 258%, about 259%, about 260%, about 261%, about 262%, about 263%, about 264%, about 265%, about 266%, about 267% about 268%, about 269%, about 270%, about 271%, about 272%, about 273%, about 274%, about 275%, about 276%, about 277% about 278%, about 279%, about 280%, about 281%, about 282%, about 283%, about 284%, about 285%, about 286%, about 287% about 288%, about 289%, about 290%, about 291%, about 292%, about 293%, about 294%, about 295%, about 296%, about 297% about 298%, about 299%, about 300%; or any combination of the foregoing values; or a range having a lower and upper bound selected from the foregoing values.

In various aspects, the disclosed doped thermoelectric ceramic oxide compositions have a ZT value that is greater than a undoped thermoelectric ceramic oxide composition consisting of essentially the same composition of ceramic oxide without a first or a second metal dopant by about 10% to about 300%. In a further aspect, the disclosed doped thermoelectric ceramic oxide compositions have a ZT value that is greater than a undoped thermoelectric ceramic oxide composition consisting of essentially the same composition of ceramic oxide without a first or a second metal dopant by about 50% to about 300%. In a still further aspect, the disclosed doped thermoelectric ceramic oxide compositions have a ZT value that is greater than a undoped thermoelectric ceramic oxide composition consisting of essentially the same composition of ceramic oxide without a first or a second metal dopant by about 100% to about 300%. In a yet further aspect, the disclosed doped thermoelectric ceramic oxide compositions have a ZT value that is greater than a undoped thermoelectric ceramic oxide composition consisting of essentially the same composition of ceramic oxide without a first or a second metal dopant by about 150% to about 300%.

In various aspects, the disclosed doped thermoelectric ceramic oxide compositions have a ZT value that is greater than a undoped thermoelectric ceramic oxide composition consisting of essentially the same composition of ceramic oxide without a first or a second metal dopant by about 10% to about 200%. In a further aspect, the disclosed doped thermoelectric ceramic oxide compositions have a ZT value that is greater than a undoped thermoelectric ceramic oxide composition consisting of essentially the same composition of ceramic oxide without a first or a second metal dopant by about 50% to about 200%. In a still further aspect, the disclosed doped thermoelectric ceramic oxide compositions have a ZT value that is greater than a undoped thermoelectric ceramic oxide composition consisting of essentially the same composition of ceramic oxide without a first or a second metal dopant by about 100% to about 200%. In a yet further aspect, the disclosed doped thermoelectric ceramic oxide compositions have a ZT value that is greater than a undoped thermoelectric ceramic oxide composition consisting of essentially the same composition of ceramic oxide without a first or a second metal dopant by about 150% to about 200%.

For example, a disclosed $Ca_{3-x}M^2_xCo_4O_9M^1_y$ material would have a ZT value greater than an undoped $Ca_3Co_4O_9$ oxide ceramic material by about 10% to about 300%. In a further aspect, adisclosed $Ca_{3-x}M^2_xCo_4O_9M^1_y$ material would have a ZT value greater than an undoped $Ca_3Co_4O_9$ oxide ceramic material by about 50% to about 300%. In a still further aspect a disclosed $Ca_{3-x}M^2_xCo_4O_9M^1_y$ material would have a ZT value greater than an undoped $Ca_3Co_4O_9$ oxide ceramic material by about t 150% to about 300%.

In a further example, a disclosed $Ca_{3-x}M^2_xCo_4O_9M^1_y$ material would have a ZT value greater than an undoped $Ca_3Co_4O_9$ oxide ceramic material by about 10% to about 200%. In a further aspect, a disclosed $Ca_{3-x}M^2_xCo_4O_9M^1_y$ material would have a ZT value greater than an undoped $Ca_3Co_4O_9$ oxide ceramic material by about 50% to about 200%. In a still further, aspect a disclosed $Ca_{3-x}M^2_xCo_4O_9M^1_y$ material would have a ZT value greater than an undoped $Ca_3Co_4O_9$ oxide ceramic material by about 100% to about 200%. In a yet further aspect, a disclosed $Ca_{3-x}M^2_xCo_4O_9M^1_y$ material would have a ZT value greater than an undoped $Ca_3Co_4O_9$ oxide ceramic material by about 150% to about 200%.

In various aspects, the disclosed doped thermoelectric ceramic oxide compositions have a thermal conductivity that is decreased compared to a undoped thermoelectric ceramic oxide composition consisting of essentially the same composition of ceramic oxide without a first or a second metal dopant by less than about 1%, about 2%, about 3%, about 4%, about 5%, about 6%, about 7%, about 8%, about 9%, about 10%, about 11%, about 12%, about 13%, about 14%, about 15%, about 16%, about 17% about 18%, about 19%, about 20%, about 21%, about 22%, about 23%, about 24%, about 25%, about 26%, about 27% about 28%, about 29%, about 30%, about 31%, about 32%, about 33%, about 34%, about 35%, about 36%, about 37% about 38%, about 39%, about 40%, about 41%, about 42%, about 43%, about 44%, about 45%, about 46%, about 47% about 48%, about 49%, about 50%; or any combination of the foregoing values; or a range having a lower and upper bound selected from the foregoing values.

For example, a disclosed $Ca_{3-x}M^2_xCo_4O_9M^1_y$ material would have a thermal conductivity that is decreased compared to an undoped $Ca_3Co_4O_9$ oxide ceramic material by less than about 1%, about 2%, about 3%, about 4%, about 5%, about 6%, about 7%, about 8%, about 9%, about 10%, about 11%, about 12%, about 13%, about 14%, about 15%, about 16%, about 17% about 18%, about 19%, about 20%, about 21%, about 22%, about 23%, about 24%, about 25%, about 26%, about 27% about 28%, about 29%, about 30%, about 31%, about 32%, about 33%, about 34%, about 35%, about 36%, about 37% about 38%, about 39%, about 40%, about 41%, about 42%, about 43%, about 44%, about 45%, about 46%, about 47% about 48%, about 49%, about 50%; or any combination of the foregoing values; or a range having a lower and upper bound selected from the foregoing values.

In various aspects, the disclosed doped thermoelectric ceramic oxide compositions have a thermal conductivity that is decreased compared to a undoped thermoelectric ceramic oxide composition consisting of essentially the same composition of ceramic oxide without a first or a second metal dopant by less than about 1% to about 25%. In a further aspect, the disclosed doped thermoelectric ceramic oxide compositions have a thermal conductivity that is decreased compared to a undoped thermoelectric ceramic oxide composition consisting of essentially the same composition of ceramic oxide without a first or a second metal dopant by less than about 5% to about 20%. In a still further aspect, the disclosed doped thermoelectric ceramic oxide compositions have a thermal conductivity that is decreased compared to a undoped thermoelectric ceramic oxide composition consisting of essentially the same composition of ceramic oxide without a first or a second metal dopant by less than about 5% to about 10%. In a yet further aspect, the disclosed doped thermoelectric ceramic oxide compositions have a thermal conductivity that is decreased compared to a undoped thermoelectric ceramic oxide composition consisting of essentially the same composition of ceramic oxide without a first or a second metal dopant by less than about 15% to about 20%.

For example, a disclosed $Ca_{3-x}M^2_xCo_4O_9M^1_y$ material would have a thermal conductivity that is decreased compared to an undoped $Ca_3Co_4O_9$ oxide ceramic material by less than about 1% to about 25%. In a further aspect, the $Ca_{3-x}M^2_xCo_4O_9M^1_y$ material would have a thermal conductivity that is decreased compared to an undoped $Ca_3Co_4O_9$ oxide ceramic material by less than about 5% to about 20%. In a still further aspect, $Ca_{3-x}M^2_xCo_4O_9M^1_y$ material would have a thermal conductivity that is decreased compared to an undoped $Ca_3Co_4O_9$ oxide ceramic material by less than about 10% to about 20%. In a yet further aspect, $Ca_{3-x}M^2_xCo_4O_9M^1_y$ material would have a thermal conductivity that is decreased compared to an undoped $Ca_3Co_4O_9$ oxide ceramic material by less than about 15% to about 20%.

D. METHODS OF MAKING THERMOELECTRIC CERAMIC OXIDE COMPOSITIONS

In various aspects, the present disclosure pertains to methods of making a doped thermoelectric ceramic oxide comprising: doping a ceramic oxide formulation with a first metal dopant, $M^1$, in a sol-gel process resulting in a gel; heating the gel to form an ash; grinding the ash into an ash-based powder; compressing the ash-based powder into a pellet; and sintering the pellet to form the doped thermoelectric ceramic oxide.

In a further aspect, the present disclosure relates to methods of making the doped thermoelectric ceramic oxide materials disclosed herein. In an aspect, a methods of making the disclosed doped thermoelectric ceramic oxide comprising the steps of: dissolving in water the following: citric acid, ethylene glycol, polyethylene glycol, nitric acid, a calcium nitrate salt, a cobalt nitrate salt, and a salt comprising a cation of the first metal dopant described herein; stirring the solution under heat to form a gel; converting the gel to ash by applying heat to the gel; grinding the ash; calcining the ground ash to form a powder; pressing the powder to form a pellet; and sintering the pellet to form a doped thermoelectric ceramic oxide.

In an aspect, a method of making the disclosed doped thermoelectric ceramic oxide comprising the steps of: dissolving in water the following: citric acid, ethylene glycol, polyethylene glycol, nitric acid, a calcium nitrate salt, a cobalt nitrate salt, and a salt comprising a cation of Bi, Ce, Nb, Yb, Lu, or Ba; stirring the solution under heat to form a gel; converting the gel to ash by applying heat to the gel; grinding the ash; calcining the ground ash to form a powder; and pressing the powder to form a pellet; and sintering the pellet to form a doped thermoelectric ceramic oxide.

In an aspect, a method of making the disclosed doped thermoelectric ceramic oxide comprising the steps of: dissolving in water the following: citric acid, ethylene glycol, polyethylene glycol, nitric acid, $Ca(NO_3)_2 \cdot 4H_2O$, $Co(NO_3)_2 \cdot 6H_2O$, and $Bi(NO_3)_3 \cdot 5H_2O$; stirring the solution under heat to form a gel; converting the gel to ash by applying heat to the gel; grinding the ash; calcining the ground ash to form a powder; and pressing the powder to form a pellet; and sintering the pellet to form a doped thermoelectric ceramic oxide.

In a further aspect, disclosed are methods of making a doped thermoelectric ceramic oxide comprising the steps of: doping a ceramic oxide formulation with a first metal dopant in a sol-gel process resulting in a gel; heating the gel to form an ash-based powder; compressing the ash-based powder into a pellet; and sintering the pellet to form the doped thermoelectric ceramic oxide having a grain boundary phase that comprises an oxide of the first dopant; wherein the doped thermoelectric ceramic oxide has the molecular formula $Ca_3Co_4O_{9+\delta}M^1_y$, where $M^1$ represents the first dopant, and y is a number having a value from about 0.01 to about 0.50, or any range or set of intermediate values encompassed by the foregoing range.

In a further aspect, disclosed are methods of making a doped thermoelectric ceramic oxide comprising the steps of: doping a ceramic oxide formulation with a first metal dopant in a sol-gel process resulting in a gel; heating the gel to form an ash-based powder; compressing the ash-based powder into a pellet; and sintering the pellet to form the doped thermoelectric ceramic oxide having a grain boundary phase that comprises an oxide of the first dopant; wherein the doped thermoelectric ceramic oxide has the molecular formula $Ca_3Co_4O_{9+\delta}Bi_y$, where y is a number having a value from about 0.01 to about 0.50, or any range or set of intermediate values encompassed by the foregoing range.

In an aspect, a method of making the disclosed doped thermoelectric ceramic oxide comprising the steps of: dissolving in water the following: citric acid, ethylene glycol, polyethylene glycol, nitric acid, a calcium nitrate salt, a cobalt nitrate salt, and a salt comprising a cation of Bi; stirring the solution under heat to form a gel; converting the gel to ash by applying heat to the gel; grinding the ash; calcining the ground ash to form a powder; and pressing the powder to form a pellet; and sintering the pellet to form a doped thermoelectric ceramic oxide.

In an aspect, the present disclosure relates to methods for making the doped thermoelectric ceramic oxide materials disclosed herein. In an aspect, a methods of making the disclosed doped thermoelectric ceramic oxide comprising the steps of: dissolving in water the following: citric acid, ethylene glycol, polyethylene glycol, nitric acid, a calcium nitrate salt, a cobalt nitrate salt, a salt comprising a cation of the first metal dopant described herein, and a salt comprising a cation of the second metal dopant described herein; stirring the solution under heat to form a gel; converting the gel to ash by applying heat to the gel; grinding the ash; calcining the ground ash to form a powder; pressing the powder to form a pellet; and sintering the pellet to form a doped thermoelectric ceramic oxide.

In an aspect, a method of making the disclosed doped thermoelectric ceramic oxide comprising the steps of: dissolving in water the following: citric acid, ethylene glycol, polyethylene glycol, nitric acid, a calcium nitrate salt, a cobalt nitrate salt, and a salt comprising a cation of Bi, Ce, Nb, Yb, Lu, or Ba, and a salt comprising a cation of La, Ce, Pr, Nd, Pm, Sm, Eu, Gd, Tb, Dy, Ho, Er, Tm, Yb, or Lu; stirring the solution under heat to form a gel; converting the gel to ash by applying heat to the gel; grinding the ash; calcining the ground ash to form a powder; and pressing the powder to form a pellet; and sintering the pellet to form a doped thermoelectric ceramic oxide.

In an aspect, a method of making the disclosed doped thermoelectric ceramic oxide comprising the steps of: dissolving in water the following: citric acid, ethylene glycol, polyethylene glycol, nitric acid, a calcium nitrate salt, a cobalt nitrate salt, and a salt comprising a cation of Bi, and a salt comprising a cation of Tb; stirring the solution under heat to form a gel; converting the gel to ash by applying heat to the gel; grinding the ash; calcining the ground ash to form a powder; and pressing the powder to form a pellet; and sintering the pellet to form a doped thermoelectric ceramic oxide.

In an aspect, a method of making the disclosed doped thermoelectric ceramic oxide comprising the steps of: dissolving in water the following: citric acid, ethylene glycol, polyethylene glycol, nitric acid, $Ca(NO_3)_2 \cdot 4H_2O$, $Co(NO_3)_2 \cdot 6H_2O$, $Bi(NO_3)_3 \cdot 5H_2O$, and $Tb(NO_3)_3 \cdot 6H_2O$; stirring the solution under heat to form a gel; converting the gel to ash by applying heat to the gel; grinding the ash; calcining the ground ash to form a powder; and pressing the powder to form a pellet; and sintering the pellet to form a doped thermoelectric ceramic oxide.

In a further aspect, disclosed are methods of making a doped thermoelectric ceramic oxide comprising the steps of: doping a ceramic oxide formulation with a first metal dopant and a second metal dopant in a sol-gel process resulting in a gel; heating the gel to form an ash-based powder; compressing the ash-based powder into a pellet; and sintering the pellet to form the doped thermoelectric ceramic oxide having a grain boundary phase that comprises an oxide of the first dopant; wherein the doped thermoelectric ceramic oxide has the molecular formula $Ca_{3-x}M^2_xCo_4O_9M^1_y$, where $M^1$ represents a first dopant, as describe herein, $M^2$ represents the one or more second dopants, as described herein, x is a number having a value of from about 0.00 to about 0.10, or any range or set of intermediate values encompassed by the foregoing range, and y is a number having a value of from about 0.01 to about 0.50, or any range or set of intermediate values encompassed by the foregoing range.

In a further aspect, disclosed are methods of making a doped thermoelectric ceramic oxide comprising the steps of: doping a ceramic oxide formulation with a first metal dopant and a second metal dopant in a sol-gel process resulting in a gel; heating the gel to form an ash-based powder; compressing the ash-based powder into a pellet; and sintering the pellet to form the doped thermoelectric ceramic oxide having a grain boundary phase that comprises an oxide of the first dopant; wherein the doped thermoelectric ceramic oxide has the molecular formula $Ca_{3-x}Tb_xCo_4O_9Bi_y$, where x is a number having a value of from about 0.00 to about 0.10, or any range or set of intermediate values encompassed by the foregoing range, and y is a number having a value of from about 0.01 to about 0.50, or any range or set of intermediate values encompassed by the foregoing range.

In a further aspect, the suitable temperature in the first step is a temperature from about 290 K to about 380 K. In a still further aspect, the suitable temperature in the first step is a temperature from about 291 K to about 379 K. In a yet further aspect the suitable temperature in the first step is a temperature from about 292 K to about 378 K. In a still further aspect, the suitable temperature in the first step is a temperature from about 293 K to about 377 K. In a yet further aspect, the suitable temperature in the first step is a temperature from about 294 K to about 376 K. In a still further aspect, the suitable temperature in the first step is a temperature from about 295 K to about 375 K. In a yet further aspect, the suitable temperature in the first step is a temperature from about 296 K to about 374 K. In a still further aspect, the suitable temperature in the first step is a temperature from about 297 K to about 373 K. In a yet further aspect, the suitable temperature in the first step is a temperature from about 298 K to about 373 K. In an even further aspect, the suitable temperature in the first step is a temperature of about 290 K, about 295 K, about 300 K, about 305 K, about 310 K, about 315 K, about 320 K, about 325 K, about 330 K, about 335 K, about 340 K, about 345 K, about 350 K, about 355 K, about 360 K, about 365 K, about 370 K, about 375 K, a range encompassed by any of the foregoing values, any combination of the foregoing values, or any set of intermediate values encompassed by a range comprising the foregoing values.

In a further aspect, the suitable time in the first step is a time from about 10 min to about 24 h. In a further aspect, the suitable time in the first step is a time from about 1 h, about 2 h, about 3 h, about 4 h, about 5 h, about 6 h, about 7 h, about 8 h, about 9 h, about 10 h, about 11 h, about 12 h, about 13 h, about 14 h, about 15 h, about 16 h, about 17 h, about 18 h, about 19 h, about 20 h, about 21 h, about 22 h, about 23 h, about 24 h, a range encompassed by any of the foregoing values, any combination of the foregoing values, or any set of intermediate values encompassed by a range comprising the foregoing values.

In a further aspect, the disclosed methods of making a dope thermoelectric ceramic oxide comprises as a second step ashing of the gel formed in the first step carried out at a suitable temperature. In a still further aspect, ashing of the gel formed in the first step is carried out a temperature of about 630 K to about 930 K. In a yet further aspect, ashing of the gel forme in the first step is carried out a temperature of about 630 K, about 640 K, about 650 K, about 660 K, about 670 K, about 680 K, about 690 K, about 700 K, about 710 K, about 720 K, about 730 K, about 740 K, about 750 K, about 760 K, about 770 K, about 780 K, about 790 K, about 800 K, about 810 K, about 820 K, about 830 K, about 840 K, about 850 K, about 860 K, about 870 K, about 880 K, about 890 K, about 900 K, about 910 K, about 920 K, about 930 K, a range encompassed by any of the foregoing values, any combination of the foregoing values, or any set of intermediate values encompassed by a range comprising the foregoing values.

In a further aspect, the disclosed methods of making a doped thermoelectric ceramic oxide comprises as a third step grinding the ashed material formed in the second step, thereby forming a ground material, and then calcining the ground material for an suitable period of time at a suitable temperature, thereby forming a precursor powder. In a still further aspect, grinding can be carried out by a suitable apparatus, such as a ball mill. In a yet further aspect, the calcining can be carried out in a suitable apparatus, such as a furnace or tube furnace.

In a further aspect, the suitable temperature for calcining is about 873 K to about 1350 K, a range encompassed by any of the foregoing values, any combination of the foregoing values, or any set of intermediate values encompassed by a range comprising the foregoing values.

In a further aspect, the suitable period of time for calcining is a time from about 10 min to about 24 h. In a further aspect, the suitable time in the third step is a time from about 1 h, about 2 h, about 3 h, about 4 h, about 5 h, about 6 h, about 7 h, about 8 h, about 9 h, about 10 h, about 11 h, about 12 h, about 13 h, about 14 h, about 15 h, about 16 h, about 17 h, about 18 h, about 19 h, about 20 h, about 21 h, about 22 h, about 23 h, about 24 h, a range encompassed by any of the foregoing values, any combination of the foregoing values, or any set of intermediate values encompassed by a range comprising the foregoing values.

In a further aspect, the disclosed methods of making a doped thermoelectric ceramic oxide comprises as a fourth step pressing of the powder from the third step into a pellet at a suitable temperature for a suitable period of time under a suitable pressure. In a still further aspect, the disclosed methods of making a high performance, thermoelectric ceramic oxide comprises as a fourth step pressing of the powder from the third step into a pellet at a temperature of about 298 K to about 373 K for a period of about 1 min to about 30 min at pressure of about 0.1 GPa to about 2 GPa.

In a further aspect, the suitable pressure used in the fourth step is about 0.1 GPa, about 0.2 GPa, about 0.3 GPa, about 0.4 GPa, about 0.5 GPa, about 0.6 GPa, about 0.7 GPa, about 0.8 GPa, about 0.9 GPa, about 1.0 GPa, 1.1 GPa, about 1.2 GPa, about 1.3 GPa, about 1.4 GPa, about 1.5 GPa, about 1.6

GPa, about 1.7 GPa, about 1.8 GPa, about 1.9 GPa, about 2.0 GPa, a range encompassed by any of the foregoing values, any combination of the foregoing values, or any set of intermediate values encompassed by a range comprising the foregoing values.

In a further aspect, the suitable period of time in the fourth step is about 1 min, about 5 min, about 10 min, about 15 min, about 20 min, about 25 min, about 30 min, a range encompassed by any of the foregoing values, any combination of the foregoing values, or any set of intermediate values encompassed by a range comprising the foregoing values.

In a further aspect, the suitable temperature in the fourth step is a temperature from about 290 K to about 380 K. In a still further aspect, the suitable temperature in the fourth step is a temperature from about 291 K to about 379 K. In a yet further aspect the suitable temperature in the fourth step is a temperature from about 292 K to about 378 K. In a still further aspect, the suitable temperature in the fourth step is a temperature from about 293 K to about 377 K. In a yet further aspect, the suitable temperature in the fourth step is a temperature from about 294 K to about 376 K. In a still further aspect, the suitable temperature in the fourth step is a temperature from about 295 K to about 375 K. In a yet further aspect, the suitable temperature in the fourth step is a temperature from about 296 K to about 374 K. In a still further aspect, the suitable temperature in the fourth step is a temperature from about 297 K to about 373 K. In a yet further aspect, the suitable temperature in the fourth step is a temperature from about 298 K to about 373 K. In an even further aspect, the suitable temperature in the fourth step is a temperature of about 290 K, about 295 K, about 300 K, about 305 K, about 310 K, about 315 K, about 320 K, about 325 K, about 330 K, about 335 K, about 340 K, about 345 K, about 350 K, about 355 K, about 360 K, about 365 K, about 370 K, about 375 K, a range encompassed by any of the foregoing values, any combination of the foregoing values, or any set of intermediate values encompassed by a range comprising the foregoing values.

In a further aspect, the disclosed methods of making a doped thermoelectric ceramic oxide comprises as a fifth step sintering of the pellets from the fourth step in a suitable heating apparatus in the presence of oxygen at a suitable temperature for a suitable period of time. In a still further aspect, the suitable heating apparatus can be a furnace, such as a tube furnace. In a yet further aspect, in the presence of oxygen can be a gas mixture enriched in oxygen or a standard, ambient air mixture. In some aspects, the suitable period of time for the fifth step is about 10 min to about 120 h, any value or set of intermediate values encompassed by the foregoing values, or any sub-range within the foregoing values. In alternative aspects, the suitable period of time for sintering can be several days to several weeks. In a yet further aspect, the suitable temperature for sintering can be about 1123 K to about 1630 K, any value or set of intermediate values encompassed by the foregoing values, or any sub-range within the foregoing values.

E. METHODS OF USING DISCLOSED THERMOELECTRIC CERAMIC OXIDE COMPOSITIONS AND DEVICES/SYSTEMS COMPRISING SAME

In various aspects, the present disclosure relates to methods of using the disclosed thermoelectric ceramic oxide compositions in various systems and products in which heat, including both waste heat, intentionally generated heat, or uncaptured heat, in a system is converted to electricity using a solid-state conversion device comprising a disclosed thermoelectric ceramic oxide composition. The disclosed solid-state conversion device can further comprise components such as, but not limited to DC-DC inverters, DC regulators, rechargeable batteries, and the like.

In a further aspect, the present disclosure pertains to a method of generating an electrical current, the method comprising a solid-state conversion systems and devices comprising a disclosed thermoelectric ceramic oxide composition.

In various aspects, disclosed herein are solid-state conversion systems and devices comprising a disclosed thermoelectric ceramic oxide composition. In further various aspects, disclosed herein are solid-state conversion systems and devices comprising a disclosed thermoelectric ceramic oxide composition made by a disclosed method of making the disclosed thermoelectric ceramic oxide compositions.

In a further aspect, disclosed herein are a devices and systems comprising a solid-state energy conversion device comprising one or more disclosed thermoelectric ceramic oxide composition to provide electricity from heat generated in the product or system. Exemplary, but non-limiting examples include a system comprising a solid-state energy conversion device comprising one or more disclosed thermoelectric ceramic oxide composition that utilizes the heat radiation from a steel forming process; a system comprising a solid-state energy conversion device comprising one or more disclosed thermoelectric ceramic oxide composition that utilizes waste heat recovery in an automobile, such as recovery of energy from an exhaust system; a system comprising a solid-state energy conversion device comprising one or more disclosed thermoelectric ceramic oxide composition that utilizes heat radiation from a diesel marine engine; a system comprising a solid-state energy conversion device comprising one or more disclosed thermoelectric ceramic oxide composition that utilizes heat generated in a hypersonic vehicle; a system comprising a solid-state energy conversion device comprising one or more disclosed thermoelectric ceramic oxide composition that utilizes heat energy from a power generation system, e.g., a nuclear power system, wherein the electricity generated is provided to power a sensor, wherein the sensor comprises a wireless transmitter device to transmit data from the sensor; a system comprising a solid-state energy conversion device comprising one or more disclosed thermoelectric ceramic oxide composition that utilizes heat generated in an unmanned aerial vehicle (UAV), wherein the electricity provided by the solid-state conversion device allows for extended range and capabilities of the UAV; a system comprising a solid-state energy conversion device comprising one or more disclosed thermoelectric ceramic oxide composition that utilizes heat generated by solid oxide eletrolysis cells (SOEC), solid oxide fuel cell (SOFC), including, but not limited, to SOFCs as known to the skilled artisan, such as a molten carbonate fuel cell; and a system comprising a solid-state energy conversion device comprising one or more disclosed thermoelectric ceramic oxide composition that utilizes heat from a stationary diesel plant, solid-fuel stove, gas residential biomass boiler, and the like.

F. REFERENCES

References are cited herein throughout using the format of reference number(s) enclosed by parentheses corresponding to one or more of the following numbered references. For example, citation of references numbers 1 and 2 immediately herein below would be indicated in the present disclosure as (Refs. 1 and 2). These references are incorporated by reference in their entirety.

Ref 1. He, J.; Tritt, T. M., Advances in thermoelectric materials research: Looking back and moving forward. Science 2017, 357, (6358), eaak9997.

Ref 2. Snyder, G. J.; Toberer, E. S. Complex thermoelectric materials. In Materials For Sustainable Energy: A Collection of Peer-Reviewed Research and Review Articles from Nature Publishing Group; World Scientific: 2011; pp 101-110.

Ref 3. D. M. Rowe (ed.) Thermoelectrics Handbook: Macro to Nano (CRC, Boca Raton, 2005).

Ref 4. Borup, K. A.; De Boor, J.; Wang, H.; Drymiotis, F.; Gascoin, F.; Shi, X.; Chen, L.; Fedorov, M. I.; Müller, E.; Iversen, B. B. Measuring thermoelectric transport properties of materials. Energ Environ Sci 2015, 8 (2), 423-435.

Ref 5. Yan, J.; Gorai, P.; Ortiz, B.; Miller, S.; Barnett, S. A.; Mason, T.; Stevanović, V.; Toberer, E. S. Material descriptors for predicting thermoelectric performance. Energ Environ Sci 2015, 8 (3), 983-994.

Ref 6. Alberi, K.; Nardelli, M. B.; Zakutayev, A.; Mitas, L.; Curtarolo, S.; Jain, A.; Fornari, M.; Marzari, N.; Takeuchi, I.; Green, M. L. The 2019 materials by design roadmap. Journal of Physics D: Applied Physics 2018, 52 (1), 013001.

Ref 7. Xie, A. eidenkaff, X. Tang, Q. Zhang, J. Poon, and T. Tritt, ". Recent Advances in Nanostructured Thermoelectric Half-Heusler Compounds," Nanomaterials 2012, 2 (4), 379-412.

Ref 8. Poudel, B.; Hao, Q.; Ma, Y.; Lan, Y.; Minnich, A.; Yu, B.; Yan, X.; Wang, D.; Muto, A.; Vashaee, D. High-thermoelectric performance of nanostructured bismuth antimony telluride bulk alloys. Science 2008, 320 (5876), 634-638.

Ref 9. Dresselhaus, M. S.; Chen, G.; Tang, M. Y.; Yang, R.; Lee, H.; Wang, D.; Ren, Z.; Fleurial, J. P.; Gogna, P., New directions for low-dimensional thermoelectric materials. Advanced materials 2007, 19, (8), 1043-1053.

Ref 10. Shuai, J.; Mao, J.; Song, S.; Zhang, Q.; Chen, G.; Ren, Z., Recent progress and future challenges on thermoelectric Zintl materials. Materials Today Physics 2017, 1, 74-95.

Ref 11. Terasaki, I.; Sasago, Y.; Uchinokura, K., Large thermoelectric power in $NaCo_2O_4$ single crystals. Physical Review B. 1997; 56 (20), 12685-12687.

Ref 12. Li, S.; Funahashi, R.; Matsubara, I.; Ueno, K.; Sodeoka, S.; Yamada, H. Synthesis and Thermoelectric Properties of the New Oxide Materials $Ca_{3-x}Bi_xCo_4O_{9+\delta}$ (0.0<x<0.75). Chem. Mat. 2000, 12 (8), 2424-2427.

Ref 13. Shikano M, Funahashi R. Electrical and thermal properties of single-crystalline $(Ca_2CoO_3)(0.7)CoO_2$ with a $Ca_3Co_4O_9$ structure. Appl Phys Lett. 2003; 82(12): 1851-3.

Ref 14. D. J. Singh, Quantum critical behavior and possible triplet superconductivity in electron-doped $CoO_2$ sheets. Phys. Rev. B 68 (2003) 020503(R).

Ref 15. Shizuya, M.; Isobe, M.; Baba, Y.; Nagai, T.; Osada, M.; Kosuda, K.; Takenouchi, S.; Matsui, Y.; Takayama-Muromachi, E., New misfit-layered cobalt oxide (CaOH)(1.14)$CoO_2$. Journal of Solid State Chemistry 2007, 180, (1), 249-259.

Ref 16. Isobe, M.; Shizuya, M.; Takayama-Muromachi, E., Crystal structure and physical properties of a misfit-layered cobaltite (CaOH)(1.14)$CoO_2$. Journal of Magnetism and Magnetic Materials 2007, 310, (2), E269-E271.

Ref 17. Miyazaki, Y.; Onoda, M.; Oku, T.; Kikuchi, M.; Ishii, Y.; Ono, Y.; Morii, Y.; Kajitani, T., Modulated structure of the thermoelectric compound $Ca_2CoO_3$ (0.62) $CoO_2$. Journal of the Physical Society of Japan 2002, 71, (2), 491-497.

Ref 18. De Vaulx, C.; Julien, M. H.; Berthier, C.; Hebert, S.; Pralong, V.; Maignan, A., Electronic correlations in $CoO_2$, the parent compound of triangular cobaltates. Physical Review Letters 2007, 98, (24), 246402.

Ref 19. Matsubara, I.; Funahashi, R.; Shikano, M.; Sasaki, K.; Enomoto, H., Cation substituted $(Ca_2CoO_3)(x)CoO_2$ films and their thermoelectric properties. Applied Physics Letters 2002, 80, (25), 4729-4731.

Ref 20. Xu, G. J.; Funahashi, R.; Shikano, M.; Pu, Q. R.; Liu, B., High temperature transport properties of $Ca_{3-x}Na_xCo_4O_9$ system. Solid State Communications 2002, 124, (3), 73-76.

Ref 21. Koumoto, K.; Funahashi, R.; Guilmeau, E.; Miyazaki, Y.; Weidenkaff, A.; Wang, Y. F.; Wan, C. L., Thermoelectric Ceramics for Energy Harvesting. Journal of the American Ceramic Society 2013, 96, (1), 1-23.

Ref 22. Hu, Y. F.; Si, W. D.; Sutter, E.; Li, Q., In situ growth of c-axis-oriented $Ca_3Co_4O_9$ thin films on Si(100). Applied Physics Letters 2005, 86, (8), 082103.

Ref 23. Pravarthana D, Lebedev O, Hebert S, Chateigner D, Salvador P, Prellier W. High-throughput synthesis of thermoelectric $Ca_3Co_4O_9$ films. Appl Phys Lett. 2013; 103(14):143123.

Ref 24. Mikami, M.; Chong, K.; Miyazaki, Y.; Kajitani, T.; Inoue, T.; Sodeoka, S.; Funahashi, R. Bi-substitution effects on crystal structure and thermoelectric properties of $Ca_3Co_4O_9$ single crystals. Jpn. J. Appl. Phys. Part 1—Regul. Pap. Brief Commun. Rev. Pap. 2006, 45 (5A), 4131-4136

Ref 25. Mikami, M.; Ando, N.; Guilmeau, E.; Funahashi, R. Effect of Bi substitution on microstructure and thermoelectric properties of polycrystalline $Ca_2CoO_3$ (p)$CodO_2$. Jpn. J. Appl. Phys. Part 1—Regul. Pap. Brief Commun. Rev. Pap. 2006, 45 (5A), 4152-4158

Ref 26. Feng, Y., Jiang, X., Ghafari, E., Kucukgok, B., Zhang, C., Ferguson, I., & Lu, N. (2018). Metal oxides for thermoelectric power generation and beyond. Advanced Composites and Hybrid Materials, 1(1), 114-126.

Ref 27. Fergus, J. W. (2012). Oxide materials for high temperature thermoelectric energy conversion. Journal of the European Ceramic Society, 32(3), 525-540. doi:DOI 10.1016/j.jeurceramsoc.2011.10.007

Ref 28. M. Mikami, R. Funahashi, M. Yoshimura, Y. Mori, and T. Sasaki, High-temperature thermoelectric properties of single-crystal $Ca_3Co_2O_6$, Journal of Applied Physics, 2003, 94(10) 6579-6582.

Ref 29. Yang G, Ramasse Q, Klie R. Direct measurement of charge transfer in thermoelectric $Ca_3Co_4O_9$. Phys Rev B. 2008; 78(15):153109.

Ref 30. Romo-De-La-Cruz, C., Liang, L., Navia, S. A. P., Chen, Y., Prucz, J., & Song, X. (2018). Role of oversized dopant potassium on the nanostructure and thermoelectric performance of calcium cobaltite ceramics. Sustainable Energy & Fuels, 2, 876-881. doi:10.1039/C7SE00612H Ref 31. Carvillo, P., Chen, Y., Boyle, C., Barnes, P. N., & Song, X. (2015). Thermoelectric Performance Enhancement of Calcium Cobaltite through Barium Grain Boundary Segregation. Inorganic Chemistry, 54(18), 9027-9032. doi:10.1021/acs.inorgchem.5b01296

Ref 32. Boyle, C., Liang, L., Chen, Y., Prucz, J., Cakmak, E., Watkins, T. R., . . . Song, X. (2017). Competing dopants grain boundary segregation and resultant seebeck coefficient and power factor enhancement of thermoelectric calcium cobaltite ceramics. Ceramics International, 43(14), 11523-11528.

Ref 33. Rajeevan, N.; Kumar, R.; Shukla, D.; Thakur, P.; Brookes, N.; Chae, K.; Choi, W.; Gautam, S.; Arora, S.; Shvets, I. Bi-substitution-induced magnetic moment distribution in spinel $BixCo_2-xMnO_4$ multiferroic. Journal of Physics: Condensed Matter 2009, 21 (40), 406006.

Ref 34. Tschope, A.; Kilassonia, S.; Zapp, B.; Birringer, R. Grain-size-dependent thermopower of polycrystalline cerium oxide. Solid State Ion. 2002, 149 (3-4), 261-273.

Ref 35. Kim, S. I.; Lee, K. H.; Mun, H. A.; Kim, H. S.; Hwang, S. W.; Roh, J. W.; Yang, D. J.; Shin, W. H.; Li, X. S.; Lee, Y. H., Dense dislocation arrays embedded in grain boundaries for high-performance bulk thermoelectrics. Science 2015, 348, (6230), 109-114.

Ref 36. Zide, J. M. O.; Vashaee, D.; Bian, Z. X.; Zeng, G.; Bowers, J. E.;, Shakouri, A.;, et al. Demonstration of electron filtering to increase the Seebeck coefficient in $In_{0.53}Ga_{0.47}As/In_{0.53}Ga_{0.28}Al_{0.19}As$ superlattices. Physical Review B. 2006; 74(20):205335.

Ref 37. Kim H S, Liu W, Chen G, Chu C-W, Ren Z. Relationship between thermoelectric figure of merit and energy conversion efficiency. Proceedings of the National Academy of Sciences. 2015; 112(27):8205-10.

Ref 38. Kanatzidis, M. G. Nanostructured Thermoelectrics: The New Paradigm? Chem. Mat. 2010, 22 (3), 648-659

Ref 39. Chen, S., Song, X., Chen, X., Chen, Y., Barbero, E. J., Thomas, E. L., & Barnes, P. N. (2012). Effect of precursor calcination temperature on the microstructure and thermoelectric properties of $Ca_3Co_4O_9$ ceramics. Journal of Sol-Gel Science and Technology, 64(3), 627-636. doi:10.1007/s10971-012-2894-4

Ref 40. Song, X., McIntyre, D., Chen, X., Barbero, E. J., & Chen, Y. (2015). Phase evolution and thermoelectric performance of calcium cobaltite upon high temperature aging. Ceramics International, 41(9), 11069-11074. doi: 10.1016/j.ceramint.2015.05.052

Ref 41. Boyle, C., Liang, L., Romo-De-La-Cruz, C.-O., Johnson, R., Chen, Y., Prucz, J., . . . Song, X. (2018). Improving the thermoelectric performance and thermal stability of Ca 3 Co 4 O 9+δ ceramics by sintering in oxygen atmosphere. Journal of Sol-Gel Science and Technology, 85(3), 712-722.

Ref 42. C M. Bhandari in CRC Handbook of Thermoelectrics (ed. D. M. Rowe) 55-65 (CRC, Boca Raton, 1995)

Ref 43. Joshi, G.; Lee, H.; Lan, Y.; Wang, X.; Zhu, G.; Wang, D.; Gould, R. W.; Cuff, D. C.; Tang, M. Y.; Dresselhaus, M. S. Enhanced thermoelectric figure-of-merit in nanostructured p-type silicon germanium bulk alloys. Nano letters 2008, 8 (12), 4670-4674.

Ref 44. LeBlanc, S.; Yee, S. K.; Scullin, M. L.; Dames, C.; Goodson, K. E. Material and manufacturing cost considerations for thermoelectrics. Renewable and Sustainable Energy Reviews 2014, 32, 313-327.

Ref 45. Li S, Funahashi R, Matsubara I, Ueno K, Sodeoka S, Yamada H. Synthesis and Thermoelectric Properties of the New Oxide Materials $Ca_{3-x}Bi_xCo_4O_{9+\delta}$ (0.0<x<0.75). Chemistry of Materials. 2000; 12(8):2424-7.

Ref 46 Xu G, Funahashi R, Shikano M, Matsubara I, Zhou Y. Thermoelectric properties of the Bi- and Na-substituted $Ca_3Co_4O_9$ system. Applied Physics Letters. 2002; 80(20): 3760-2.

Ref 47. Shikano M, Funahashi R. Electrical and thermal properties of single-crystalline $(Ca_2CoO_3)_{0.7}CoO_2$ with a $Ca_3Co_4O_9$ structure. Applied Physics Letters. 2003; 82(12):1851-3.

Ref 48. Wang D, Chen L, Wang Q, Li J. Fabrication and thermoelectric properties of $Ca_{3-x}Dy_xCo_4O_{9+\delta}$ system. Journal of Alloys and Compounds. 2004; 376(1):58-61.

Ref 49. Wang D, Chen L, Yao Q, Li J. High-temperature thermoelectric properties of $Ca_3Co_4O_{9+\delta}$ with Eu substitution. Solid State Communications. 2004; 129(9):615-8.

Ref 50. Mikami M, Ando N, Funahashi R. The effect of Ag addition on electrical properties of the thermoelectric compound $Ca_3Co_4O_9$. Journal of Solid State Chemistry. 2005; 178(7):2186-90.

Ref 51. Mikami M, Chong K, Miyazaki Y, Kajitani T, Inoue T, Sodeoka S, et al. Bi-Substitution Effects on Crystal Structure and Thermoelectric Properties of $Ca_3Co_4O_9$ Single Crystals. Japanese Journal of Applied Physics. 2006; 45(5A):4131-6.

Ref 52. Liu H Q, Zhao X B, Liu F, Song Y, Sun Q, Zhu T J, et al. Effect of Gd-doping on thermoelectric properties of $Ca_3Co_4O_{9+\delta}$ ceramics. Journal of Materials Science. 2008; 43(21):6933-7.

Ref 53. Wang Y, *Sui* Y, Cheng J, Wang X, Miao J, Liu Z, et al. High temperature transport and thermoelectric properties of Ag-substituted $Ca_3Co_4O_{9+\delta}$ system. Journal of Alloys and Compounds. 2008; 448(1):1-5.

Ref 54. Liu H Q, Song Y, Zhang S N, Zhao X B, Wang F P. Thermoelectric properties of $Ca_{3-x}Y_xCo_4O_{9+\delta}$ ceramics. Journal of Physics and Chemistry of Solids. 2009; 70(3): 600-3.

Ref 55. Wang Y, *Sui* Y, Cheng J, Wang X, Su W. Comparison of the high temperature thermoelectric properties for Ag-doped and Ag-added $Ca_3Co_4O_9$. Journal of Alloys and Compounds. 2009; 477(1):817-21.

Ref 56. Nong N V, Liu C J, Ohtaki M. Improvement on the high temperature thermoelectric performance of Ga-doped misfit-layered $Ca_3Co_{4-x}Ga_xO_{9+\delta}$ (x=0, 0.05, 0.1, and 0.2). Journal of Alloys and Compounds. 2010; 491(1):53-6.

Ref 57. Wang Y, *Sui* Y, Wang X, Su W, Liu X. Enhanced high temperature thermoelectric characteristics of transition metals doped $Ca_3Co_4O_{9+\delta}$ by cold high-pressure fabrication. Journal of Applied Physics. 2010; 107(3):033708.

Ref 58. Xu L, Li F, Wang Y. High-temperature transport and thermoelectric properties of $Ca_3Co_{4-x}Ti_xO_9$. Journal of Alloys and Compounds. 2010; 501(1):115-9.

Ref 59. Nong N V, Liu C-J, Ohtaki M. High-temperature thermoelectric properties of late rare earth-doped $Ca_3Co_4O_{9+\delta}$. Journal of Alloys and Compounds. 2011; 509(3):977-81.

Ref 60. Pei J, Chen G, Zhou N, Lu D Q, Xiao F. High temperature transport and thermoelectric properties of $Ca_{3-x}Er_xCo_4O_{9+\delta}$. Physica B: Condensed Matter. 2011; 406(3):571-4.

Ref 61. Van Nong N, Pryds N, Linderoth S, Ohtaki M. Enhancement of the Thermoelectric Performance of p-Type Layered Oxide $Ca_3Co_4O_{9+\delta}$ Through Heavy Doping and Metallic Nanoinclusions. Advanced Materials. 2011; 23(21):2484-90.

Ref 62. Zhang F P, Zhang X, Lu Q M, Zhang J X, Liu Y Q, Zhang G Z. Preparation and high temperature thermoelectric properties of $Ca_{3-x}Ag_xCo_4O_{9+\delta}$ oxides. Solid State Ionics. 2011; 201(1):1-5.

Ref 63. Zhang F P, Zhang X, Lu Q M, Zhang J X, Liu Y Q, Zhang G Z. Effects of Pr doping on thermoelectric transport properties of $Ca_{3-x}Pr_xCo_4O_9$. Solid State Sciences. 2011; 13(7):1443-7.

Ref 64. Butt S, Liu Y-C, Lan J-L, Shehzad K, Zhan B, Lin Y, et al. High-temperature thermoelectric properties of La and Fe co-doped Ca—Co—O misfit-layered cobaltites consolidated by spark plasma sintering. Journal of Alloys and Compounds. 2014; 588:277-83.

Ref 65. Butt S, Xu W, He W Q, Tan Q, Ren G K, Lin Y, et al. Enhancement of thermoelectric performance in Cd-doped $Ca_3Co_4O_9$ via spin entropy, defect chemistry and phonon scattering. Journal of Materials Chemistry A. 2014; 2(45):19479-87.

Ref 66. Prasoetsopha N, Pinitsoontorn S, Kamwanna T, Amornkitbamrung V, Kurosaki K, Ohishi Y, et al. The effect of Cr substitution on the structure and properties of misfit-layered $Ca_3Co_{4-x}Cr_xO_{9+\delta}$ thermoelectric oxides. Journal of Alloys and Compounds. 2014; 588:199-205.

Ref 67. Tian R, Zhang T, Chu D, Donelson R, Tao L, Li S. Enhancement of high temperature thermoelectric performance in Bi, Fe co-doped layered oxide-based material $Ca_3Co_4O_{9+\delta}$. Journal of Alloys and Compounds. 2014; 615:311-5.

Ref 68. Carvillo P, Chen Y, Boyle C, Barnes P N, Song X. Thermoelectric Performance Enhancement of Calcium Cobaltite through Barium Grain Boundary Segregation. Inorganic Chemistry. 2015; 54(18):9027-32.

Ref 69. Gunes M, Ozenbas M. Effect of grain size and porosity on phonon scattering enhancement of $Ca_3Co_4O_9$. Journal of Alloys and Compounds. 2015; 626:360-7.

Ref 70. Boyle C, Carvillo P, Chen Y, Barbero E J, McIntyre D, Song X. Grain boundary segregation and thermoelectric performance enhancement of bismuth doped calcium cobaltite. Journal of the European Ceramic Society. 2016; 36(3):601-7.

Ref 71. Huang C S, Zhang F P, Zhang X, Lu Q M, Zhang J X, Liu Z Y. Enhanced thermoelectric figure of merit through electrical and thermal transport modulation by dual-doping and texture modulating for $Ca_3Co_4O_{9+\delta}$ oxide materials. Journal of Alloys and Compounds. 2016; 687:87-94.

Ref 72. Preseenik M, de Boor J, Bernik S. Synthesis of single-phase $Ca_3Co_4O_9$ ceramics and their processing for a microstructure-enhanced thermoelectric performance. Ceramics International. 2016; 42(6):7315-27.

Ref 73. Sotelo A, Costa F M, Ferreira N M, Kovalevsky A, Ferro M C, Amaral V S, et al. Tailoring $Ca_3Co_4O_9$ microstructure and performances using a transient liquid phase sintering additive. Journal of the European Ceramic Society. 2016; 36(4):1025-32.

Ref 74. Bittner M, Helmich L, Nietschke F, Geppert B, Oeckler O, Feldhoff A. Porous $Ca_3Co_4O_9$ with enhanced thermoelectric properties derived from Sol—Gel synthesis. Journal of the European Ceramic Society. 2017; 37(13):3909-15.

Ref 75. Boyle C, Liang L, Chen Y, Prucz J, Cakmak E, Watkins T R, et al. Competing dopants grain boundary segregation and resultant seebeck coefficient and power factor enhancement of thermoelectric calcium cobaltite ceramics. Ceramics International. 2017; 43(14): 11523-8.

Ref 76. Porokhin S, Shvanskaya L, Khovaylo V, Vasiliev A. Effect of NaF doping on the thermoelectric properties of $Ca_3Co_4O_9$ Journal of Alloys and Compounds. 2017; 695: 2844-9.

Ref 77. Saini S, Yaddanapudi H S, Tian K, Yin Y, Magginetti D, Tiwari A. Terbium Ion Doping in $Ca_3Co_4O_9$: A Step towards High-Performance Thermoelectric Materials. Scientific Reports. 2017; 7:44621.

Ref 78. Boyle C, Liang L, Romo-De-La-Cruz C-O, Johnson R, Chen Y, Prucz J, et al. Improving the thermoelectric performance and thermal stability of $Ca_3Co_4O_{9+\delta}$ ceramics by sintering in oxygen atmosphere. Journal of Sol-Gel Science and Technology. 2018; 85(3):712-22.

Ref 79. Hira U, Han L, Norrman K, Christensen D V, Pryds N, Sher F. High-temperature thermoelectric properties of Na- and W-Doped $Ca_3Co_4O_9$ system. RSC Advances. 2018; 8(22):12211-21.

Ref 80. Romo-De-La-Cruz C, Liang L, Navia S A P, Chen Y, Prucz J, Song X. Role of oversized dopant potassium on the nanostructure and thermoelectric performance of calcium cobaltite ceramics. Sustainable Energy & Fuels. 2018; 2(4):876-81.

Ref 81. Bittner M, Kanas N, Hinterding R, Steinbach F, Groeneveld D, Wemhoff P, et al. Triple-phase ceramic 2D nanocomposite with enhanced thermoelectric properties. Journal of the European Ceramic Society. 2019; 39(4): 1237-44.

Ref 82. Bittner M, Kanas N, Hinterding R, Steinbach F, Rath& J, Schrade M, et al. A comprehensive study on improved power materials for high-temperature thermoelectric generators. Journal of Power Sources. 2019; 410-411:143-51.

Ref 83. Torres M A, Costa F M, Flahaut D, Touati K, Rasekh S, Ferreira N M, et al. Significant enhancement of the thermoelectric performance in $Ca_3Co_4O_9$ thermoelectric materials through combined strontium substitution and hot-pressing process. Journal of the European Ceramic Society. 2019; 39(4):1186-92.

Ref 84. DiSalvo, F. J. Thermoelectric cooling and power generation. Science 1999, 285 (5428), 703-706.

Ref 85. Bell, L. E. Cooling, heating, generating power, and recovering waste heat with thermoelectric systems. Science 2008, 321 (5895), 1457-1461.

Ref 86. Tritt, T. M., Thermoelectric Phenomena, Materials, and Applications. Annual Review of Materials Research, 2011, 41, 433-448.

Ref 87. Taylor P J, Maddux J R, Wilson A. Evaluation of Thermoelectric Devices by the Slope-Efficiency Method. US Army Research Laboratory Adelphi United States; 2016.

Ref 88. Zebarjadi M., Esfarjani K., Dresselhaus M. Ren Z., Chen G. Perspectives on thermoelectrics: from fundamentals to device applications. Energ Environ Sci. 2012; 5(1):5147-62.

G. ASPECTS

The following listing of exemplary aspects supports and is supported by the present disclosure provided herein.

Aspect 1. A doped thermoelectric ceramic oxide having the following formula: $Ca_{3-x}M^2_xCo_4O_9M^1_y$; wherein x is a number having a value from about 0.00 to about 3; wherein y is a number having a value from about 0.01 to about 0.50; wherein $M^1$ is a first metal dopant comprises a metal selected from group 1 metals, group 2 metals, transtition metals, post-transitional metals, group 14 metals, group 15 metals, group 16 metals, and rare earth elements; and wherein $M^2$ is a second metal dopant comprising at least one rare earth element.

Aspect 2. The doped thermoelectric ceramic oxide of 1, wherein x is a number having a value from about 0.01 to about 3.

Aspect 3. The doped thermoelectric ceramic oxide of 1, wherein x is a number having a value from about 0.00 to about 0.3.

Aspect 4. The doped thermoelectric ceramic oxide of 1, wherein x is a number having a value from about 0.01 to about 0.3.

Aspect 5. The doped thermoelectric ceramic oxide of 1, wherein x is a number having a value from about 0.00 to about 0.1.

Aspect 6. The doped thermoelectric ceramic oxide of 1, wherein x is a number having a value from about 0.01 to about 0.1.

Aspect 7. The doped thermoelectric ceramic oxide of any one of 1-Aspect 6, wherein the first metal dopant comprises a metal selected from group 14 metals, group 15 metals, group 16 metals, and rare earth elements.

Aspect 8. The doped thermoelectric ceramic oxide of any one of 1-Aspect 6, wherein the first metal dopant comprises a metal selected from group 1 metals, group 2 metals, transition metals, and post-transtition metals.

Aspect 9. The doped thermoelectric ceramic oxide of any one of 1-Aspect 6, wherein the first metal dopant comprises a metal selected from K, Bi, Ce, Nb, Yb, Lu, and Ba.

Aspect 10. The doped thermoelectric ceramic oxide of Aspect 9, wherein the first metal dopant comprises a metal selected from Bi and K.

Aspect 11. The doped thermoelectric ceramic oxide of Aspect 10, wherein the first metal dopant comprises Bi.

Aspect 12. The doped thermoelectric ceramic oxide of Aspect 10, wherein the first metal dopant comprises K.

Aspect 13. The doped thermoelectric ceramic oxide of any one of 1-Aspect 12, wherein the second metal dopant comprises a metal selected from La, Ce, Tb, Pr, Nd, Pm, Sm, Eu, Gd, Dy, Ho, Er, Tm Yb, Lu, and combinations thereof.

Aspect 14. The doped thermoelectric ceramic oxide of Aspect 13, wherein the second metal dopant comprises a metal selected from Tb, Pr, and combinations thereof.

Aspect 15. The doped thermoelectric ceramic oxide of Aspect 14, wherein the second metal dopant comprises Tb.

Aspect 16. The doped thermoelectric ceramic oxide of Aspect 14, wherein the second metal dopant comprises Pr.

Aspect 17. The doped thermoelectric ceramic oxide of any one of 1-Aspect 16, wherein the first metal dopant comprises a metal selected from Bi, Ba, and K; and wherein the second metal dopant comprises a metal selected from Tb, Pr, and combinations thereof.

Aspect 18. The doped thermoelectric ceramic oxide of Aspect 17, wherein the first metal dopant comprises Bi; and wherein the second metal dopant comprises a metal selected from Tb, Pr, and combinations thereof.

Aspect 19. The doped thermoelectric ceramic oxide of Aspect 18, wherein the first metal dopant comprises Bi; and wherein the second metal dopant comprises Tb.

Aspect 20. The doped thermoelectric ceramic oxide of Aspect 18, wherein the first metal dopant comprises Bi; and wherein the second metal dopant comprises Pr.

Aspect 21. The doped thermoelectric ceramic oxide of Aspect 17, wherein the first metal dopant comprises Ba; and wherein the second metal dopant comprises a metal selected from Tb, Pr, and combinations thereof.

Aspect 22. The doped thermoelectric ceramic oxide of Aspect 21, wherein the first metal dopant comprises Ba; and wherein the second metal dopant comprises Tb.

Aspect 23. The doped thermoelectric ceramic oxide of Aspect 21, wherein the first metal dopant comprises Ba; and wherein the second metal dopant comprises Pr.

Aspect 24. The doped thermoelectric ceramic oxide of Aspect 17, wherein the first metal dopant comprises K; and wherein the second metal dopant comprises a metal selected from Tb, Pr, and combinations thereof.

Aspect 25. The doped thermoelectric ceramic oxide of Aspect 24, wherein the first metal dopant comprises K; and wherein the second metal dopant comprises Tb.

Aspect 26. The doped thermoelectric ceramic oxide of Aspect 24, wherein the first metal dopant comprises K; and wherein the second metal dopant comprises Pr.

Aspect 27. The doped thermoelectric ceramic oxide of any one of 1-Aspect 26, further comprising a plurality of grains comprising intragranular structures, wherein the first metal dopant dopant, the first metal dopant dopant, or both are present in the intragranular structures.

Aspect 28. The doped thermoelectric ceramic oxide of any one of 1-Aspect 27, further comprising a plurality of grain boundaries disposed between adjacent grains, wherein the first metal dopant is present in the grain boundaries.

Aspect 29. A method of making a doped thermoelectric ceramic oxide comprising: doping a ceramic oxide formulation with a first metal dopant, $M^1$, in a sol-gel process resulting in a gel; heating the gel to form an ash; grinding the ash into an ash-based powder; compressing the ash-based powder into a pellet; and sintering the pellet to form the doped thermoelectric ceramic oxide.

Aspect 30. The method of Aspect 29, first metal dopant comprises a metal selected from group 1 metals, group 2 metals, group 2 metals, transtition metals, group 14 metals, group 15 metals, group 16 metals, and rare earth elements.

Aspect 31. The method of Aspect 30, wherein the first metal dopant comprises a metal selected from group 14 metals, group 15 metals, group 16 metals, and rare earth elements.

Aspect 32. The method of Aspect 30, wherein the first metal dopant comprises a metal selected from group 1 metals, group 2 metals, transition metals, and post-transtition metals.

Aspect 33. The method of Aspect 30, wherein the first metal dopant comprises a metal selected from K, Bi, Ce, Nb, Yb, Lu, and Ba.

Aspect 34. The method of Aspect 33, wherein the first metal dopant comprises a metal selected from Bi and K.

Aspect 35. The method of Aspect 34, wherein the first metal dopant comprises Bi.

Aspect 36. The method of Aspect 34, wherein the first metal dopant comprises K.

Aspect 37. The method of any one of Aspect 29-Aspect 36, wherein the doped thermoelectric ceramic oxide has the molecular formula $Ca_3Co_4O_{9+\delta}M^1{}_y$, where $M^1$ is a metal selected from K, Bi, Ce, Nb, Yb, Lu, and Ba, where y is a number having a value from about 0.01 to about 0.50.

Aspect 38. The method of any one of Aspect 29-Aspect 37, further comprising doping the ceramic oxide formulation with a second metal dopant, $M^2$, in the sol-gel process.

Aspect 39. The method of Aspect 38, wherein the second metal dopant comprises at least one rare earth element.

Aspect 40. The method of Aspect 39, wherein the second metal dopant comprises a metal selected from La, Ce, Tb, Pr, Nd, Pm, Sm, Eu, Gd, Dy, Ho, Er, Tm Yb, Lu, and combinations thereof.

Aspect 41. The method of Aspect 40, wherein the second metal dopant comprises a metal selected from Tb, Pr, and combinations thereof.

Aspect 42. The method of Aspect 41, wherein the second metal dopant comprises Tb.

Aspect 43. The method of Aspect 41, wherein the second metal dopant comprises Pr.

Aspect 44. The method of Aspect 39, wherein the first metal dopant comprises Bi; and wherein the second metal dopant comprises a metal selected from Tb, Pr, and combinations thereof.

Aspect 45. The method of Aspect 44, wherein the first metal dopant comprises Bi; and wherein the second metal dopant comprises Tb.

Aspect 46. The method of Aspect 44, wherein the first metal dopant comprises Bi; and wherein the second metal dopant comprises Pr.

Aspect 47. The method of Aspect 39, wherein the first metal dopant comprises Ba; and wherein the second metal dopant comprises a metal selected from Tb, Pr, and combinations thereof.

Aspect 48. The method of Aspect 47, wherein the first metal dopant comprises Ba; and wherein the second metal dopant comprises Tb.

Aspect 49. The method of Aspect 47, wherein the first metal dopant comprises Ba; and wherein the second metal dopant comprises Pr.

Aspect 50. The method of Aspect 39, wherein the first metal dopant comprises K; and wherein the second metal dopant comprises a metal selected from Tb, Pr, and combinations thereof.

Aspect 51. The method of Aspect 50, wherein the first metal dopant comprises K; and wherein the second metal dopant comprises Tb.

Aspect 52. The method of Aspect 50, wherein the first metal dopant comprises K; and wherein the second metal dopant comprises Pr.

Aspect 53. The method of Aspect 38, wherein the doped thermoelectric ceramic oxide has the molecular formula $Ca_{3-x}M^2{}_xCo_4O_9M^1{}_y$, where first metal dopant, $M^1$, is a metal selected from Bi, Ce, Nb, Yb, Lu, and Ba; wherein the first metal dopant dopant, $M^2$, is a metal selected from La, Ce, Pr, Nd, Pm, Sm, Eu, Gd, Tb, Dy, Ho, Er, Tm, Yb, or Lu, as described herein, x is a number having a value of from about 0.0 to about 3.0, and y is a number having a value of from about 0.01 to about 0.50.

Aspect 54. The method of Aspect 53, wherein x is a number having a value from about 0.01 to about 3.

Aspect 55. The method of Aspect 53, wherein x is a number having a value from about 0.00 to about 0.1.

Aspect 56. The method of Aspect 53, wherein x is a number having a value from about 0.01 to about 0.1.

Aspect 57. A solid-state conversion device comprising a disclosed thermoelectric ceramic oxide composition of 1.

Aspect 58. A solid-state conversion device comprising a disclosed thermoelectric ceramic oxide composition made by the method of Aspect 29.

From the foregoing, it will be seen that aspects herein are well adapted to attain all the ends and objects hereinabove set forth together with other advantages which are obvious and which are inherent to the structure.

While specific elements and steps are discussed in connection to one another, it is understood that any element and/or steps provided herein is contemplated as being combinable with any other elements and/or steps regardless of explicit provision of the same while still being within the scope provided herein.

It will be understood that certain features and subcombinations are of utility and may be employed without reference to other features and subcombinations. This is contemplated by and is within the scope of the claims.

Since many possible aspects may be made without departing from the scope thereof, it is to be understood that all matter herein set forth or shown in the accompanying drawings and detailed description is to be interpreted as illustrative and not in a limiting sense.

It is also to be understood that the terminology used herein is for the purpose of describing particular aspects only, and is not intended to be limiting. The skilled artisan will recognize many variants and adaptations of the aspects described herein. These variants and adaptations are intended to be included in the teachings of this disclosure and to be encompassed by the claims herein.

Now having described the aspects of the present disclosure, in general, the following Examples describe some additional aspects of the present disclosure. While aspects of the present disclosure are described in connection with the following examples and the corresponding text and figures, there is no intent to limit aspects of the present disclosure to this description. On the contrary, the intent is to cover all alternatives, modifications, and equivalents included within the spirit and scope of the present disclosure.

H. EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the present disclosure and are not intended to limit the scope of what the inventors regard as their disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

1. Preparation of Doped Thermoelectric Ceramic Oxide Compositions

The present work applied conventional cold pressing and sintering to make the oxide pellets using the powders synthesized through the chemical sol-gel route, to precisely control the stoichiometry and dopants distribution with strict uniformity. The polycrystalline ceramic samples were prepared by the conventional chemical sol-gel route with a chemical composition $Ca_{3-x}Tb_xCo_4O_9$ (x=0, 0.05, 0.30, and 0.50) and $Ca_{2.95}Tb_{0.05}Co_4O_9Bi_y$ (y=0.10, 0.15, 0.20, 0.25, and 0.30). The precursor powders were obtained mixing chemical reagents: $Ca(NO_3)_2 \cdot 4H_2O$ (99%, Acros Organics), $Co(NO_3)_2 \cdot 6H_2O$ (99%, Acros Organics), $Bi(NO_3)_3 \cdot 5H_2O$ (98%, Acros Organics), and $Tb(NO_3)_3 \cdot 6H_2O$ (99.9% Strem Chemicals) in deionized water according to the stoichiometric chemical compositions. The citric acid (BDH Chemical), ethylene glycol, and polyethylene glycol were dissolved in the solution to polymerize the mixture. Nitric acid was included in the solution to promote the sol-gel synthesis, nitrate salts decomposition, and the new compound formation. The sol-gel mixture was mechanically stirred at 353 K for 3 h. The obtained sol-gel mixture was ashed at 773 K for 2 hr in the air inside a box furnace. The subsequent ashes were ball-milled in ethyl alcohol in a stage with zirconia balls and then dried at room temperature with a final manually ground stage after that to obtain uniform grain size in the powder. The reasonable homogeneous ashes were calcined at 973 K for 4 h in a tube furnace with constant oxygen flow. The calcined powders were uniaxially pressed into round pellets under a 1 Gpa pressure at room temperature. The bulk samples were sintered at 1233 K in a tube furnace with constant oxygen flow and then cut into rectangular pellets to obtain the final desired sample for either the electrical or thermal measurements. The apparent densities for all bulk samples are listed in Table 1.

The electrical resistivity (ρ) and absolute Seebeck coefficient (S) were measured at the same time by the four-terminal method using a Linseis LSR-1100 unit. The measurements were performed perpendicular to the pressed direction from 323 k to 1073 K under a low pressure He environment. The thermal conductivity was calculated using the equation $$\kappa = \lambda C_p \mu m$$

where $C_p$, $\lambda$, and m are the specific heat, thermal diffusivity, and mass density, respectively. The Cp and $\lambda$ values were obtained in the range 323 to 1073 K using a Linseis Laser Flash Analyzer 1200. The measurements were also performed perpendicular to the pressed direction and samples were analyzed under a low-pressure air environment. X-Ray powder Diffraction (XRD) analysis was performed using a PANatycal X'Pert Pro XRD unit for crystal phase and lattice parameter determination purposes. The ground powders from the sintered samples were used in the XRD analysis using Cu K-alpha radiation, 45 kV voltage and 40 mA current at room temperature. The cross-section and plan-view morphology of the sintered pellets was observed using a Hitachi-S4700F Scanning Electron Microscope (SEM) unit. Transmission electron microscopy (TEM) samples were prepared from sintered pellets by mechanically polishing and ion milling in a liquid-nitrogen-cooled holder. TEM imaging including Energy dispersive spectroscopy (EDS) and high-resolution TEM were performed in a JEM-2100 operated at 200 kV. High-angle annular dark-field (HAADF) Z-contrast imaging and nanoscale chemistry analysis were performed using an Aberration-Corrected 200 kV(JEOL 2100F) STEM with the inner cut-off angle of the HAADF detector set at >52 mrad.

2. Enhanced Electrical Power Factor and ZT of Doped Thermoelectric Ceramic Oxide Compositions The conventional chemical sol-gel method was used to synthesize the precursor powders, which were subsequently subjected to calcination followed by pelletization and sintering to formulate the bulk scale pellets, as shown in FIG. 1. Dopants were introduced at the sol-gel state to ensure the strict chemistry and stoichiometry changes in the final bulk ceramics. The heavy rare earth element of Tb is first introduced as a dopant to scatter phonons and reduce the thermal conductivity. The small amount of doping at x=0.05 in $Ca_{3-x}Tb_xCo_4O_9$ decrease the thermal conductivity to about −92% of that baseline. Meanwhile, the high oxidation state of rare earth element also alters the electrical carrier concentration, and higher doping level resulted in the increase of both the Seebeck coefficient and electrical resistivity. In, $Ca_{2.95}Tb_{0.05}Co_4O_9$, there is a subtle increase in the ZT up to 0.38 at 1073 K compared to the value of 0.35 for pristine $Ca_3Co_4O_{9+\delta}$, as shown in FIGS. 2A-2F and FIG. 8A-8F. To further increase the ZT, Bi is introduced to the Tb doped $Ca_{2.95}Tb_{0.05}Co_4O_9$. Bi is one of the first doping elements utilized to substitute Ca to introduce negative charge carriers and increase the Seebeck coefficient. (Refs 24, 25). However, our previous work shows that the Bi also segregated at grain boundaries (GBs) of polycrystalline $Ca_{3-x}Bi_xCo_4O_{9-\delta}$ sample. Such intergranular segregation apparently causes the intragranular Chemistry deviated from the designed stoichiometry. To compensate for the intragranular chemistry deviation, in the present work, the Bi is introduced by non-stoichiometry addition with designed sample nominal chemistry of $Ca_{2.95}Tb_{0.05}Co_4O_9Bi_y$. For those ceramic pellets with high density (Table 1), FIGS. 2A-2F shows a continuous decrease of the electrical resistivity, with the increase in Bi doping level up to y=0.25. At lower temperature regime, the Bi addition presents a similar S to that with unary dopant Tb. However, at the temperature higher than 800K, the samples with dual dopants all present much higher Seebeck coefficient than that with Tb doping alone. The sample with Bi y=0.3 is overdoped with a large increase in the electrical resistivity p. Due to the low p and the enhanced S, the power factor continuously increases with the Bi to y=0.25 for $Ca_{2.95}Tb_{0.05}Co_4O_9Bi_{0.25}$, as shown in FIGS. 2A-2F. Noteworthy, the power factor of $Ca_{2.95}Tb_{0.05}Co_4O_9Bi_{0.25}$ at 310 K is 1.83 $mWm^{-1}K^{-2}$ which is by far the highest power factor reported for $Ca_3Co_4O_{9+\delta}$ synthesized with different methods and incorporation with different dopants. (Refs 26, 27). At a high temperature of 1073K, the best performing $Ca_{2.95}Tb_{0.05}Co_4O_9Bi_{0.25}$ maintains an exceptional high power factor of 1.23 $mWm^{-1}K^{-2}$.

TABLE 1

Apparent density of the $Ca_{3-x}Tb_xCo_4O_9Bi_y$ samples.

| $Ca_{3-x}Tb_xCo_4O_9Bi_y$ | Average Apparent density (g/cm³) |
| --- | --- |
| x = 0 y = 0 | 3.883 |
| x = 0.05 y = 0 | 4.182 |
| x = 0.30 y = 0 | 4.477 |
| x = 0.50 y = 0 | 4.571 |
| x = 0.05 y = 0.10 | 3.911 |
| x = 0.05 y = 0.15 | 3.909 |
| x = 0.05 y = 0.20 | 3.970 |
| x = 0.05 y = 0.25 | 4.295 |
| x = 0.05 y = 0.30 | 4.701 |

The Bi addition into the Tb doped samples further impacts the thermal conductivity that depicts a complex trend upon Bi addition level. FIGS. 2A-2F shows a first a reduction of K for y=0.10, then a gradual increase of K with the increasing Bi doping level up to x=0.25, and finally a reduction of the overall K for the x=0.3 doping level. The total K is cumulative of the electronic thermal conductivity ($K_e$) and the lattice thermal conductivity ($K_l$), as depicted in FIGS. 2A-2F for different $Ca_{3-x}Tb_xCo_4O_9Bi_y$. For $Ca_3Co_4O_9$ ceramics with $K_l$ being the predominant component contribution of the thermal conductivity, there is a continuous decrease in the $K_l$ with the increasing Bi doping level up to x=0.25. Meanwhile, improvements in the electronic transport properties lead to an increase in the $K_e$ component with the addition of Bi up to y=0.25. The contribution of $K_e$ and $K_l$ thus resulted in the complex trend of total thermal conductivity upon Bi addition. Eventually, the sample of $Ca_{2.95}Tb_{0.05}Co_4O_9Bi_{0.25}$ with high power factor is also with a slightly lower thermal conductivity than that of the $Ca_{2.95}Tb_{0.05}Co_4O_9$. Remarkably, the $Ca_{2.95}Tb_{0.05}Co_4O_9Bi_{0.25}$ ceramics is with peak ZT of ~0.9 in 1073K. Largely due to the high electrical power factor at the low-temperature regime, the ZT is having a high plateau of 0.3-0.9 from 373K to 1073K as shown in FIGS. 2A-2F.

3. Single-Phase with Improved Crystal Alignment of Doped Thermoelectric Ceramic Oxide Compositions.

Figures 3A, 3B:
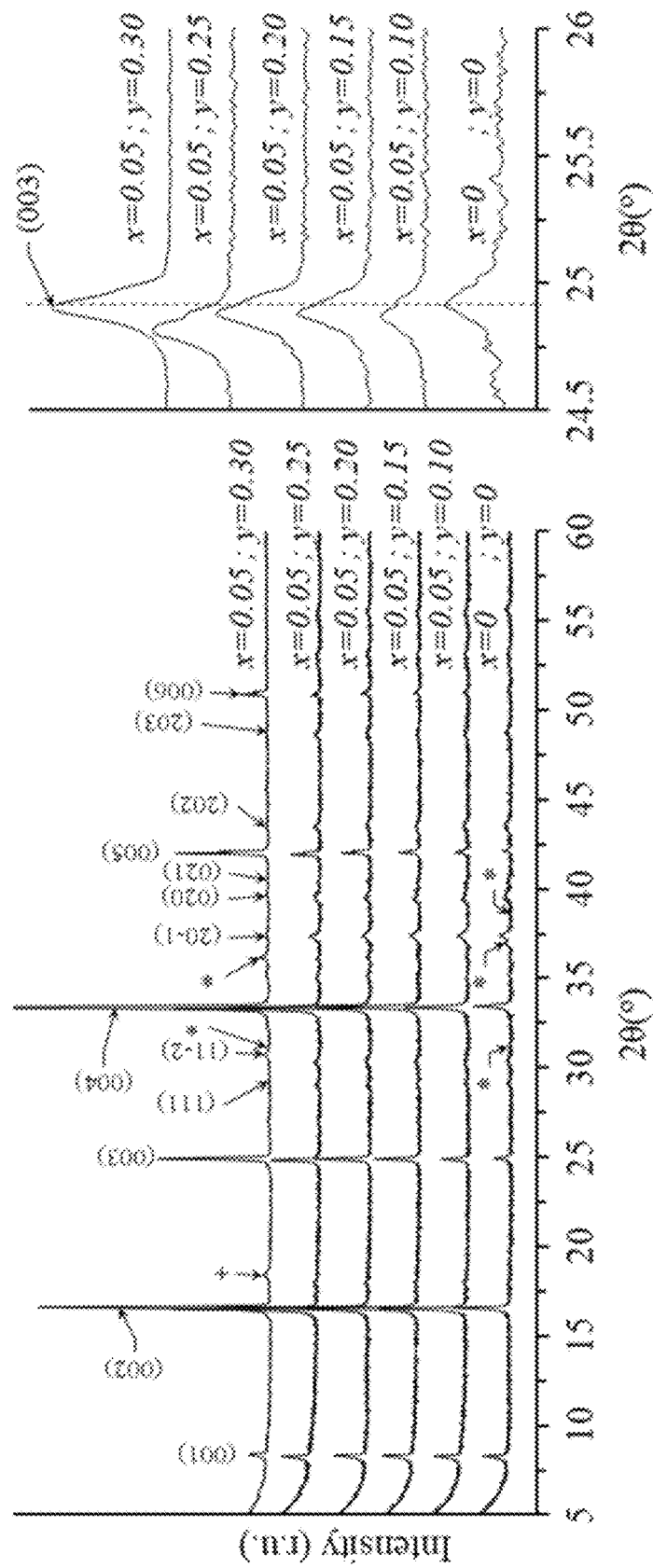
FIGS. 3A-3B representative characteristic XRD peaks from $Ca_3Co_4O_9$ phase with monoclinic symmetry were identified for $Ca_{2.95}Tb_{0.05}Co_4O_9Bi_y$ samples.
Figure 4A:
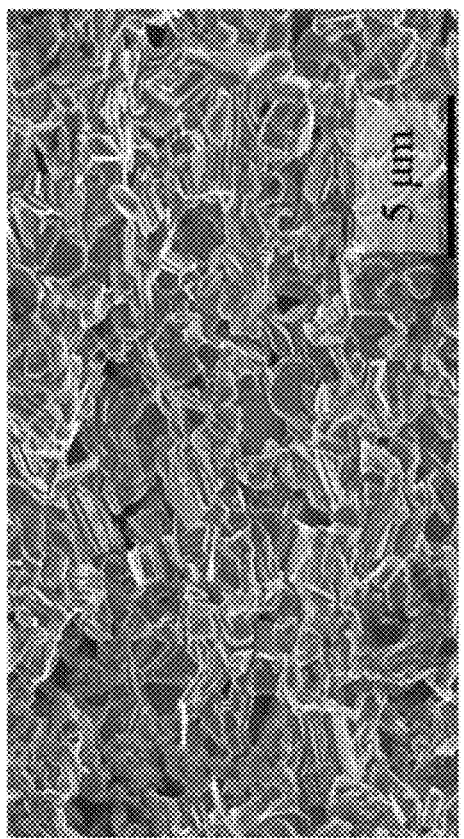
FIGS. 4A-4G show representative SEM images of $Ca_{3-x}Tb_xCo_4O_{9+\delta}Bi_y$ samples after sintering stage. Cross-sectional SEM images of $Ca_{3-x}Tb_xCo_4O_{9+\delta}Bi_y$ samples from the fractured surface are as follows.
Figure 4B:
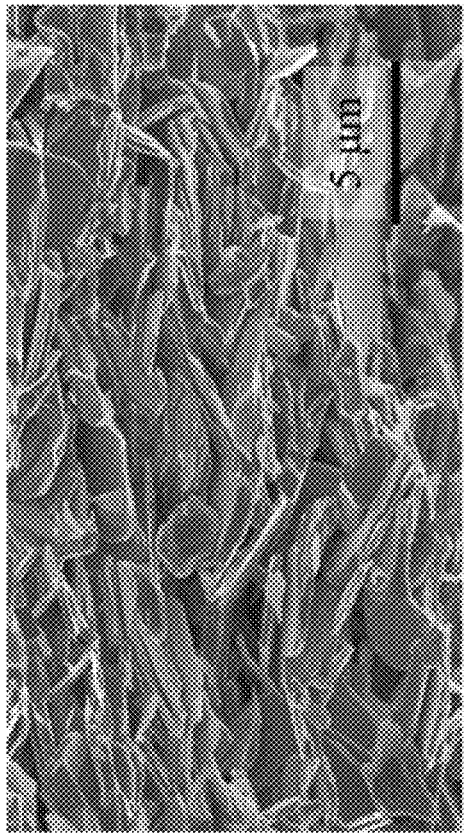
Figure 4C:
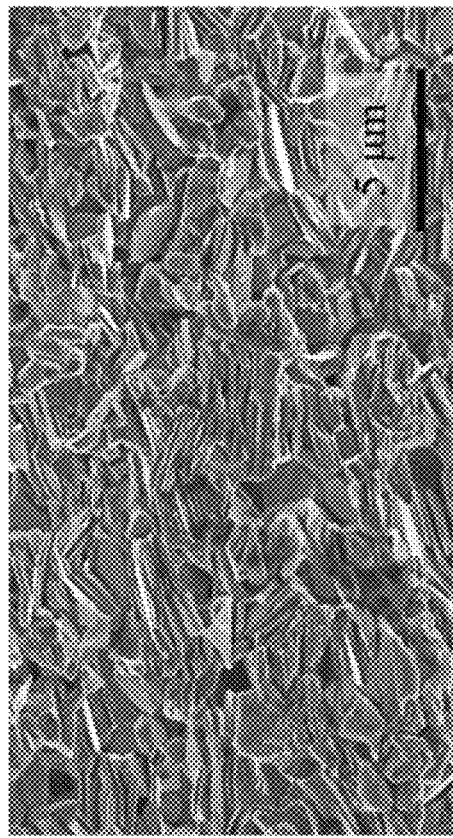
Figure 4D:
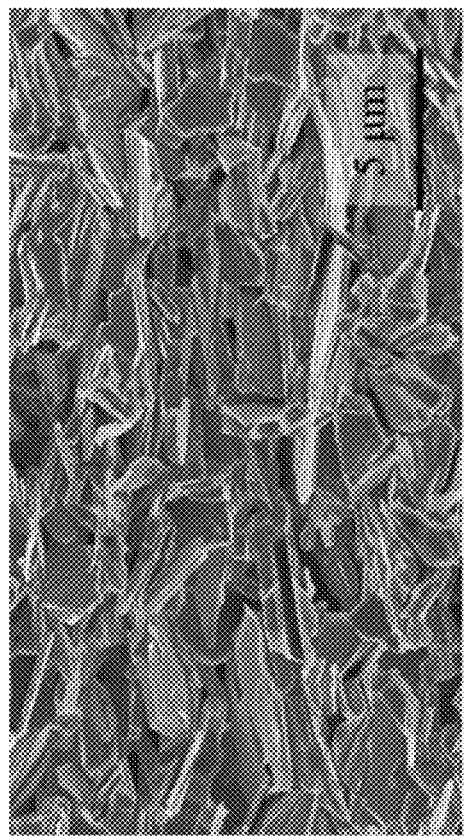
Figure 4E:
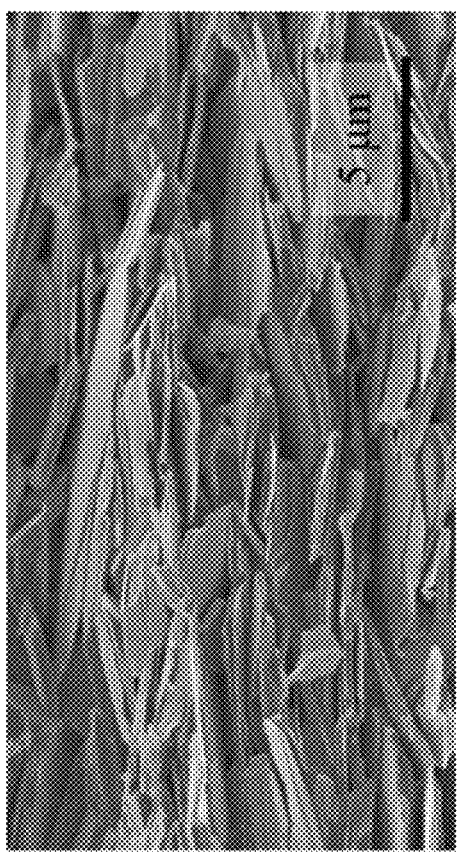
Figure 4F:
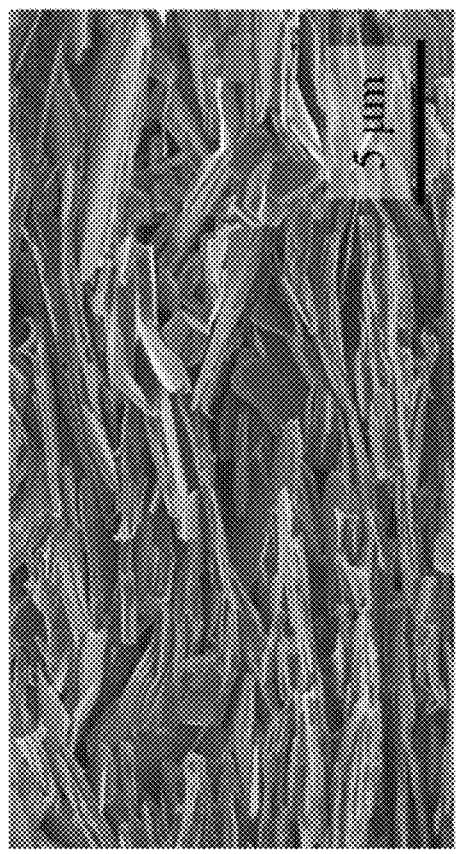
Figure 4G:
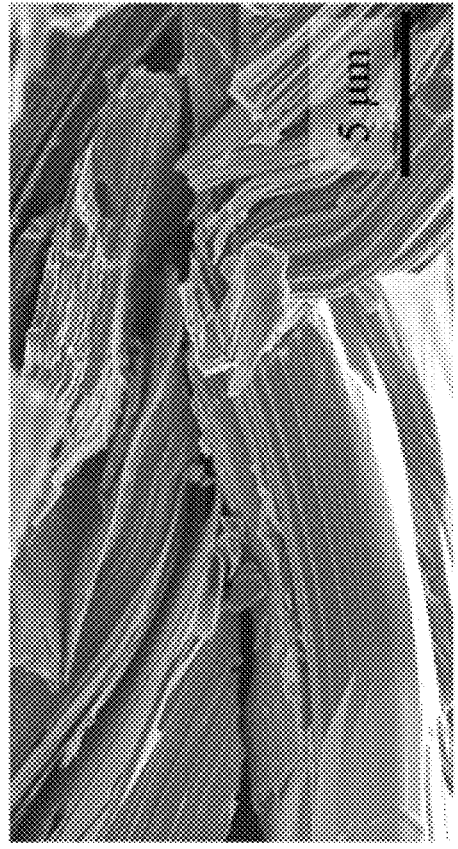

The characteristic XRD peaks from $Ca_3Co_4O_9$ phase with monoclinic symmetry were identified for $Ca_{2.95}Tb_{0.05}Co_4O_9Bi_y$ samples (FIGS. 3A-3B). Different from the baseline $Ca_3Co_4O_9$ that also presents a minor amount of $Co_3O_4$ phase, no impurity phase is observed in the samples $Ca_{2.85}Tb_{0.05}Co_4O_9Bi_y$ with the Bi concentration up to y=0.25. The overdoped $Ca_{2.85}Tb_{0.05}Co_4O_9Bi_{0.30}$ samples show a minor amount of both $Co_3O_4$ and $Ca_3Co_2O_6$ secondary phases. (Ref. 28). The calculated lattice parameters are listed in Table 2.

TABLE 2

Lattice parameters a, $b_1$, $b_2$, c, and $\beta$ for the single doped $Ca_{3-x}Tb_xCo_4O_9$ (x = 0, and 0.05) and the dual doped $Ca_{2.95}Tb_{0.05}Co_4O_9Bi_y$. (y = 0.10, 0.15, 0.20, 0.25, and 0.30) samples. $b_1$ and $b_2$ refer to b-axis lattice parameters in the rock-salt layer $Ca_2CoO_3$ and the $CoO_2$ layer, respectively.

| $Ca_{3-x}Tb_xCo_4O_9Bi_y$ | a (Å) | $b_1$ (Å) | $b_2$ (Å) | c (Å) | $\beta$ (°) |
|---|---|---|---|---|---|
| x = 0; y = 0 | 4.859 | 4.562 | 2.747 | 10.849 | 98.711 |
| x = 0.05; y = 0 | 4.858 | 4.552 | 2.749 | 10.847 | 98.697 |
| x = 0.05; y = 0.10 | 4.878 | 4.573 | 2.744 | 10.879 | 99.052 |
| x = 0.05; y = 0.15 | 4.880 | 4.571 | 2.743 | 10.876 | 98.955 |
| x = 0.05; y = 0.20 | 4.880 | 4.566 | 2.743 | 10.880 | 99.038 |
| x = 0.05; y = 0.25 | 4.915 | 4.562 | 2.738 | 10.926 | 99.725 |
| x = 0.05; y = 0.30 | 4.848 | 4.548 | 2.752 | 10.862 | 98.377 |

With the increase of Bi doping level, there is an increase in a, $b_1$, c, and $\beta$, which is accompanied by the decrease in the lattice parameter $b_2$. Bi addition also triggers major microstructure changes. For $Ca_{2.95}Tb_{0.05}Co_4O_9Bi_y$, the elongated plate-shaped grains with large anisotropy, the longer dimension parallel to the a-b plane of the crystals gradually increases with Bi addition up to y=0.25, while the dimension along the c-axes remained almost constant as shown in FIGS. 4A-4G. The crystal grain anisotropy is thus increased, implying the faster grain growth and faster diffusion along the a-b plane during the sintering. Such an increase in grain anisotropy is also accompanied by the improvement of the crystal texture. The crystals have the c-axis of the monoclinic structure more or less parallel to the pressed direction of the pellets for $Ca_{2.95}Tb_{0.05}Co_4O_9Bi_y$<0.25 samples, although the misorientation angle ~30 degrees between the neighboring grains are commonly observed. With the increase in the Bi doping level to y=0.3, there is abnormal large grain growth with random orientation.

4. Dopants Segregation at the Grain Boundary Plane of Doped Thermoelectric Ceramic Oxide Compositions.

Figure 5C:
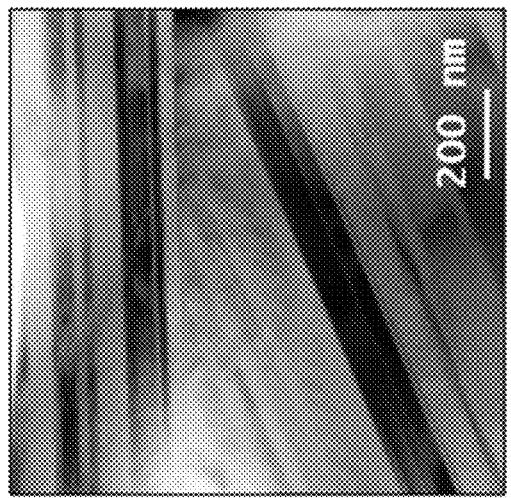
FIGS. 5A-5I show representativew TEM and STEM images showing the nanostructure of the $Ca_{3-x}Tb_xCo_4O_9Bi_y$ samples showing atomic structure of the grain boundaries is further revealed by the atomic resolution Z-contrast imaging.
Figure 5F:
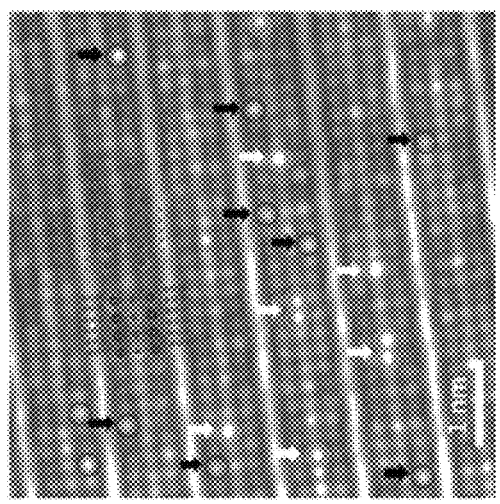
Figure 5B:
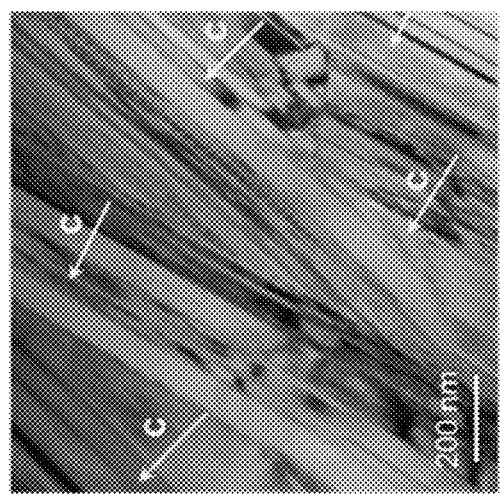
Figure 5E:
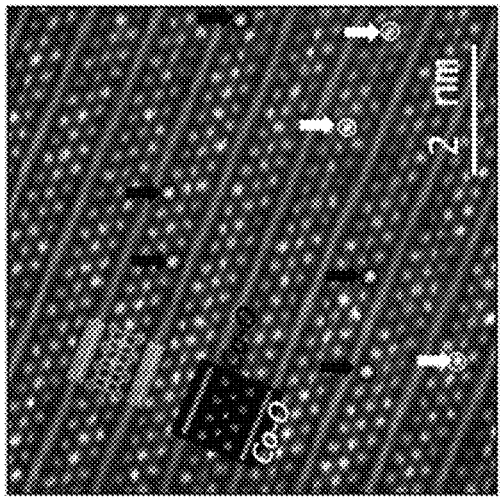
Figure 5A:
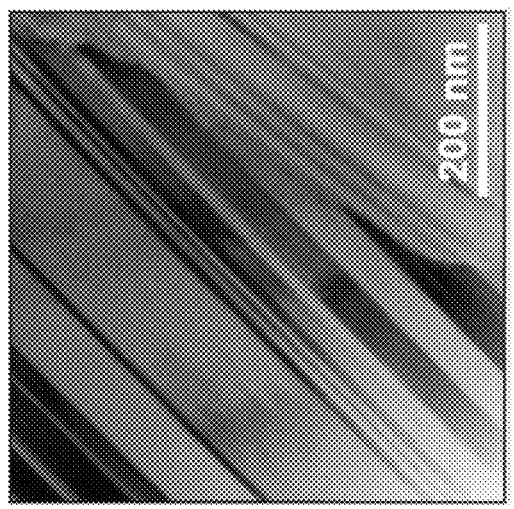
Figure 5D:
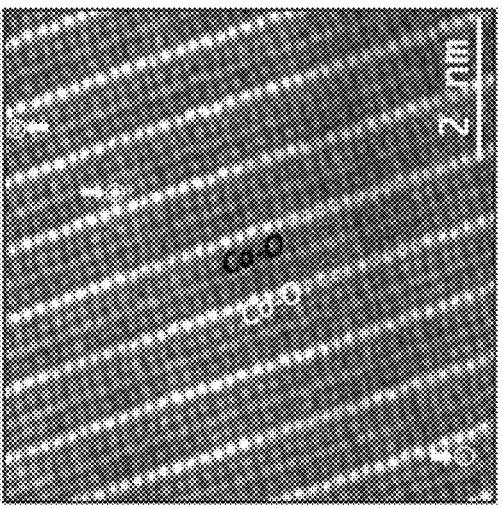
Figure 5I:
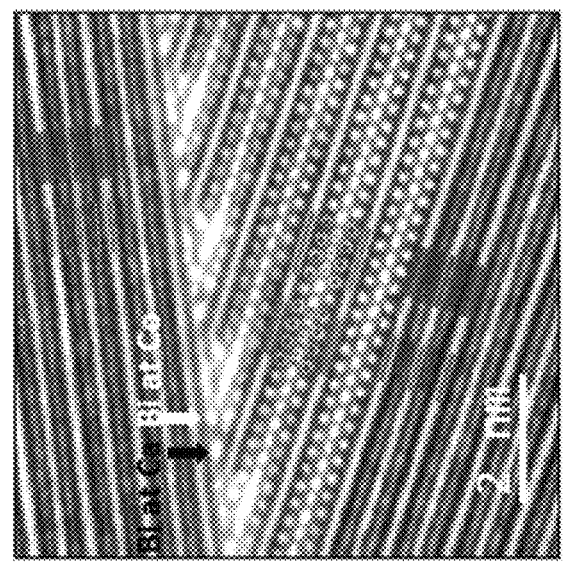
Figure 5H:
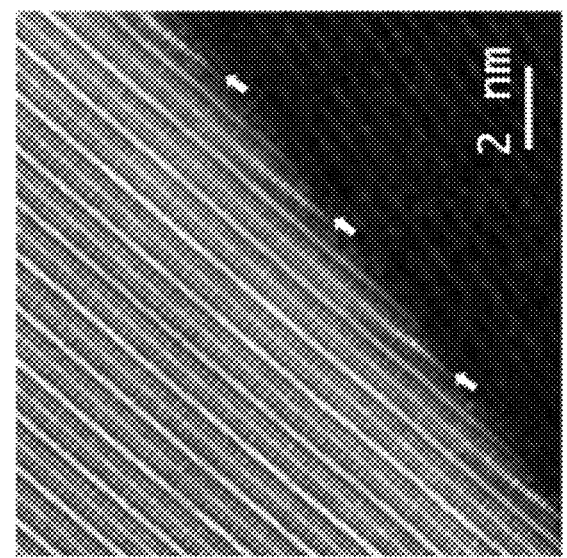
Figure 5G:
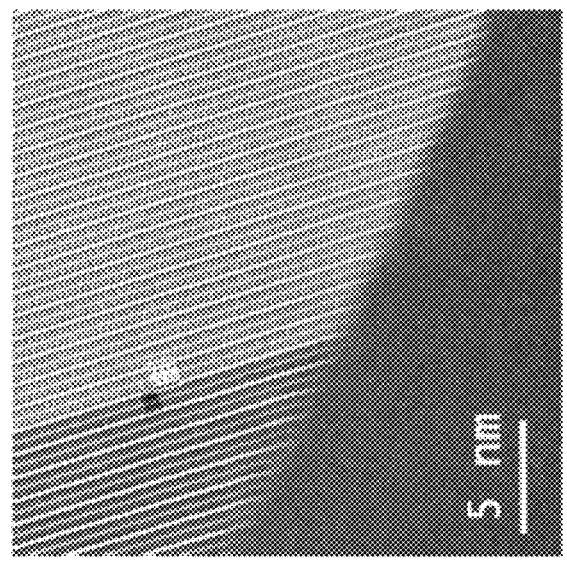

Analytical transmission electron microscopy (TEM) down to atomic level was performed on the samples with single dopant Tb (FIGS. 5A, 5D, and 5G), single dopant Bi (FIGS. 5B, 5E, and 5H), and dual dopants (FIGS. 5C, 5F, and 5I). TEM diffraction contrast images depict that each of the micron-sized crystal grains shown in the SEM images is conformed by a conglomeration of nano-lamellas having different c-axes. Due to the big atomic number difference, the occupation of Tb or Bi in the Ca or Co sites of the $Ca_3Co_4O_9$ lattice could be readily resolvable in the Z-contrast imaging. (Ref. No. 29). In the $Ca_{2.95}Tb_{0.05}Co_4O_9$ sample, the atomic columns with brighter intensity, presumably due to the Tb substitution is only observed in the CaO atom layer. This is fully consistent with the designed chemistry of Tb substitution of Ca. By contrast, in $Ca_3Co_4O_9Bi_{0.25}$, the bright intensity is present in both the CaO layer and the CoO layer, implying the Bi substitution in both the Ca and Co sites of the $Ca_3Co_4O_9$ lattice. For the $Ca_{2.95}Tb_{0.05}Co_4O_9Bi_{0.25}$ sample with dual dopants, the bright atom columns are observed in both the CaO layer and the CoO layer probably due to the Tb occupation in the Ca sites and the Bi presenting in both the Ca and Co sites. Both Tb and Bi exhibit random distribution in the $Ca_3Co_4O_9$ lattice.

For all three samples, there is no secondary phase induced by either doping element at the grain boundaries. Under TEM, EDS was recorded on the grain boundaries. and grain interior as shown in FIGS. 10A-10F. For $Ca_{2.95}Tb_{0.05}Co_4O_9$, there is a presence of Tb in both the crystal lattice and the GBs with notably Tb depletion in the GBs. In the $Ca_{2.95}Tb_{0.05}Co_4O_9Bi_{0.25}$, Bi is present at both grain interior and the grain boundaries. Nevertheless, the intragranular chemistry Bi/Ca keeps constant, while the Bi is with much higher Bi/Ca ratio at the GBs indicating the Bi segregation at the GBs, accompanied by the slight Tb depletion.

The atomic structure of the grain boundaries is further revealed by the atomic resolution Z-contrast imaging. Consistent with the TEM EDS results, the $Ca_{2.95}Tb_{0.05}Co_4O_9$ sample did not present any brighter column at the grain boundaries indicating the lack of the heavy element Tb at the grain boundaries. Interestingly, the grain boundaries of $Ca_3Co_4O_9Bi_{0.25}$ sample present the bright column exclusively and periodically on the Co sites layer within the electrically insulating rock-salt-type $Ca_2CoO_3$ misfit layers. Such brighter atom columns initiated at the GB plane and extend about 3-4 atomic spacing into the grain interior. Such brighter contrast indicating the Bi segregation at the Co sites at the grain boundaries of $Ca_3Co_4O_9Bi_{0.25}$ sample. By contrast, in the $Ca_{2.95}Tb_{0.05}Co_4O_9Bi_{0.25}$, there are brighter atomic columns extending about 3 atoms on both the Ca and Co sites of the rock-salt-type $Ca_2CoO_3$ misfit layers, indicating the intensified Bi segregation induced by dual dopants.

Figure 12B:
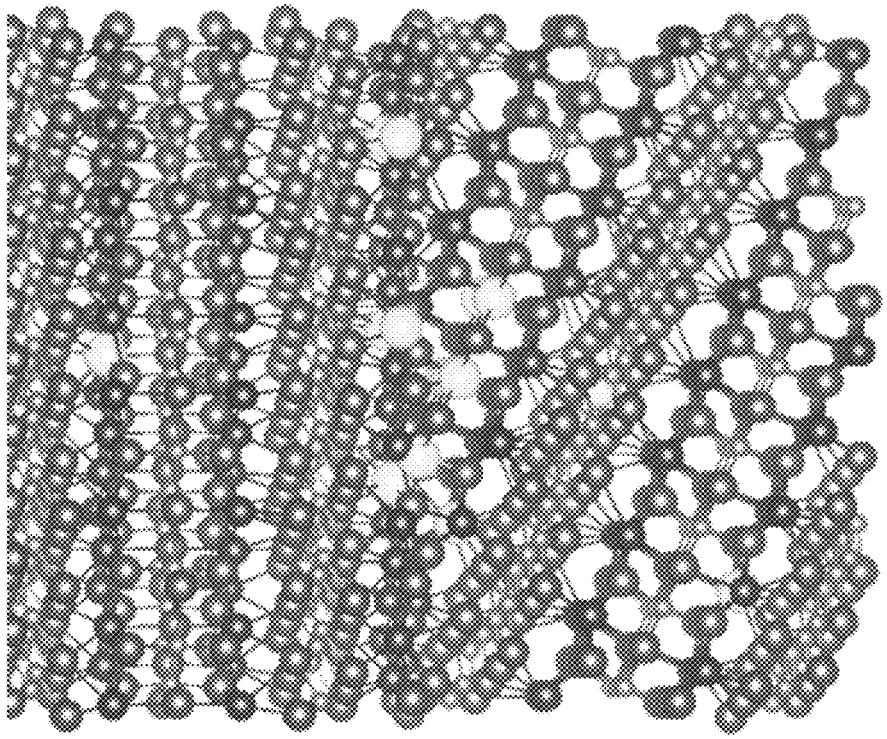
FIGS. 12A-12B show STEM images showing the nanostructure of the $Ca_{2.95}Tb_{0.05}Co_4O_9Bi_{0.25}$ for a simulation.
Figure 12A:
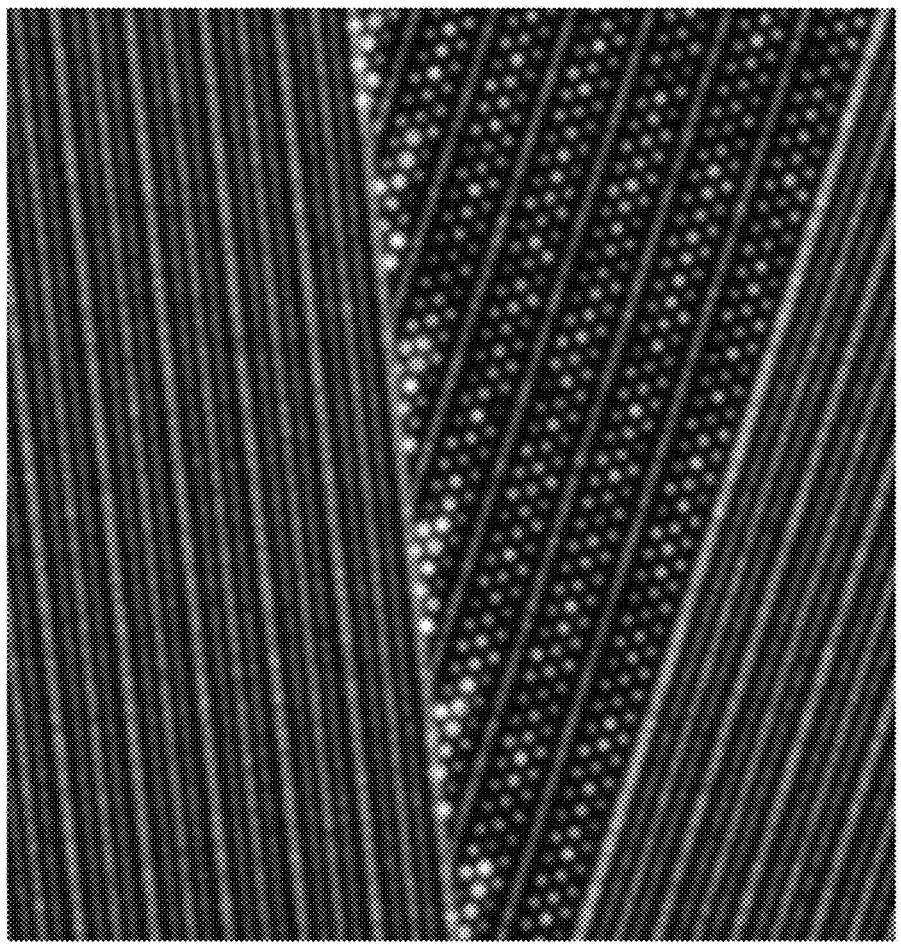

To further understand the dopants concentration, the simulation was performed. As shown in FIGS. 12A-12B. For the atoms columns with the strongest intensity, the maximum substitution occupancy of Bi on the Co sites is estimated to be ~29% (5 Bi atoms in 17 possible atom sites in the simulation). Whereas, Bi occupancy is estimated to a lower ~17% (3 Bi atoms per 17 possible sites).

Figure 6C:
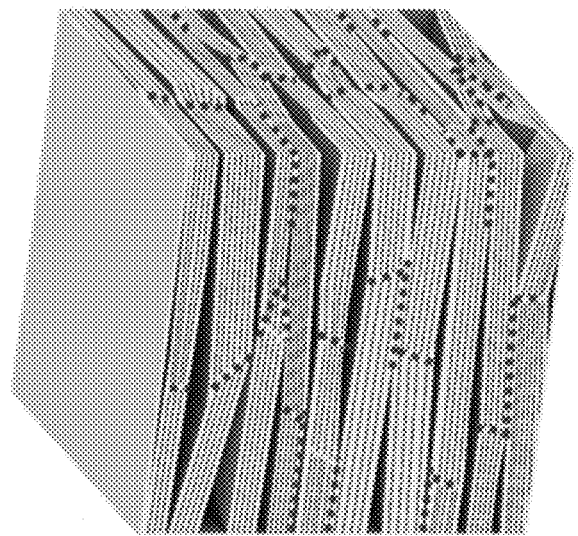
FIG. 6A-6C show schematic drawings showing the dual dopant dopants has resulted in the systematic microstructure evolution, where.
Figure 6B:
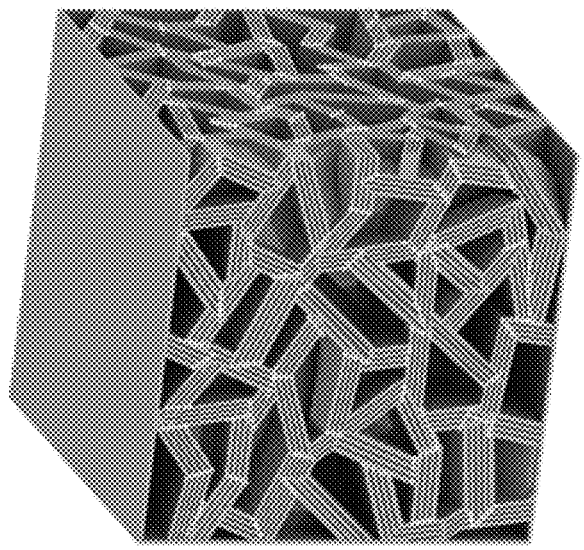
Figure 6A:
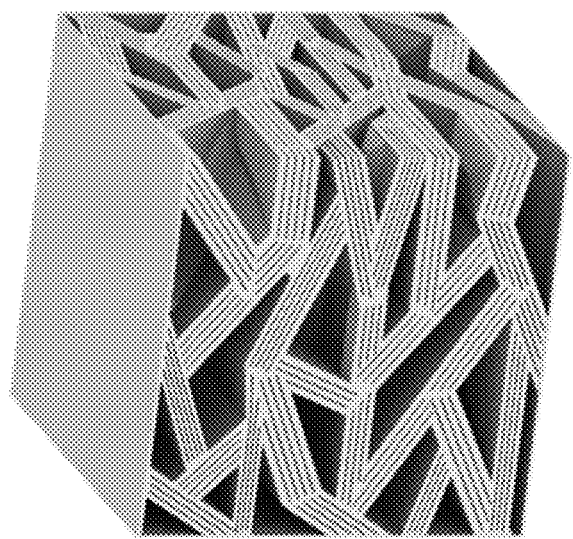
Figure 7A:
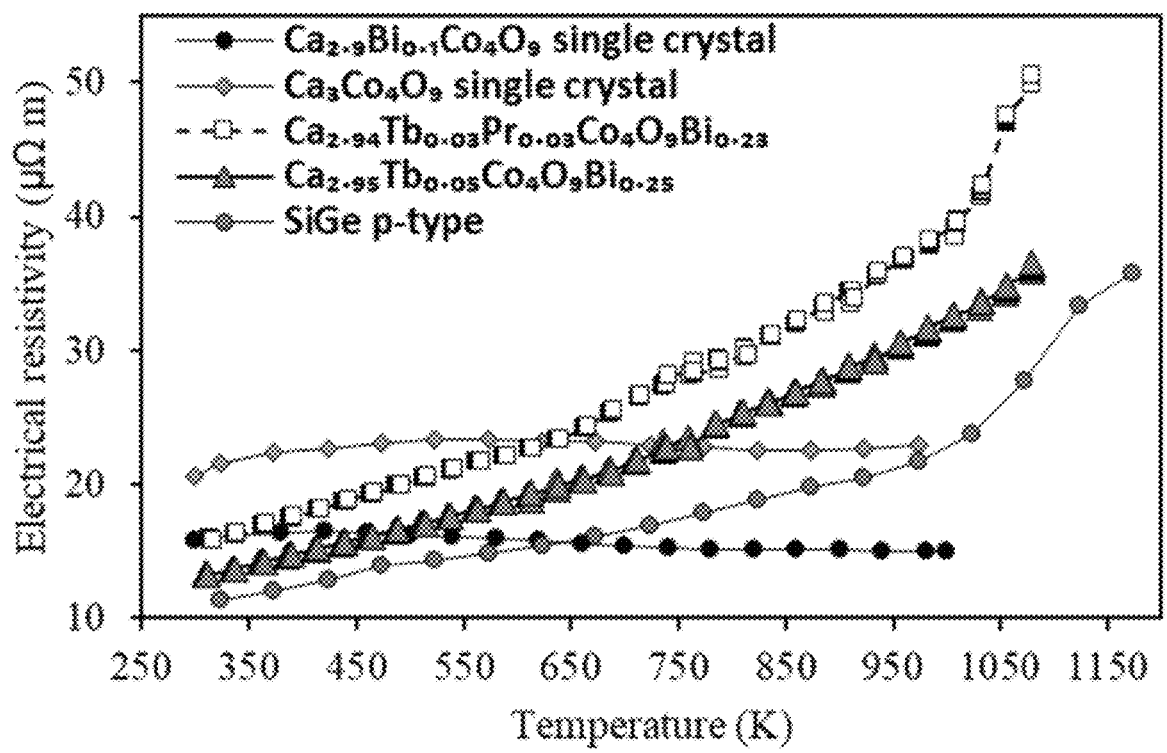
FIGS. 7A-7E show representative data illustrating temperature dependence of thermoelectric properties for different state-of-the-art p-type materials, including.
Figure 7B:
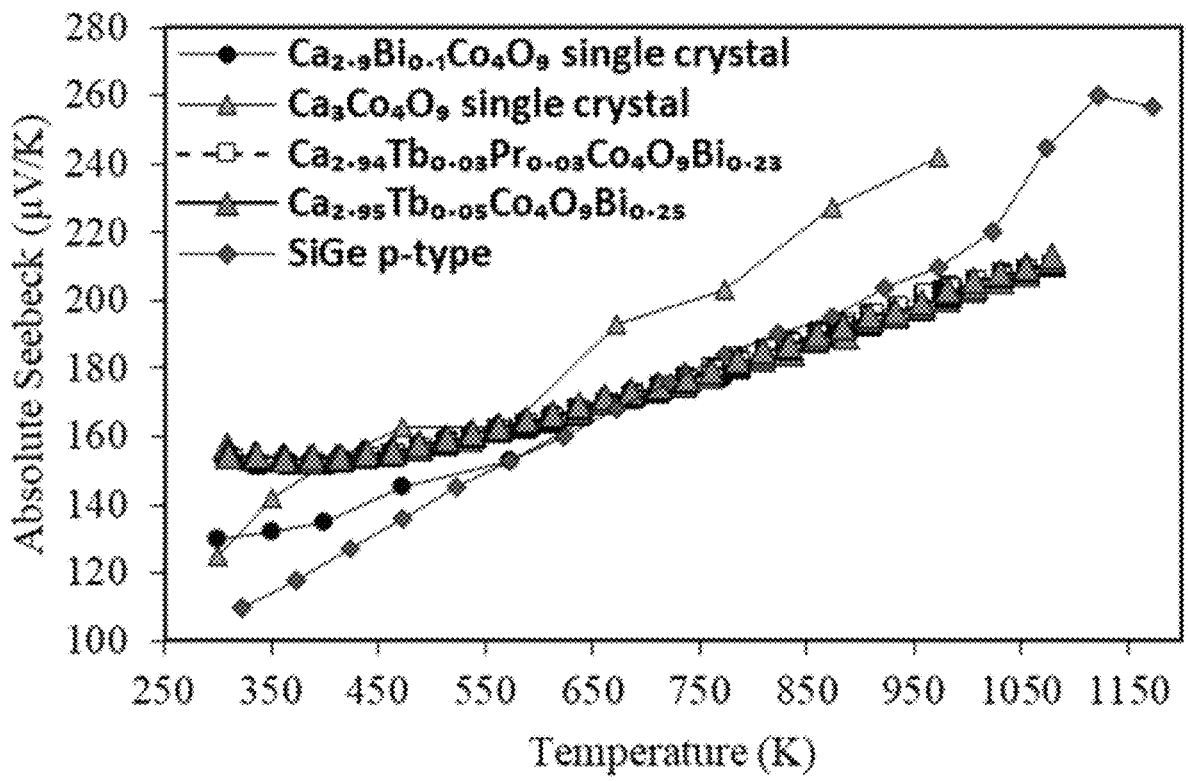
Figure 7C:
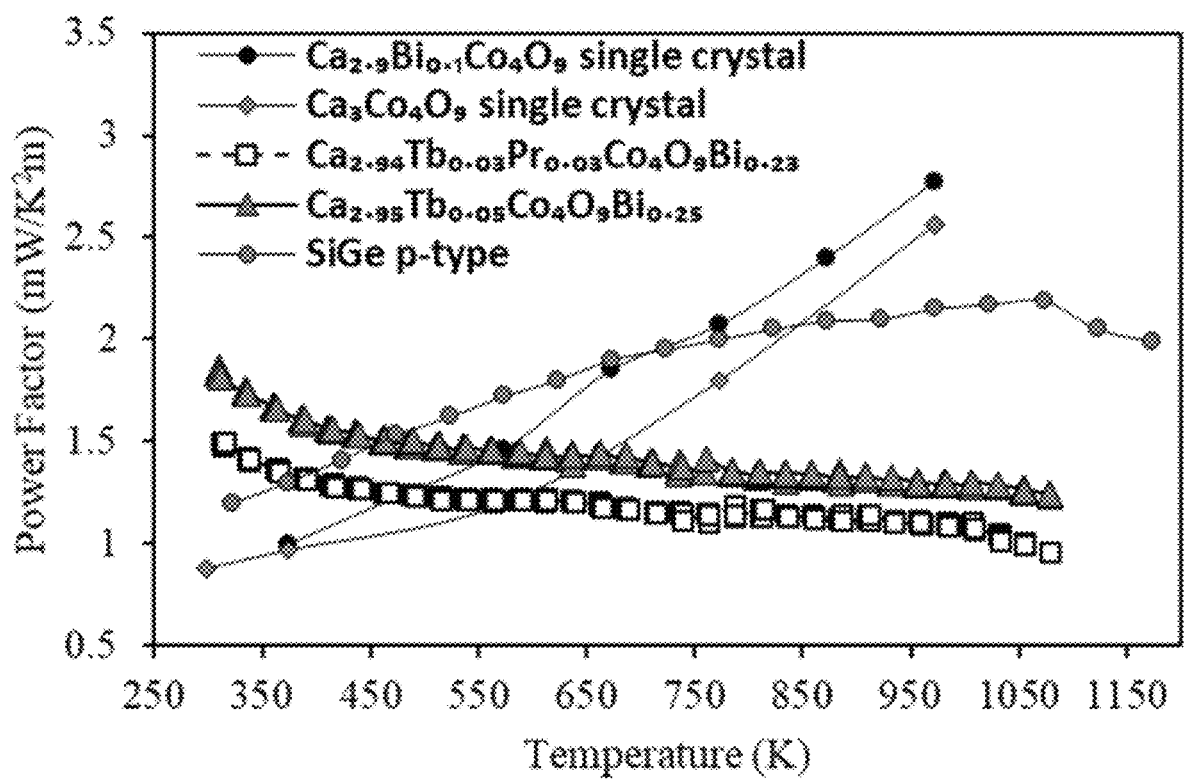
Figure 7D:
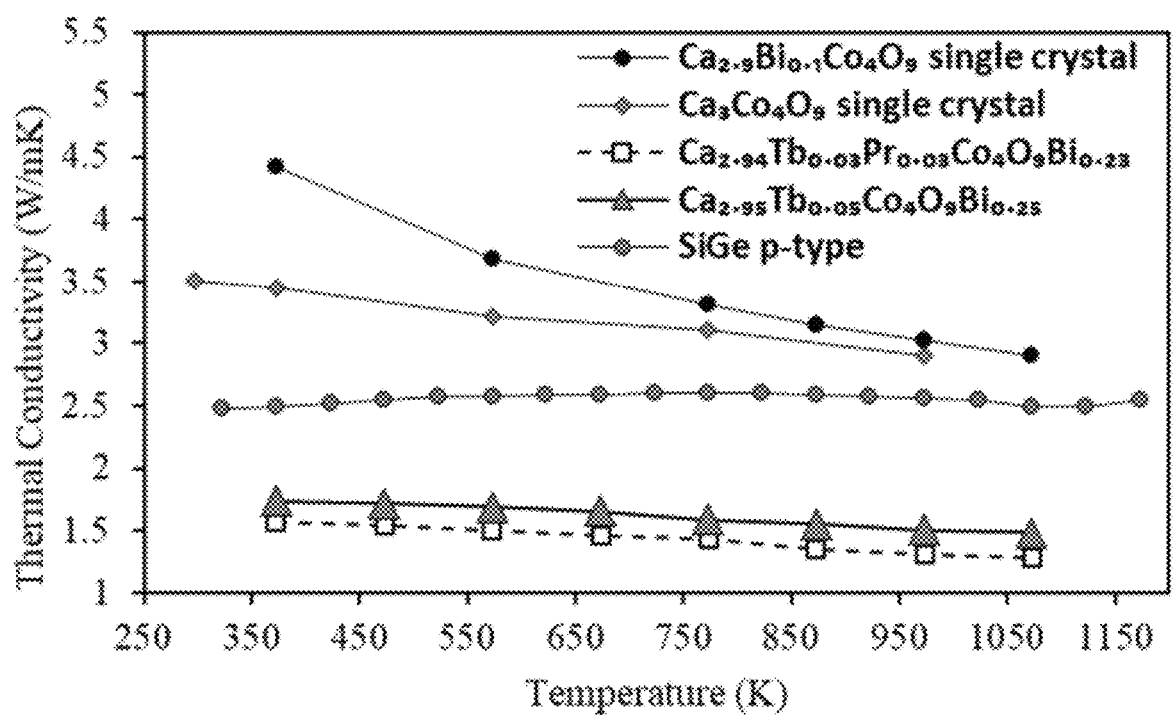
Figure 7E:
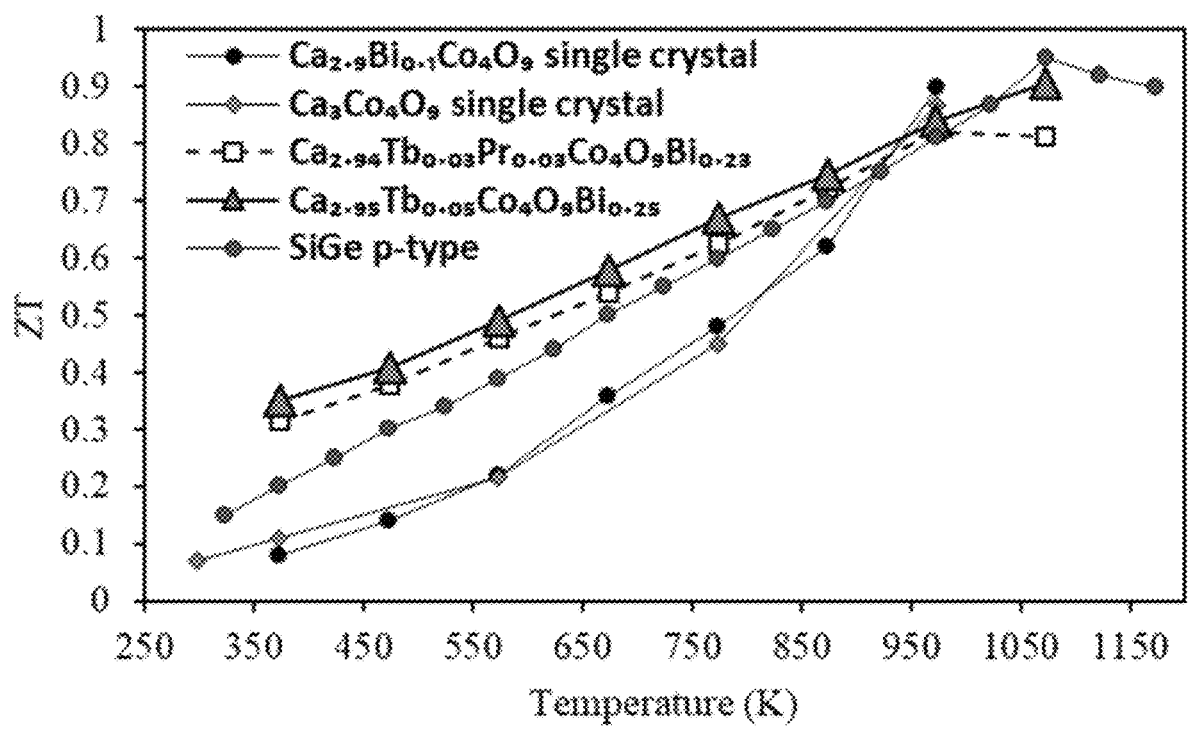
Figure 8A:
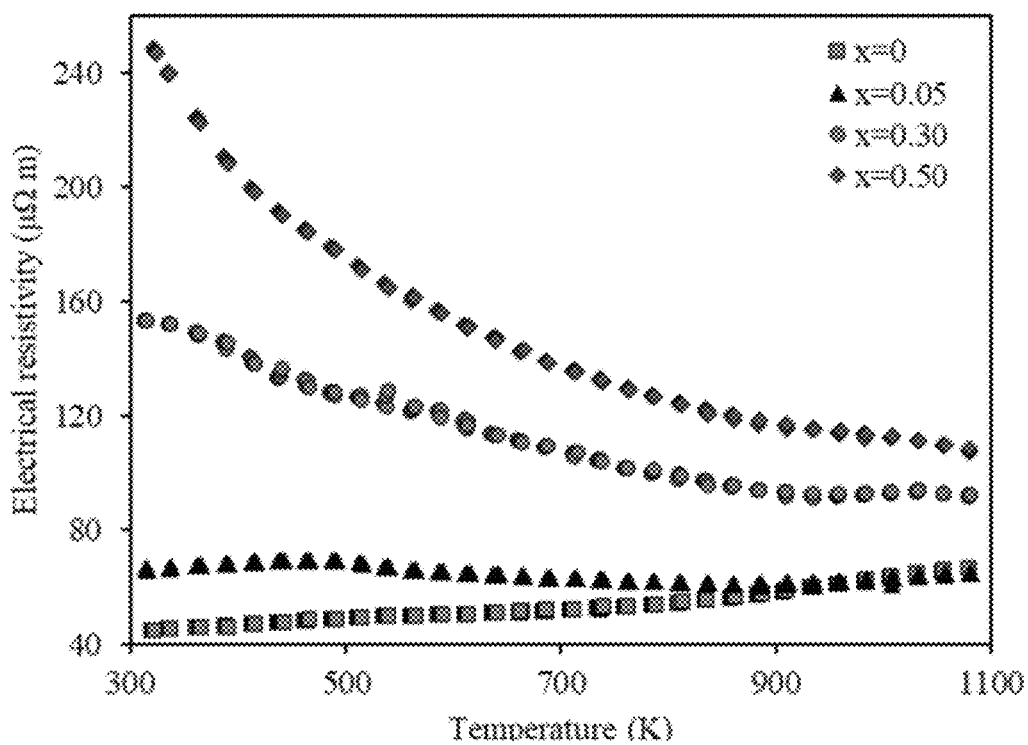
FIGS. 8A-8F shows representative data illustrating temperature dependence of $Ca_{3-x}Tb_xCo_4O_9$ samples.
Figure 8B:
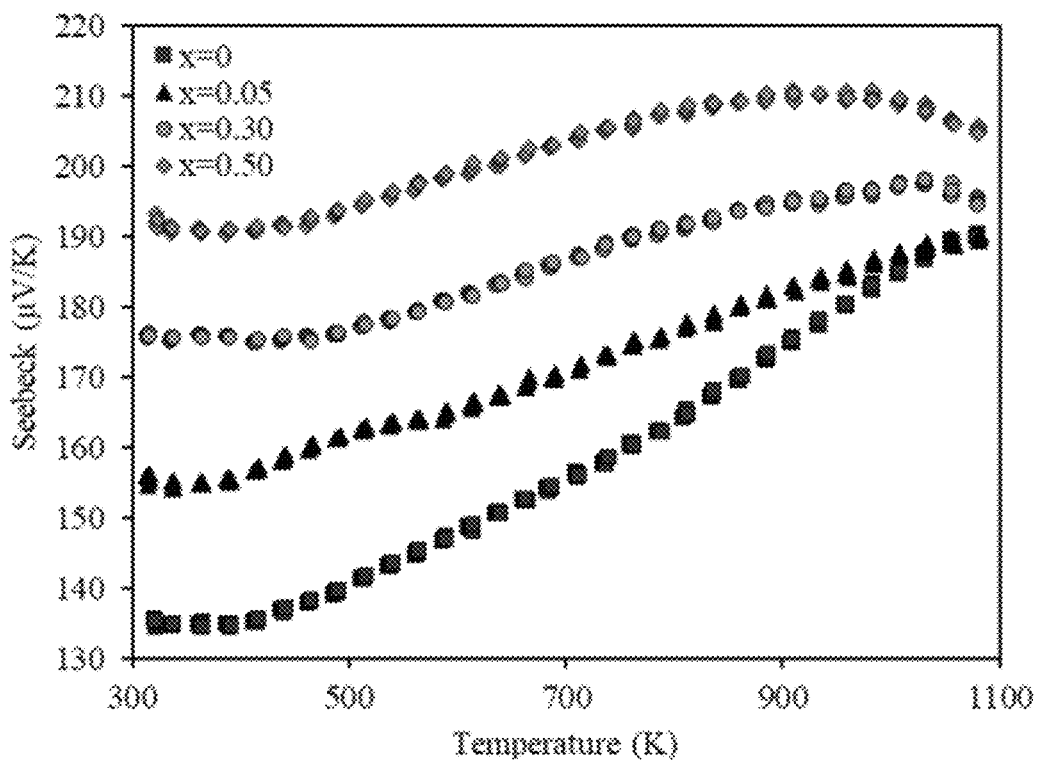
Figure 8C:
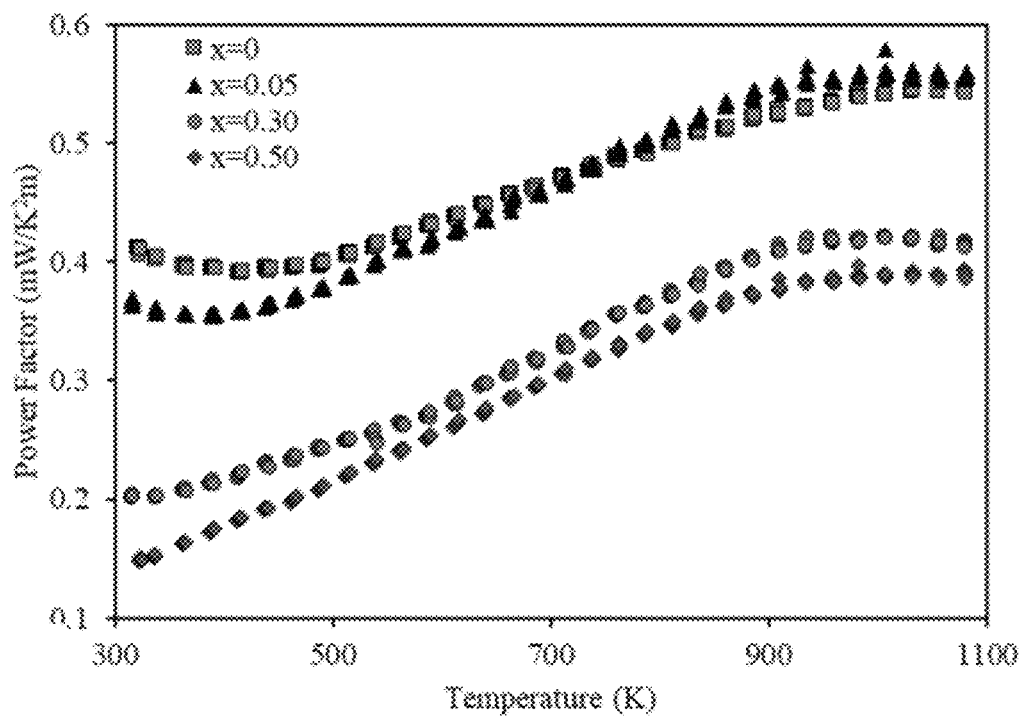
Figure 8D:
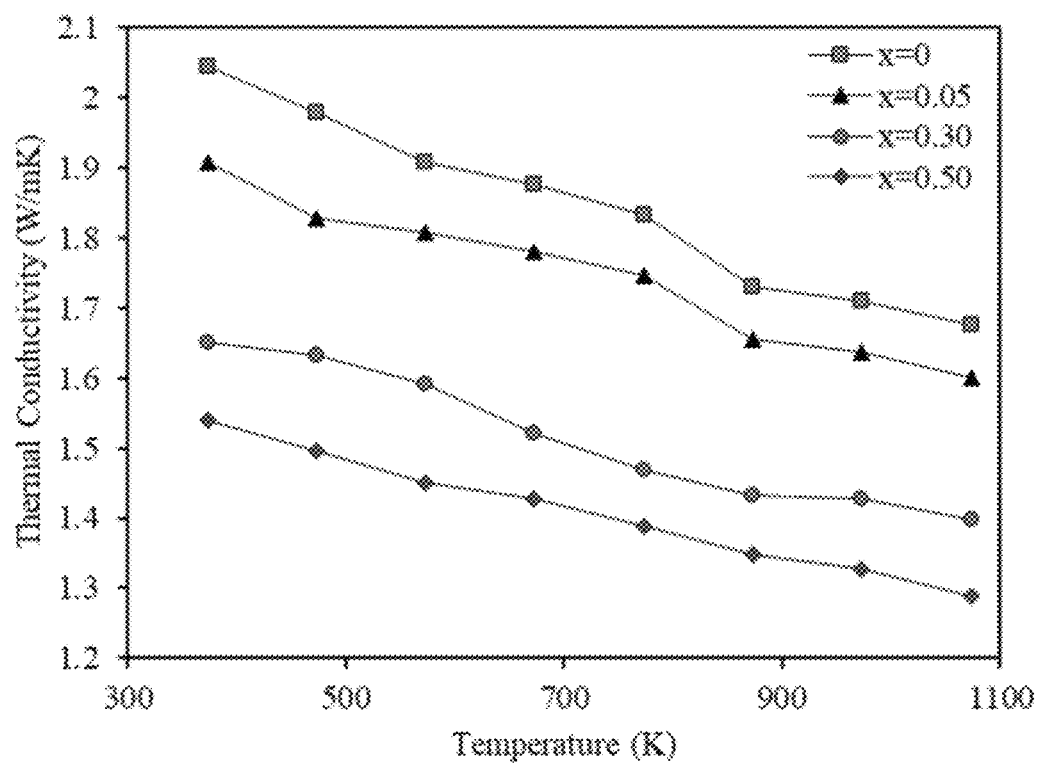
Figure 8E:
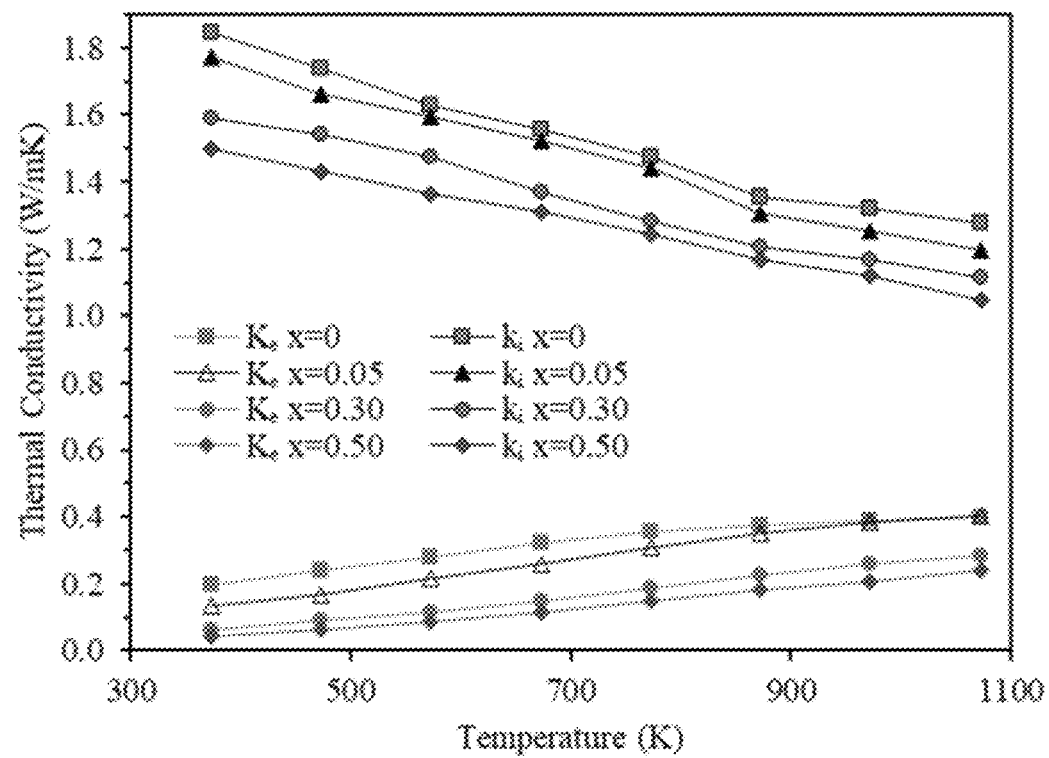
Figure 8F:
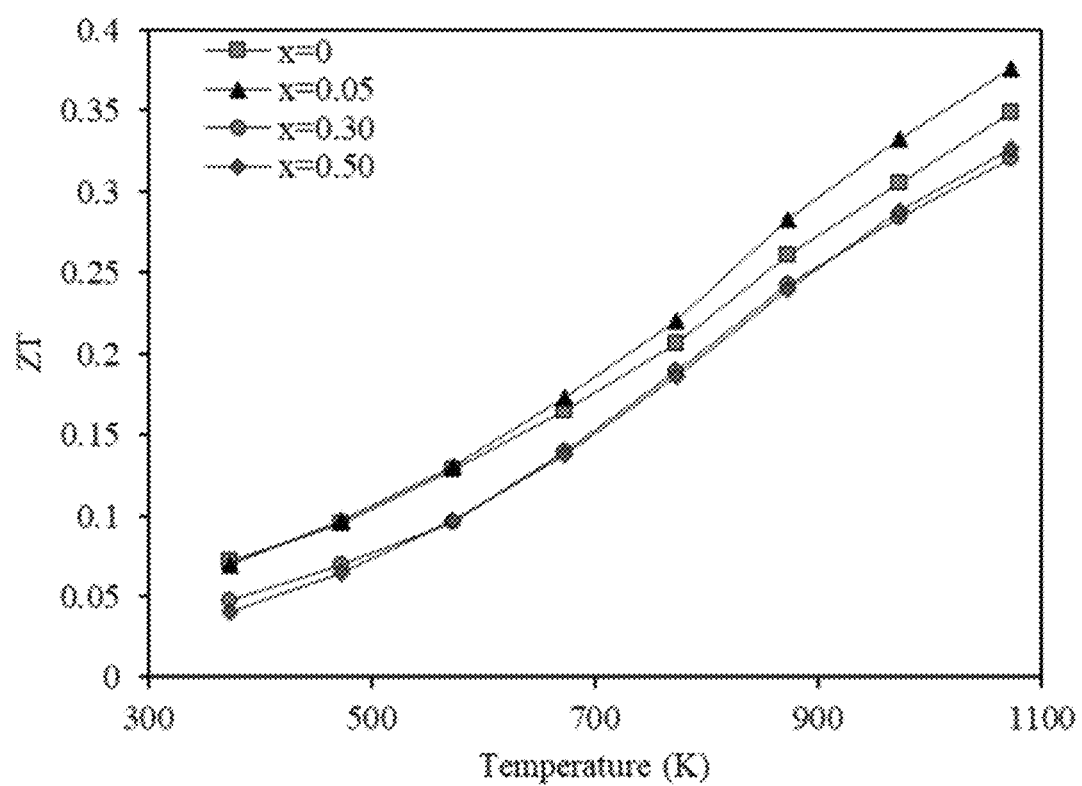

5. Atomic Structure Origin of the Increased Power Factor and ZT of Doped Thermoelectric Ceramic Oxide Compositions Non-stoichiometric doping with dual elements of Tb and Bi does not result in the crystal structure changes or the secondary phase formation. Nevertheless, the dual dopants have resulted in the systematic microstructure evolution, as schematized in FIGS. 6A-6C, including the increased grain anisotropy, improved crystal grain alignment and the segregation of dopants at the grain boundaries. Consistent with our previous results incorporating three different sets of the dopants $K^+$, $Ba^{2+}$, and $Bi^{3+}$ (Refs. 30, 31, 32) the present results indicate that the grain boundaries of the $Ca_3Co_4O_9$ ceramics apparently attract oversized dopants and deplete the undersized dopants. The segregation of the oversized dopants decreases the grain boundary energy and facilitates fast diffusion along the grain boundaries and crystal texture development. With appropriate doping level, such dopants grain boundary segregation and crystal alignment have profoundly decreased the electrical resistivity and simultaneously increased the Seebeck coefficient.

The cause of the increased Seebeck coefficient could be multifold. In the present study, Bi was intentionally added to the Tb doped sample with designed non-stoichiometry to possibly compensate the Bi segregation at the grain boundaries, to keep the intragranular stoichiometry. However, the amount of Bi could be continuously added to the $Ca_3Co_4O_9$ grains without forming the secondary phase is surprising. In addition to the replacement of Ca, Bi also substitute Co, like those from the $Bi_xCo_{2-x}MnO_4$ oxide. (Ref. 33). Each of the individual layer in the $Ca_3Co_4O_9$ unit cell is contributing effectively in the electrical and thermal transport. For $Ca_{2.95}Tb_{0.05}Co_4O_9Bi_{0.25}$, in the CaO layer, $Bi^{3+}$ incorporation will decrease the carrier concentration. Meanwhile, In the $CoO_2$ layer, the $Bi^{3+}$ with larger ionic radius will inevitably increase the abundance of $Co^{4+}$ ions with smaller ionic radius than that of $Co^{3+}$ ions. The Seebeck coefficient thus increased accordingly. Most importantly, the dopants segregation at grain boundaries could render the formation of the space-charge layer adjacent to the grain boundary plane and lead to the redistribution of defects and solutes in the grain interiors (Refs. 34, 35) and overwhelmingly affect Seebeck coefficient. During the transport procedure, the carriers with energy higher than the Fermi energy contribute positively to the Seebeck coefficient, while the carriers with energy lower than the Fermi energy contribute negatively. The segregation of Bi at the GBs acts as an obstructive layer to block the carrier transport through adjacent crystals also works to filter carrier with low energy. (Ref. 36). In other words, carrier propagation across the grain boundary only take place to carriers with high energy, thus, contributed to reducing the carrier concentration and increasing the Seebeck coefficient. Such decreased carrier concentration will apparently decrease the electrical conductivity a that satisfies $\sigma=ne\mu$, where $\mu$ is the carrier mobility, e is the elementary positive charge constant, and n is the number density of electrons. Nevertheless, the continuous increased electrical conductivity with Bi revealed the dramatically increased carrier mobility in the $Ca_{2.95}Tb_{0.05}Co_4O_9Bi_{0.25}$ presumably due to the improved alignment of anisotropic crystal grains.

6. Doped Thermoelectric Ceramic Oxide Compositions Outperform Single Crystals.

Figure 11:
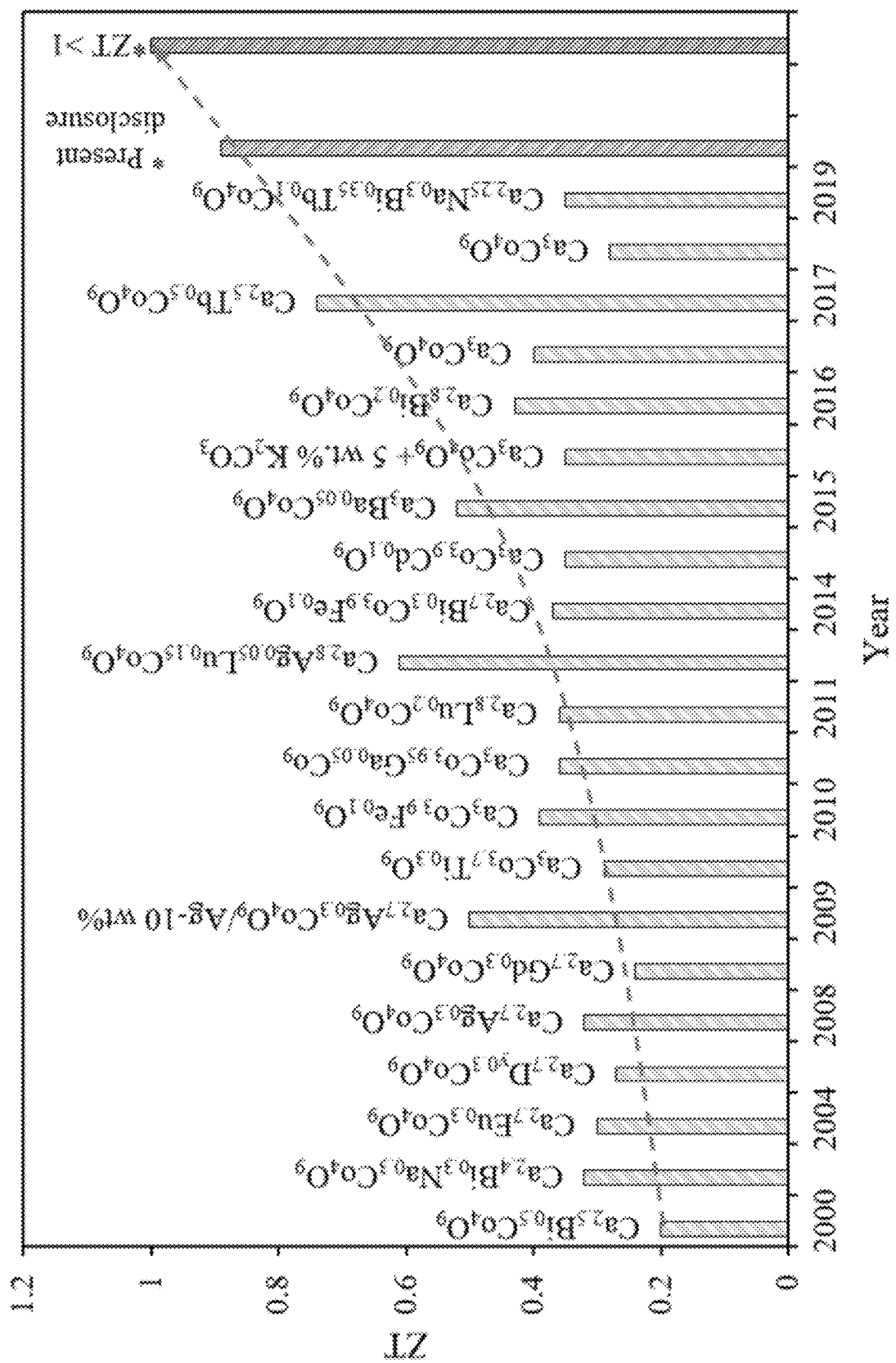
FIG. 11 shows a representative timeline of the improvement in the ZT of $Ca_3Co_4O_{9+\delta}$ polycrystalline materials by the addition of different doping elements. (Refs. 45, 46, 48, 49, 52, 53, 54, 56, 57, 58, 61, 62, 65, 67, 69, 71, 72, 75, 76, 80, 81). *ZT value of representative disclosed Examples is shown; it is believed that a ZT material over 1 is possible for the disclosed materials.

The peak ZT of 0.90 is the highest ZT value reported for $Ca_3Co_4O_9$ oxide ceramics, as shown in Table 3 and FIG. 11. The sample of $Ca_{2.95}Tb_{0.05}Co_4O_{9-\delta}Bi_{0.25}$ is also with the high plateau of ZT 0.35 at 373K and ZT of 0.90 at 1073K, as shown in FIGS. 7A-7E. Such high plateau leads to the high average ZT, (Ref. 37) which is very much desired for high-performance TE materials. It is worthwhile to point out that, in comparison with the pristine $Ca_3Co_4O_{9-\delta}$ with peak ZT of ~0.35, the peak ZT of 0.90 in $Ca_{2.95}Tb_{0.05}Co_4O_{9-\delta}Bi_{0.25}$ is enhanced by ~260%, that is mainly achieved by increasing the electrical power factor, while the thermal conductivity is decreased by only ~10%. This is very different from conventional approaches used for increasing the ZT of conventional semiconductors. To date, the observed dramatic ZT enhancements in various bulk nanostructured materials have come from the very large reductions in lattice thermal conductivity rather than from improvement in power factors. (Ref. 38).

TABLE 3

Progression of the performance of $Ca_3Co_4O_9$ thermoelectric material.

| Ref | Year | Stoichiometry | S (μV/K) | ρ (μΩm) | κ (W/Km) |
|---|---|---|---|---|---|
| (13) | 2000 | $Ca_{2.5}Bi_{0.5}Co_4O_9$ | 160 | 95 | 1.37 |
| (61) | 2002 | $Ca_{2.4}Bi_{0.3}Na_{0.3}Co_4O_9$ | 204 | 75 | 1.75 |
| (14) | 2003 | $Ca_3Co_4O_9$ single crystal | 245 | 23 | 2.90 |
| (53) | 2004 | $Ca_{2.7}Eu_{0.3}Co_4O_9$ | 194 | 78 | 1.65 |
| (62) | 2004 | $Ca_{2.7}Dy_{0.3}Co_4O_9$ | 190 | 85 | 1.60 |
| (63) | 2005 | $Ca_3Co_4O_9/Ag$-10 wt % | 175 | 30 | |
| (24) | 2006 | $Ca_{2.9}Bi_{0.1}Co_4O_9$ single crystal | 200 | 14.5 | 3.00 |
| (64) | 2008 | $Ca_{2.7}Ag_{0.3}Co_4O_9$ | 229 | 75 | 2.10 |
| (54) | 2008 | $Ca_{2.7}Gd_{0.3}Co_4O_9$ | 182 | 78 | 1.40 |
| (55) | 2009 | $Ca_{2.7}Ag_{0.3}Co_4O_9/$Ag-10 wt % | 218 | 37 | 2.50 |
| (65) | 2009 | $Ca_{2.7}Y_{0.3}Co_4O_9$ | 172 | 85 | 1.55 |
| (56) | 2010 | $Ca_3Co_{3.7}Ti_{0.3}O_9$ | 285 | 165 | 1.80 |
| (66) | 2010 | $Ca_3Co_{3.9}Fe_{0.1}O_9$ | 258 | 97 | 1.78 |
| (67) | 2010 | $Ca_3Co_{3.95}Ga_{0.05}Co_9$ | 200 | 77 | 1.50 |
| (68) | 2011 | $Ca_{2.97}Ag_{0.03}Co_4O_9$ | 200 | 89 | 2.10 |

TABLE 3-continued

Progression of the performance of $Ca_3Co_4O_9$ thermoelectric material.

| Ref | Year | Stoichiometry | S (μV/K) | ρ (μΩm) | κ (W/Km) |
|---|---|---|---|---|---|
| (69) | 2011 | $Ca_{2.7}Er_{0.3}Co_4O_9$ | 192 | 100 | 1.42 |
| (70) | 2011 | $Ca_{2.8}Lu_{0.2}Co_4O_9$ | 194 | 95 | 1.20 |
| (57) | 2011 | $Ca_{2.8}Ag_{0.05}Lu_{0.15}Co_4O_9$ | 235 | 72 | 1.40 |
| (71) | 2011 | $Ca_{2.8}Pr_{0.2}Co_4O_9$ | 201 | 107 | 1.55 |
| (72) | 2014 | $Ca_3Co_{3.85}Cr_{0.15}O_9$ | 195 | 110 | 2.00 |
| (58) | 2014 | $Ca_{2.7}Bi_{0.3}Co_{3.9}Fe_{0.1}O_9$ | 182 | 73 | 1.19 |
| (73) | 2014 | $Ca_{2.9}La_{0.1}Co_{3.9}Fe_{0.1}O_9$ | 226 | 125 | 1.29 |
| (74) | 2014 | $Ca_3Co_{3.9}Cd_{0.1}O_9$ | 209 | 82 | 1.50 |
| (75) | 2015 | $Ca_3Co_4O_9$ | 132 | 184 | 0.41 |
| (33) | 2015 | $Ca_3Ba_{0.05}Co_4O_9$ | 185 | 41 | 1.70 |
| (76) | 2016 | $Ca_{2.8}Ba_{0.1}Pr_{0.1}Co_4O_9$ | 207 | 92 | 1.65 |
| (77) | 2016 | $Ca_3Co_4O_9$ + 5 wt. % $K_2CO_3$ | 230 | 125 | 1.32 |
| (25) | 2016 | $Ca_{2.8}Bi_{0.2}Co_4O_9$ | 192 | 50 | 1.90 |
| (78) | 2016 | $Ca_3Co_4O_9$ | 170 | 175 | 0.49 |
| (79) | 2017 | $Ca_{2.55}Na_{0.45}Co_4O_{8.55}F_{0.45}$ | 192 | 130 | 2.20 |
| (59) | 2017 | $Ca_3Co_4O_9$ | 210 | 171 | 0.63 |
| (80) | 2017 | $Ca_{2.9}Bi_{0.1}Ba_{0.07}Co_4O_9$ | 190 | 40 | |
| (32) | 2018 | $Ca_3Co_4O_9K_{0.1}$ | 190 | 44 | |
| (81) | 2018 | $Ca_{2.95}Na_{0.05}Co_{3.975}W_{0.025}O_9$ | 183 | 130 | 1.26 |
| (46) | 2018 | $Ca_3Co_4O_9$ | 189 | 72 | 1.95 |
| (60) | 2019 | $Ca_{2.25}Na_{0.3}Bi_{0.35}Tb_{0.1}Co_4O_9$ | 236 | 86 | 1.96 |
| (82) | 2019 | $Ca_{2.97}Sr_{0.03}Co_4O_9$ | 275 | 65 | 4.40 |
| (83) | 2019 | $Ca_{2.25}Na_{0.3}Bi_{0.35}Tb_{0.1}Co_4O_9$ | 240 | 70 | |
| * | 2019 | $Ca_{2.95}Tb_{0.05}Co_4O_9Bi_{0.25}$ | 212 | 36 | 1.52 |

| Ref | Year | Stoichiometry | $S^2/\rho$ (mW/K$^2$m) | ZT | T (K) |
|---|---|---|---|---|---|
| (13) | 2000 | $Ca_{2.5}Bi_{0.5}Co_4O_9$ | 0.27 | 0.2 | 973 |
| (61) | 2002 | $Ca_{2.4}Bi_{0.3}Na_{0.3}Co_4O_9$ | 0.55 | 0.32 | 1000 |
| (14) | 2003 | $Ca_3Co_4O_9$ single crystal | 2.61 | 0.87 | 973 |
| (53) | 2004 | $Ca_{2.7}Eu_{0.3}Co_4O_9$ | 0.48 | 0.30 | 1000 |
| (62) | 2004 | $Ca_{2.7}Dy_{0.3}Co_4O_9$ | 0.42 | 0.27 | 1000 |
| (63) | 2005 | $Ca_3Co_4O_9/Ag$-10 wt % | 1.02 | | 1073 |
| (24) | 2006 | $Ca_{2.9}Bi_{0.1}Co_4O_9$ single crystal | 2.76 | 0.89 | 973 |
| (64) | 2008 | $Ca_{2.7}Ag_{0.3}Co_4O_9$ | 0.70 | 0.32 | 1000 |
| (54) | 2008 | $Ca_{2.7}Gd_{0.3}Co_4O_9$ | 0.42 | 0.24 | 973 |
| (55) | 2009 | $Ca_{2.7}Ag_{0.3}Co_4O_9/$Ag-10 wt % | 1.28 | 0.50 | 1000 |
| (65) | 2009 | $Ca_{2.7}Y_{0.3}Co_4O_9$ | 0.35 | 0.22 | 973 |
| (56) | 2010 | $Ca_3Co_{3.7}Ti_{0.3}O_9$ | 0.49 | 0.29 | 1000 |
| (66) | 2010 | $Ca_3Co_{3.9}Fe_{0.1}O_9$ | 0.69 | 0.39 | 1000 |
| (67) | 2010 | $Ca_2Co_{3.95}Ga_{0.05}Co_9$ | 0.52 | 0.36 | 1073 |
| (68) | 2011 | $Ca_{2.97}Ag_{0.03}Co_4O_9$ | 0.45 | 0.23 | 973 |
| (69) | 2011 | $Ca_{2.7}Er_{0.3}Co_4O_9$ | 0.37 | 0.28 | 1073 |
| (70) | 2011 | $Ca_{2.8}Lu_{0.2}Co_4O_9$ | 0.40 | 0.36 | 1118 |
| (57) | 2011 | $Ca_{2.8}Ag_{0.05}Lu_{0.15}Co_4O_9$ | 0.77 | 0.61 | 1118 |
| (71) | 2011 | $Ca_{2.8}Pr_{0.2}Co_4O_9$ | 0.38 | 0.24 | 973 |
| (72) | 2014 | $Ca_3Co_{3.85}Cr_{0.15}O_9$ | 0.35 | 0.19 | 1073 |
| (58) | 2014 | $Ca_{2.7}Bi_{0.3}Co_{3.9}Fe_{0.1}O_9$ | 0.45 | 0.37 | 973 |
| (73) | 2014 | $Ca_{2.9}La_{0.1}Co_{3.9}Fe_{0.1}O_9$ | 0.41 | 0.32 | 1000 |
| (74) | 2014 | $Ca_3Co_{3.9}Cd_{0.1}O_9$ | 0.53 | 0.35 | 1000 |
| (75) | 2015 | $Ca_3Co_4O_9$ | 0.12 | 0.29 | 1000 |
| (33) | 2015 | $Ca_3Ba_{0.05}Co_4O_9$ | 0.83 | 0.52 | 1073 |
| (76) | 2016 | $Ca_{2.8}Ba_{0.1}Pr_{0.1}Co_4O_9$ | 0.47 | 0.31 | 973 |
| (77) | 2016 | $Ca_3Co_4O_9$ + 5 wt. % $K_2CO_3$ | 0.42 | 0.35 | 1073 |
| (25) | 2016 | $Ca_{2.8}Bi_{0.2}Co_4O_9$ | 0.74 | 0.43 | 1073 |
| (78) | 2016 | $Ca_3Co_4O_9$ | 0.17 | 0.31 | 900 |
| (79) | 2017 | $Ca_{2.55}Na_{0.45}Co_4O_{8.55}F_{0.45}$ | 0.28 | 0.13 | 873 |
| (59) | 2017 | $Ca_3Co_4O_9$ | 0.26 | 0.40 | 1073 |
| (80) | 2017 | $Ca_{2.9}Bi_{0.1}Ba_{0.07}Co_4O_9$ | 0.90 | | 1073 |
| (32) | 2018 | $Ca_3Co_4O_9K_{0.1}$ | 0.82 | | 1073 |
| (81) | 2018 | $Ca_{2.95}Na_{0.05}Co_{3.975}W_{0.025}O_9$ | 0.26 | 0.21 | 1000 |
| (46) | 2018 | $Ca_3Co_4O_9$ | 0.50 | 0.28 | 1073 |
| (60) | 2019 | $Ca_{2.25}Na_{0.3}Bi_{0.35}Tb_{0.1}Co_4O_9$ | 0.65 | 0.35 | 1073 |
| (82) | 2019 | $Ca_{2.97}Sr_{0.03}Co_4O_9$ | 1.16 | 0.29 | 1073 |
| (83) | 2019 | $Ca_{2.25}Na_{0.3}Bi_{0.35}Tb_{0.1}Co_4O_9$ | 0.82 | | 1073 |
| * | 2019 | $Ca_{2.95}Tb_{0.05}Co_4O_9Bi_{0.25}$ | 1.25 | 0.89 | 1073 |

Furthermore, the $Ca_{2.95}Tb_{0.05}Co_4O_{9-\delta}Bi_y$ sample outperformed the single-crystal $Ca_3Co_4O_{9+\delta}$ (Ref. 13) and $Ca_{2.9}Bi_{0.1}Co_4O_{9-\delta}$ (Ref. 35) single crystals, as shown in FIGS. 7A-7E. The $Ca_{2.95}Tb_{0.05}Co_4O_{9-\delta}Bi_{0.25}$ polycrystalline ceramics possess the apparent lower thermal conductivity in comparison with that of the single crystals. Most noteworthy, the $Ca_{2.95}Tb_{0.05}Co_4O_{9-\delta}Bi_y$ polycrystalline also possess the higher electrical power factor than that of the single crystals, especially at the low-temperature regime. Such power factor $Ca_{2.95}Tb_{0.05}Co_4O_{9-\delta}Bi_y$ polycrystalline ceramics have directly resulted from the higher electrical Seebeck coefficient and low resistivity. As clearly shown in both the SEM and TEM images, the $Ca_{2.95}Tb_{0.05}Co_4O_{9-\delta}Bi_{0.25}$ polycrystalline ceramics possess the high abundance of grain boundaries with the misorientation angle of ~30°. The low resistivity in $Ca_{2.95}Tb_{0.05}Co_4O_{9-\delta}Bi_{0.25}$ comparable to that of the single crystals immediately reveals that, when incorporating with dopants segregation the grain boundaries with the misorientation angle of ~30°, the grain boundaries are not deteriorating the electrical conductivity. Such results are very encouraging for practical application in the production of TE using polycrystalline oxide ceramics. Traditionally, for various thermoelectric materials, the creation of the grain boundaries and interfaces through the nanostructure engineering is to suppress the thermal conductivities. In term of the electrical properties, the electrical conductivity is heavily affected by the grain boundaries, while the Seebeck coefficient is not affected by the grain boundary properties. The above points are consistent with that we have concluded for the pristine $Ca_3Co_4O_{9+\delta}$. In the pristine $Ca_3Co_4O_{9+\delta}$ without doping, the grain size and grain boundary density could be tuned by changing the sintering temperature. As we reported previously, while the thermal conductivities and electrical conductivities both increase with the increase of the grain size, the Seebeck coefficient keeps unchanged for the samples with different grain size. (Refs. 39, 40, 41). However, the impact of the grain boundary on the Seebeck coefficient changes when there are dopants segregated to the grain boundaries. For the $Ca_{2.95}Tb_{0.05}Co_4O_{9-\delta}Bi_y$ ceramics, dopants segregation remains sharply at the GB plane, without forming the amorphous or crystal secondary phase, thus eliminating the excessive scattering of the carrier and avoiding the increase in electrical resistivity. On the other hand, the dopants segregation provides a barrier and filter the low energy carrier thus further decrease the carrier concentration and increase the Seebeck coefficient. In other words, when the dopants segregation is two dimensional, it cannot be simply analog to the impurity scattering. Rather it should be regarded as the interface that could effectively de-couple the strongly correlated parameters of the Seebeck coefficient and electrical resistivity in the polycrystalline TE ceramics. The effect of grain boundaries on mechanical properties has been extensively investigated in many materials. In term of the electroceramics, the grain boundary energetics have been modified in a variety of disciplines, through chemical segregation, ranging from superconductors to photovoltaics. However, the potential of grain boundary engineering is largely unexplored in the TE materials. The understanding of the impact of grain boundaries on both the electrical and thermal transport properties of most thermoelectric materials is currently very limited. The present work thus shed light about the new direction in engineering the atomic structure of grain boundaries to dramatically improve the performance of various TE materials.

The high ZT from $Ca_{2.95}Tb_{0.05}Co_4O_{9-\delta}Bi_y$ is achieved by using only two dopants. The designed chemistry is tunable in term of dopant species and doping level. As an example, we tested the sample of $Ca_{2.94}Pr_{0.03}Tb_{0.03}Co_4O_9Bi_{0.23}$ by introducing the third element Pr and slightly lower the Bi doping level. The electrical power factor was lowered slightly, however, the thermal conductivity was also lowered due to the increased entropy. Eventually, the sample $Ca_{2.94}Pr_{0.03}Tb_{0.03}Co_4O_9Bi_{0.23}$ is with comparable ZT to that of $Ca_{2.95}Tb_{0.05}Co_4O_{9-\delta}Bi_{0.25}$. The ZT in polycrystalline ceramics could be further improved by lowering the thermal conductivity using the nano-inclusions as those developed for SiGe, $Bi_2Te_3$, and Si (Ref. 42) systems.

Lastly, it is worthwhile to mention that $Ca_{2.95}Tb_{0.05}Co_4O_{9+\delta}Bi_y$ also outperformed the best reported p-type SiGe from 373 to 973K. (Ref. 43) Most of all, $Ca_3Co_4O_{9+\delta}$ ceramics are having just 5-10% of the cost of SiGe (Ref. 44) and will be performing directly in air. The methods utilized in the present work for producing the high-performance oxide ceramics is conventional and low cost can be readily scaled up for massive production to allow the oxide to play a central role in the TE technology.

7. DISCUSSION OF RESULTS

Referring to the above Examples, it was observed that non-stoichiometric dopants addition dramatic increased the electrical conductivity and Seebeck coefficient and resulting in the polycrystalline oxide ceramics outperforming single crystals in a wide temperature range. Heavy element Bi non-stoichiometric addition and the resultant the Bi substation in both the Ca and Co site within the unit cell suggested the versatility of designing the layered oxide with nano-blocks. Dual dopants resulted in systematic microstructure evolution, including the increased grain anisotropy, improved crystal grain alignment and the segregation of dopants at the grain boundaries. The oxide $Ca_3Co_4O_{9-\delta}$ crystal texture and GB density can be both controlled by intragranular doping and especially the appropriate dopants GB segregation or depletion. While the dopants segregating at the GBs promote the crystal texture and facilitate the large carrier mobility and high electrical conductivity, the dopants GB segregation will act as carrier filter to decrease the carrier concentration and simultaneously increase the Seebeck coefficient. When incorporating with dopants segregation the grain boundaries with the misorientation angle of 30° are not deteriorating the electrical conductivity, resulting in the electrical conductivity of polycrystalline ceramics comparable to that of the single crystals. The present work shed light about the new direction for engineering the atomic structure of grain boundaries to dramatically improve the performance of various TE materials.

It will be apparent to those skilled in the art that various modifications and variations can be made in the present disclosure without departing from the scope or spirit of the disclosure. Other embodiments of the present disclosure will be apparent to those skilled in the art from consideration of the specification and practice of the present disclosure disclosed herein.. It is intended that the specification and examples be considered as exemplary only, with a true scope and spirit of the present disclosure being indicated by the following claims.

What is claimed is:
1. A doped thermoelectric ceramic oxide having the following formula:

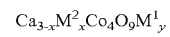
$Ca_{3-x}M^2_xCo_4O_9M^1_y$, wherein x is a number having a value from greater than about 0.00 to about 3;
wherein y is a number having a value from greater than or equal to about 0.01 to about 0.50;

wherein M¹ is a first metal dopant comprises a metal selected from group 1 metals, group metals, transition metals, post-transition metals, group 14 metals, group 15 metals, group 16 metals, and rare earth elements; and wherein M² is a second metal dopant comprising at least one rare earth element.

2. The doped thermoelectric ceramic oxide of claim 1, wherein the first metal dopant comprises a metal selected from K, Bi, Ce, Nb, Yb, Lu, and Ba.

3. The doped thermoelectric ceramic oxide of claim 2, wherein the first metal dopant comprises a metal selected from Bi and K.

4. The doped thermoelectric ceramic oxide of claim 3, wherein the first metal dopant comprises Bi.

5. The doped thermoelectric ceramic oxide of claim 3, wherein the first metal dopant comprises K.

6. The doped thermoelectric ceramic oxide of claim 1, wherein the second metal dopant comprises a metal selected from La, Ce, Tb, Pr, Nd, Pm, Sm, Eu, Gd, Dy, Ho, Er, Tm Yb, Lu, and combinations thereof.

7. The doped thermoelectric ceramic oxide of claim 6, wherein the second metal dopant comprises a metal selected from Tb, Pr, and combinations thereof.

8. The doped thermoelectric ceramic oxide of claim 7, wherein the second metal dopant comprises Tb.

9. The doped thermoelectric ceramic oxide of claim 7, wherein the second metal dopant comprises Pr.

10. The doped thermoelectric ceramic oxide of claim 1, The doped thermoelectric ceramic oxide of claim 1, wherein the first metal dopant comprises a metal selected from Bi, Ba, and K; and wherein the second metal dopant comprises a metal selected from Tb, Pr, and combinations thereof.

11. The doped thermoelectric ceramic oxide of claim 1, further comprising a plurality of grains comprising intragranular structures, wherein the first metal dopant dopant, the first metal dopant dopant, or both are present in the intragranular structures.

12. The doped thermoelectric ceramic oxide of claim 1, further comprising a plurality of grain boundaries disposed between adjacent grains, wherein the first metal dopant is present in the grain boundaries.

13. A method of making a doped thermoelectric ceramic oxide of claim 1, the method comprising:
doping a ceramic oxide formulation with a first metal dopant, M¹, in a sol-gel process resulting in a gel;
heating the gel to form an ash;
grinding the ash into an ash-based powder;
compressing the ash-based powder into a pellet; and
sintering the pellet to form the doped thermoelectric ceramic oxide.

14. The method of claim 13, wherein the first metal dopant comprises a metal selected from K, Bi, Ce, Nb, Yb, Lu, and Ba.

15. The method of claim 13, wherein the doped thermoelectric ceramic oxide has the molecular formula $Ca_3Co_4O_{9+\delta}M^1_y$; wherein M¹ is a metal selected from K, Bi, Ce, Nb, Yb, Lu, and Ba; and wherein y is a number having a value from greater than or equal to about 0.01 to about 0.50.

16. The method of claim 13, further comprising doping the ceramic oxide formulation with a second metal dopant, M², in the sol-gel process.

17. The method of claim 16, the second metal dopant comprises a metal selected from La, Ce, Tb, Pr, Nd, Pm, Sm, Eu, Gd, Dy, Ho, Er, Tm Yb, Lu, and combinations thereof.

18. The method of claim 16, wherein the doped thermoelectric ceramic oxide has the molecular formula $Ca_{3-x}M^2_xCo_4O_9M^1_y$, where first metal dopant, M¹, is a metal selected from Bi, Ce, Nb, Yb, Lu, and Ba; wherein the first metal dopant dopant, M², is a metal selected from La, Ce, Pr, Nd, Pm, Sm, Eu, Gd, Tb, Dy, Ho, Er, Tm, Yb, or Lu, as described herein; wherein x is a number having a value of from greater than about 0.00 to about 3.0; and wherein y is a number having a value of from greater than or equal to about 0.01 to about 0.50.

19. A solid-state conversion device comprising a disclosed thermoelectric ceramic oxide composition of claim 1.

20. A solid-state conversion device comprising a disclosed thermoelectric ceramic oxide composition made by the method of claim 13.

* * * * *